(12) United States Patent
Harada et al.

(10) Patent No.: US 10,355,145 B2
(45) Date of Patent: Jul. 16, 2019

(54) PHOTOVOLTAIC DEVICE

(71) Applicant: SHARP KABUSHIKI KAISHA, Sakai, Osaka (JP)

(72) Inventors: Masatomi Harada, Sakai (JP); Kenichi Higashi, Sakai (JP); Takeshi Kamikawa, Sakai (JP); Toshihiko Sakai, Sakai (JP); Tokuaki Kuniyoshi, Sakai (JP); Kazuya Tsujino, Sakai (JP); Liumin Zou, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/574,994

(22) PCT Filed: Feb. 24, 2016

(86) PCT No.: PCT/JP2016/055366
§ 371 (c)(1),
(2) Date: Nov. 17, 2017

(87) PCT Pub. No.: WO2016/185752
PCT Pub. Date: Nov. 24, 2016

(65) Prior Publication Data
US 2018/0138323 A1    May 17, 2018

(30) Foreign Application Priority Data

May 21, 2015    (JP) .................. 2015-103633

(51) Int. Cl.
*H01L 31/02* (2006.01)
*H01L 31/075* (2012.01)
(Continued)

(52) U.S. Cl.
CPC .............. *H01L 31/02* (2013.01); *C23C 16/24* (2013.01); *H01L 31/02168* (2013.01);
(Continued)

(58) Field of Classification Search
CPC ....... H01L 31/02; H01L 31/075; H01L 31/20; C23C 16/56
See application file for complete search history.

(56) References Cited

U.S. PATENT DOCUMENTS

2006/0130891 A1    6/2006  Carlson
2010/0032014 A1    2/2010  Bettinelli et al.
(Continued)

FOREIGN PATENT DOCUMENTS

JP    2008-519438 A    6/2008
JP    2010-283406 A    12/2010

*Primary Examiner* — Fernando L Toledo
*Assistant Examiner* — Neil R Prasad
(74) *Attorney, Agent, or Firm* — ScienBiziP, P.C.

(57) ABSTRACT

A photovoltaic device (1) includes: an i-type amorphous semiconductor layer (102*i*) formed in contact with one of the surfaces of a semiconductor substrate (101); p-type amorphous semiconductor strips (102*p*) spaced apart from each other and provided on the i-type amorphous semiconductor layer (102*i*); and n-type amorphous semiconductor strips (102*n*) spaced apart from each other and provided on the i amorphous semiconductor layer (102*i*), each n-type amorphous semiconductor strip (102*n*) being adjacent to at least one of the p-type amorphous semiconductor strips (102*p*) as traced along an in-plane direction of the semiconductor substrate (101). The photovoltaic device (1) further includes electrodes (103) as a protection layer formed in contact with the i-type amorphous semiconductor layer (102) between adjacent p-type amorphous semiconductor strips (102*p*) and between adjacent n-type amorphous semiconductor strips (102*n*).

4 Claims, 39 Drawing Sheets

(51) Int. Cl.
*H01L 31/20* (2006.01)
*H01L 31/0216* (2014.01)
*H01L 31/0224* (2006.01)
*H01L 31/0747* (2012.01)
*C23C 16/24* (2006.01)
*C23C 16/56* (2006.01)

(52) U.S. Cl.
CPC .... *H01L 31/022441* (2013.01); *H01L 31/075* (2013.01); *H01L 31/0747* (2013.01); *H01L 31/20* (2013.01); *C23C 16/56* (2013.01); *Y02E 10/50* (2013.01)

(56) References Cited

U.S. PATENT DOCUMENTS

| | | | |
|---|---|---|---|
| 2010/0193027 A1 | 8/2010 | Ji et al. | |
| 2010/0200058 A1* | 8/2010 | Funakoshi | H01L 31/048 136/256 |
| 2011/0089420 A1* | 4/2011 | Prabhakar | H01L 31/1804 257/53 |
| 2012/0216860 A1* | 8/2012 | Sainoo | H01L 31/0516 136/256 |

* cited by examiner

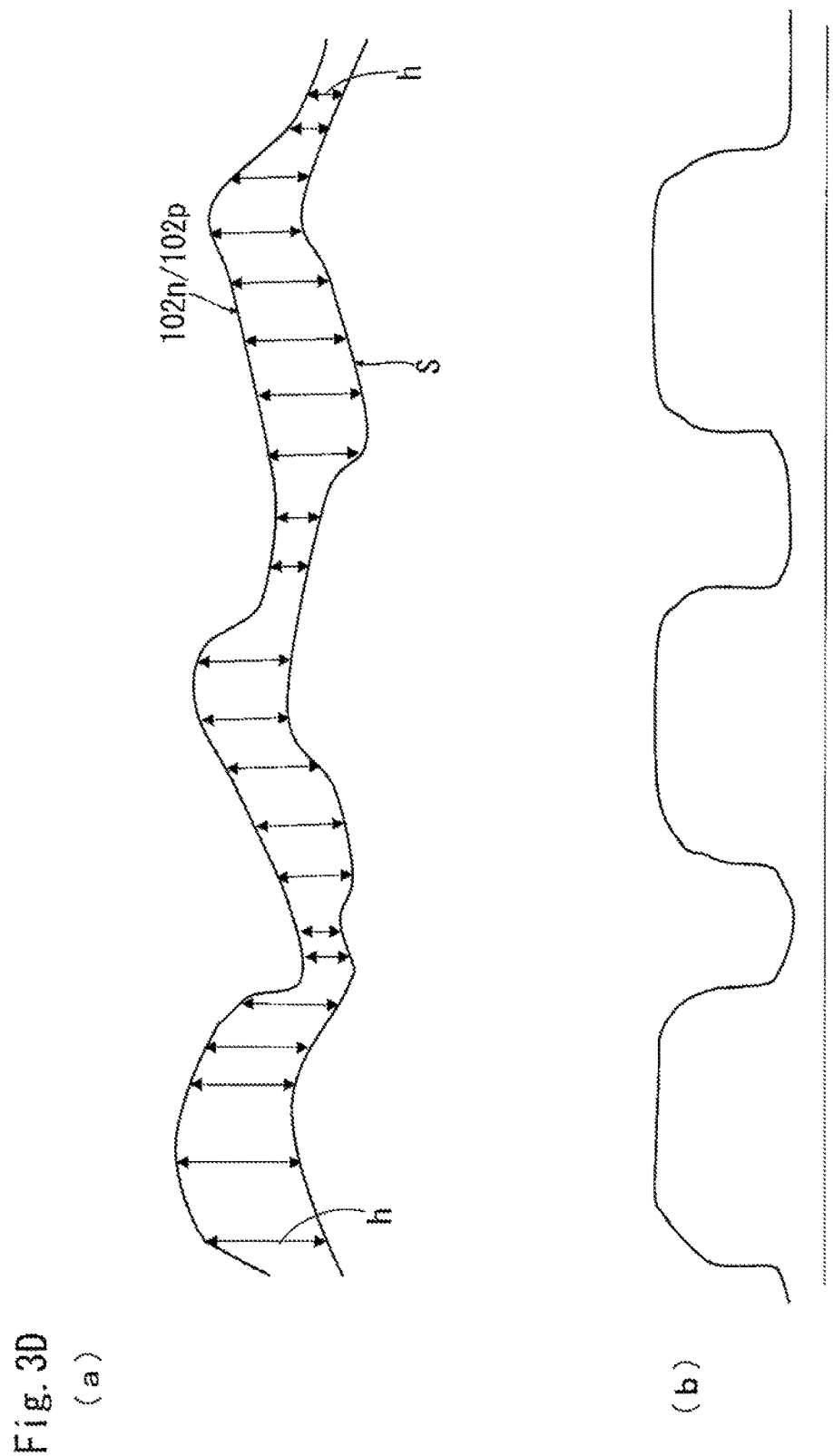

| Comparison | Normalized decay rate | Electrodes | Insulating strips |
|---|---|---|---|
|  | 100% | Ag paste | none |
| A | 38.9% | Ag(sputter) | SiO |
| B | 35.2% | Ag(sputter) | SiN |
| C | 37.8% | Ag(sputter) | SiON |
| D | 58.7% | Ag(sputter) | AlO |
| E | 65.7% | Ag(sputter) | TiO |

Fig. 11

PHOTOVOLTAIC DEVICE

TECHNICAL FIELD

The present invention relates to photovoltaic devices.

BACKGROUND ART

Japanese Unexamined Patent Application Publication, Tokukai, No. 2010-283406 discloses a backside-electrode-based solar cell including a monocrystal silicon substrate having formed on the backside thereof an amorphous silicon layer on which alternate n- and p-type amorphous semiconductor strips are formed. Electrodes are formed on the n- and p-type amorphous semiconductor strips. In this backside-electrode-based solar cell, each n-type amorphous semiconductor strip includes two insular n-type amorphous semiconductor strips separated by an intervening gap, whereas the p-type amorphous semiconductor strips are formed as continuous strips.

SUMMARY OF INVENTION

In Japanese Unexamined Patent Application Publication, Tokukai, No. 2010-283406, the amorphous silicon layer provides an exterior surface in the gaps between adjacent insular n-type amorphous semiconductor strips and also in the gaps between the n-type and p-type amorphous semiconductor strips. External water, organic, and other foreign matter will therefore likely seep into the amorphous silicon layer, which attenuates passivation characteristics and degrades the photovoltaic device.

It is an object of the present invention to provide a technology capable of restraining degradation of a photovoltaic device.

The present invention is directed to a photovoltaic device including: a semiconductor substrate; an intrinsic amorphous semiconductor layer formed in contact with one of surfaces of the semiconductor substrate; first amorphous semiconductor strips of a first conductivity type spaced apart from each other and provided on the intrinsic amorphous semiconductor layer; second amorphous semiconductor strips of a second conductivity type spaced apart from each other and provided on the intrinsic amorphous semiconductor layer, each second amorphous semiconductor strip being adjacent to at least one of the first amorphous semiconductor strips as traced along an in-plane direction of the semiconductor substrate, the second conductivity type being opposite the first conductivity type; and a protection layer formed in contact with the intrinsic amorphous semiconductor layer between those first amorphous semiconductor strips which are adjacent to each other and between those second amorphous semiconductor strips which are adjacent to each other.

The present invention restrains degradation of a photovoltaic device.

Portion (a) of FIG. 3D is a schematic view representing results of measurement of a distance (thickness) from the interface between an i-type amorphous semiconductor layer and the surface of a silicon substrate to the surface of an amorphous semiconductor layer, and (b) of FIG. 3D is a schematic view representing results of re-plotting of the film thickness measurements shown in (a) of FIG. 3D.

Figure 4:
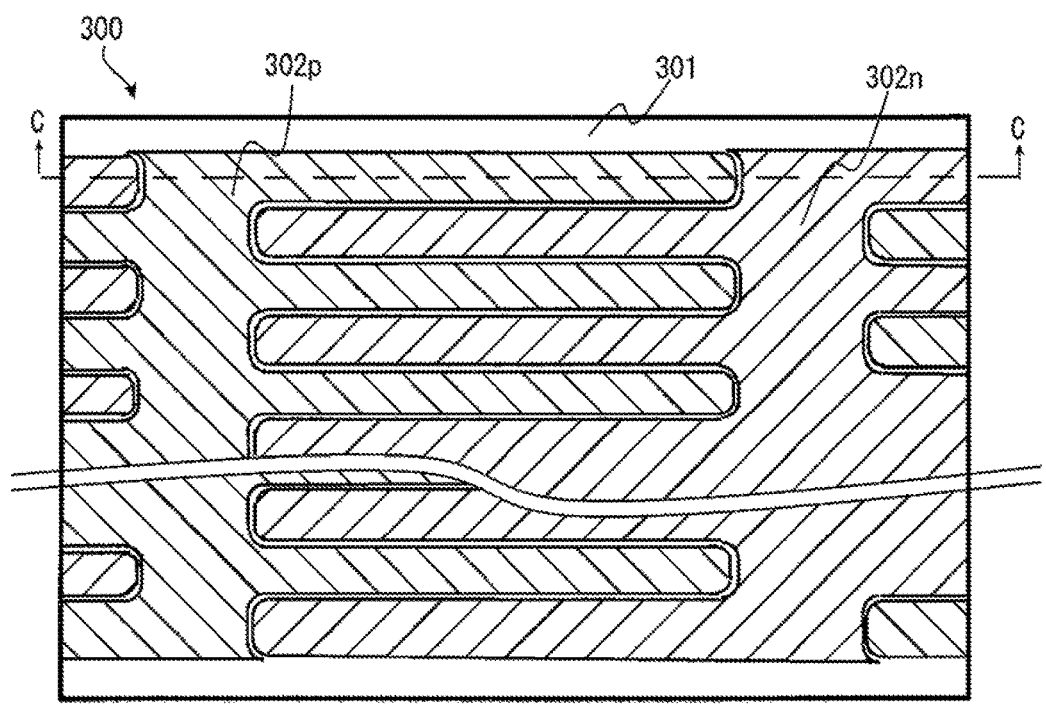

FIG. 4 is a schematic plan view of a wiring sheet in accordance with the first embodiment.

Figure 1:
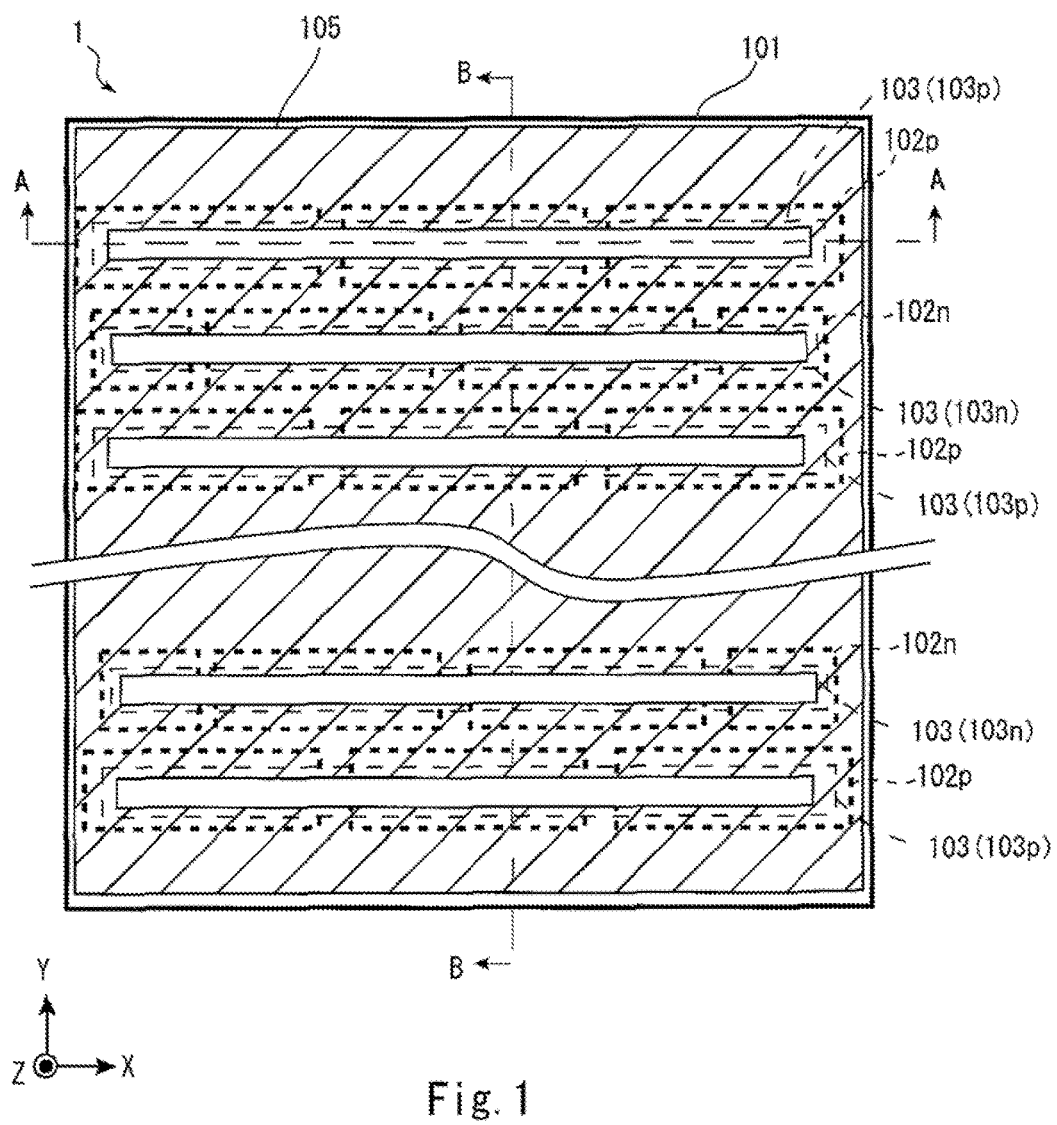
FIG. 1 is a schematic plan view of a photovoltaic device in accordance with a first embodiment.
Figure 5A:
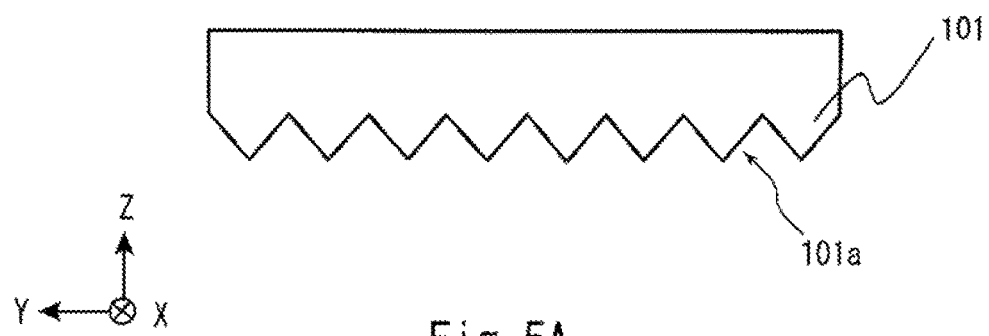

FIG. 5A is a cross-sectional view illustrating a step of manufacturing the photovoltaic device shown in FIG. 1 where a texture is provided on a silicon substrate.

Figure 5B:
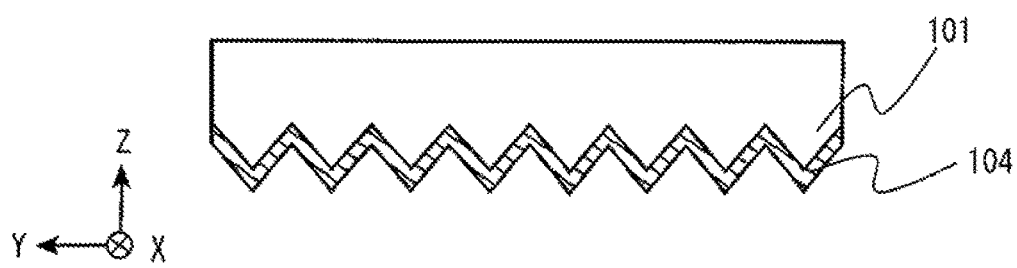

FIG. 5B is a cross-sectional view where an antireflective film is formed on a light-receiving face of the silicon substrate shown in FIG. 5A.

Figure 5C:
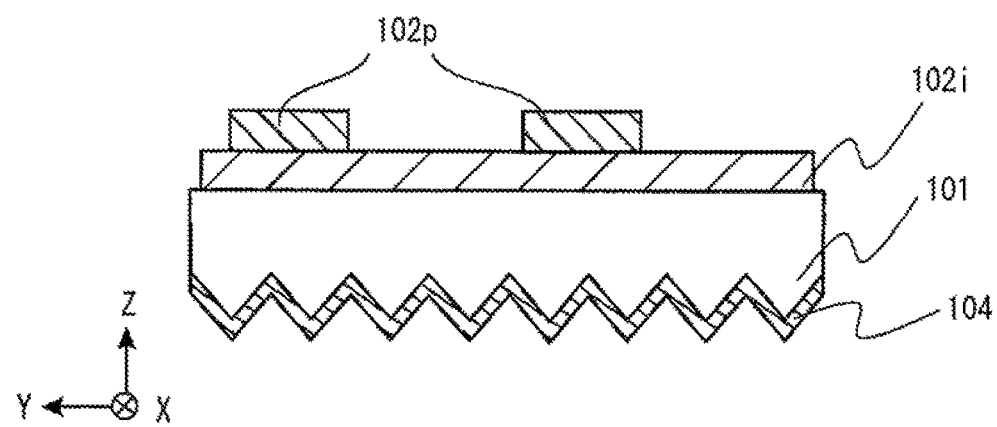

FIG. 5C is a cross-sectional view where an i-type amorphous semiconductor layer and p-type amorphous semiconductor strips are formed on the back face of the silicon substrate shown in FIG. 5B.

Figure 5D:
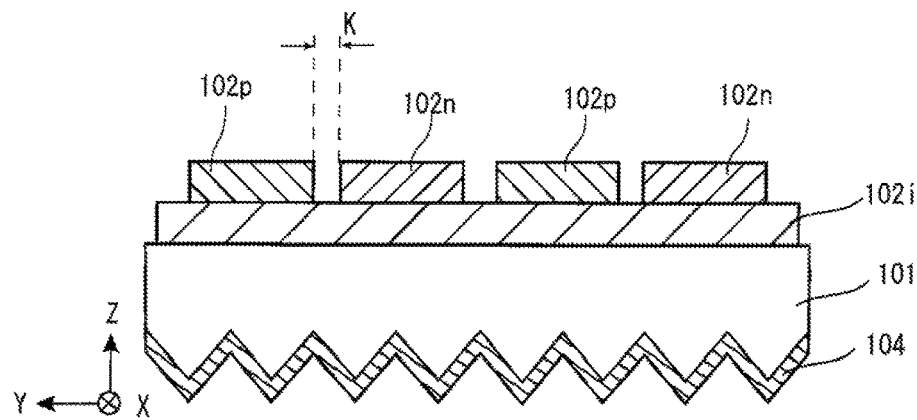

FIG. 5D is a cross-sectional view where n-type amorphous semiconductor strips are formed on the back face of the silicon substrate shown in FIG. 5C.

Figure 5E:
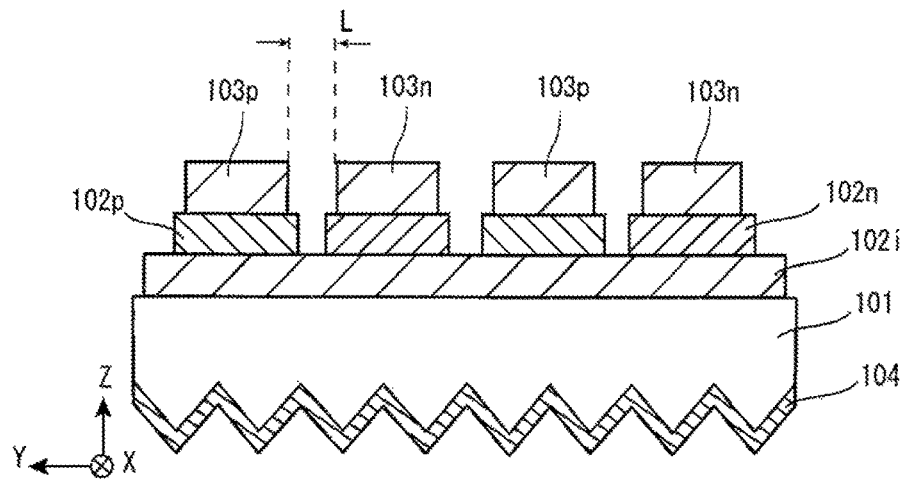

FIG. 5E is a cross-sectional view where electrodes are formed on the p-type amorphous semiconductor strips and the n-type amorphous semiconductor strips shown in FIG. 5D.

Figure 5F:
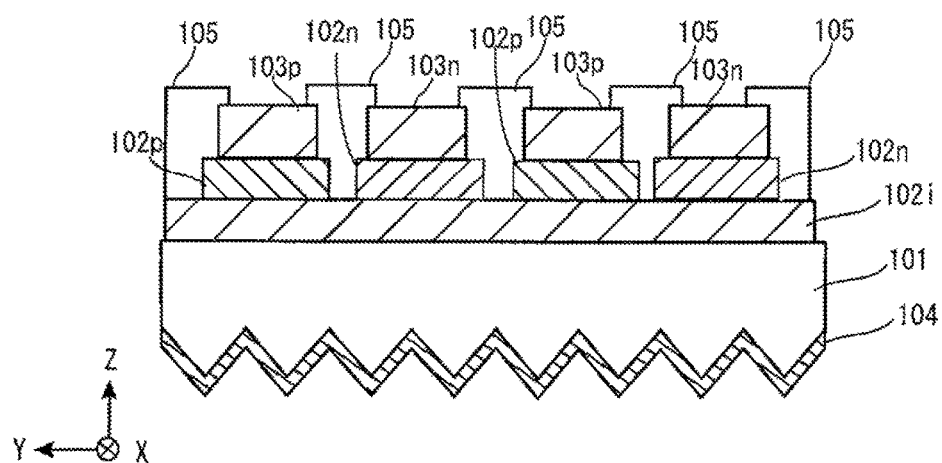

FIG. 5F is a cross-sectional view where insulating strips are formed on the back face of the silicon substrate shown in FIG. 5E.

Figure 6:
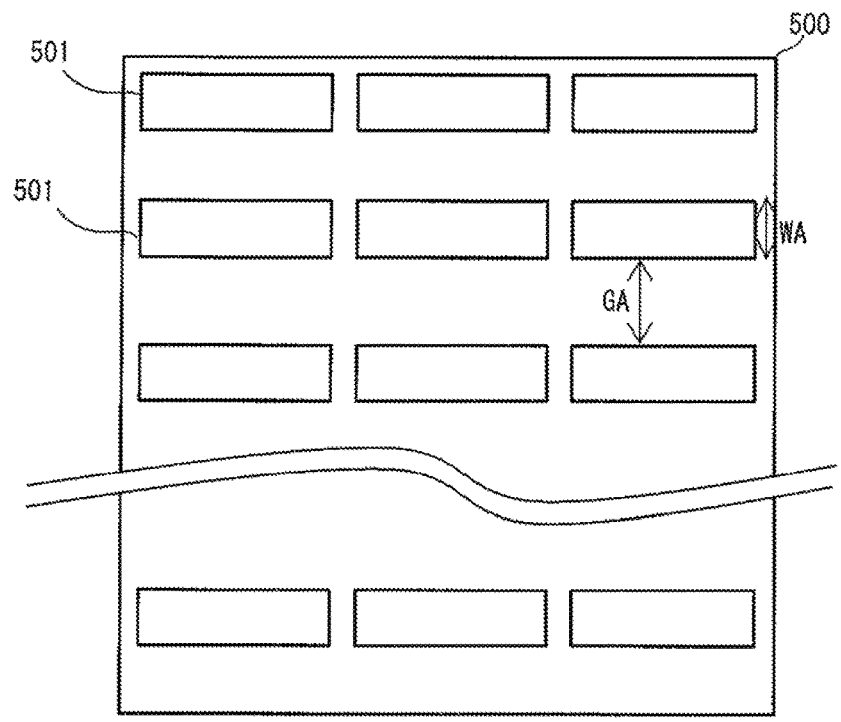

FIG. 6 is a schematic plan view of a metal mask used when the p-type amorphous semiconductor strips are formed in the step shown in FIG. 5C.

Figure 7:
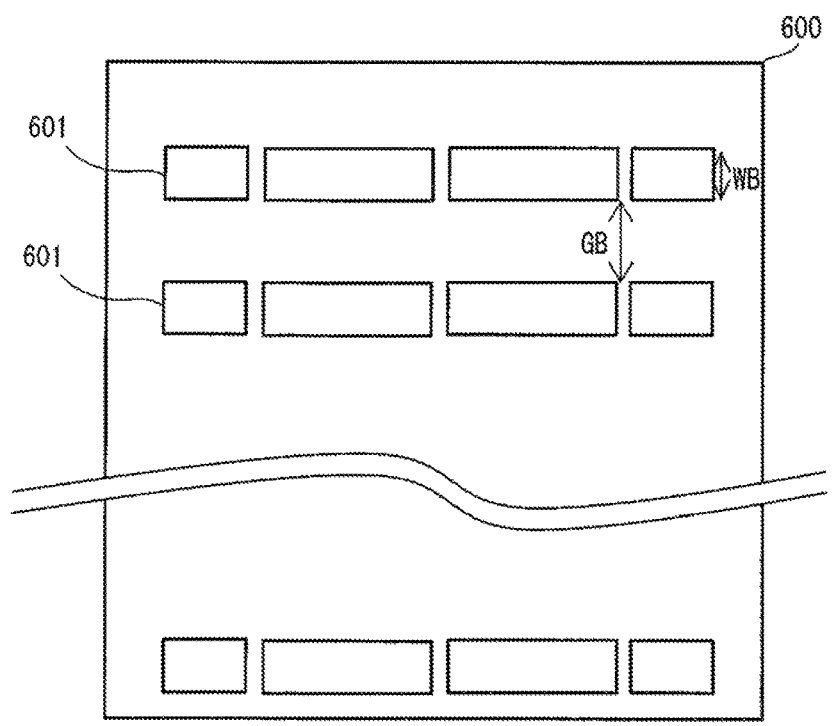

FIG. 7 is a schematic plan view of a metal mask used when the n-type amorphous semiconductor strips are formed in the step shown in FIG. 5C.

Figure 8:
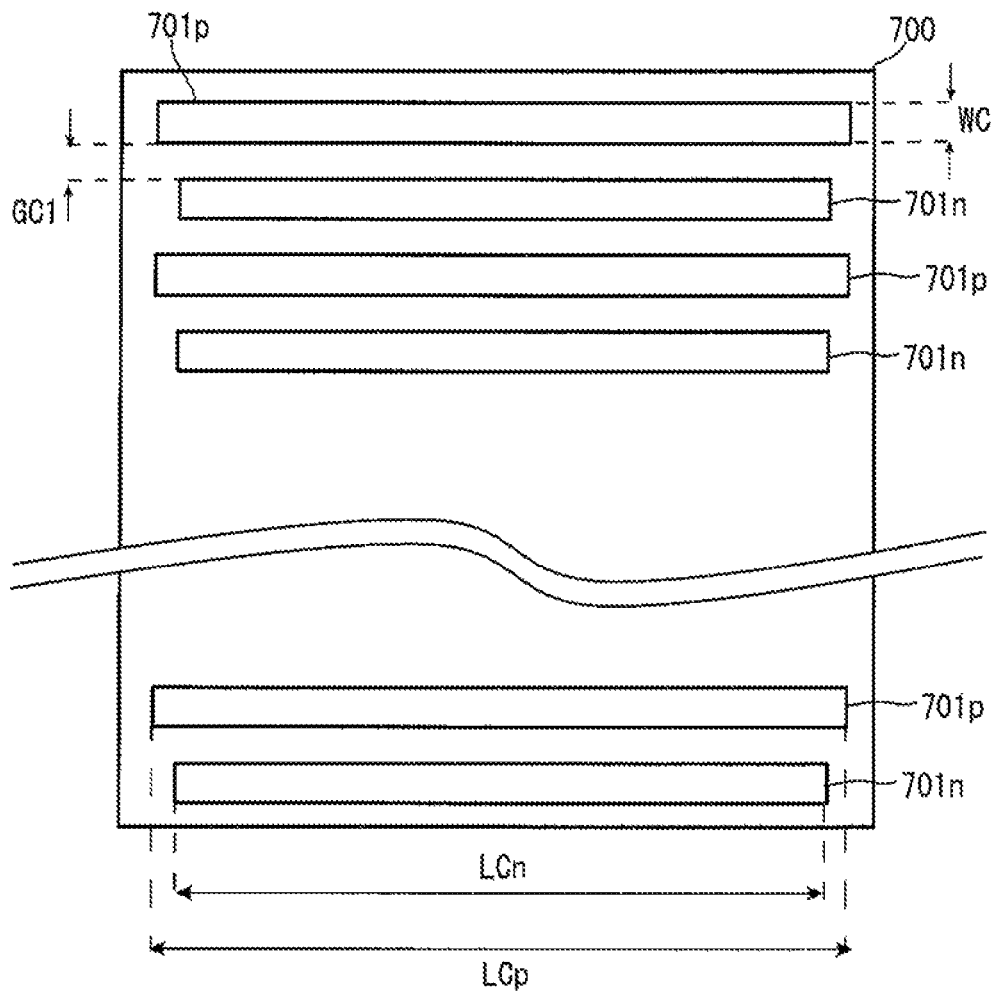

FIG. 8 is a schematic plan view of a metal mask used when the electrodes are formed in the step shown in FIG. 5D.

Figure 9A:
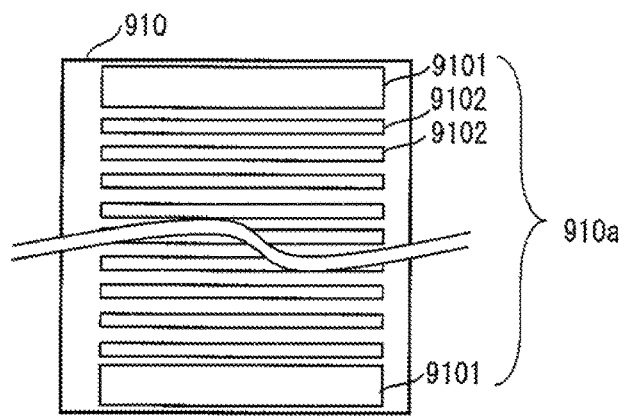

FIG. 9A is a schematic plan view of a metal mask used when the insulating strips are formed in the step shown in FIG. 5E.

Figure 9B:
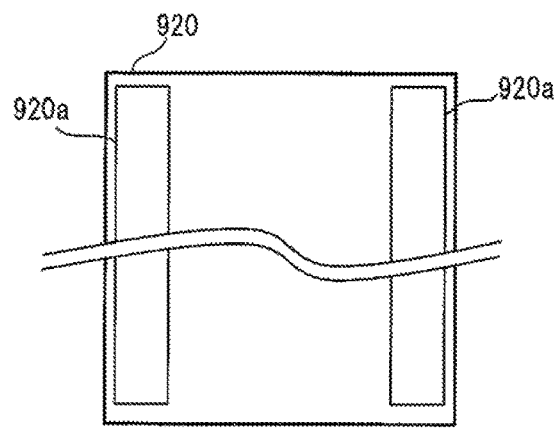

FIG. 9B is a schematic plan view of a metal mask used when the insulating strips are formed in the step shown in FIG. 5E.

Figure 10:
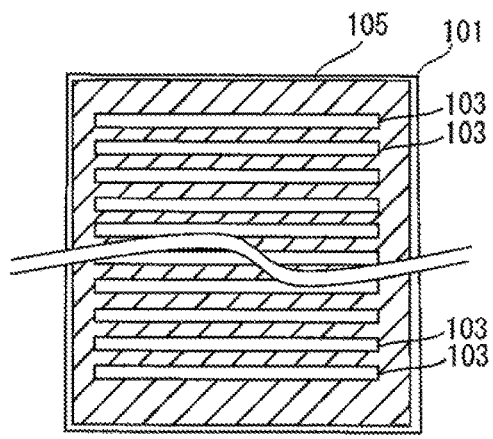

FIG. 10 is a schematic view where the insulating strips are formed on the back face of the silicon substrate using the metal masks shown in FIGS. 9A and 9B.

FIG. 11 is a diagram showing decay rates of photovoltaic devices in accordance with the first embodiment and comparative examples.

Figure 12:
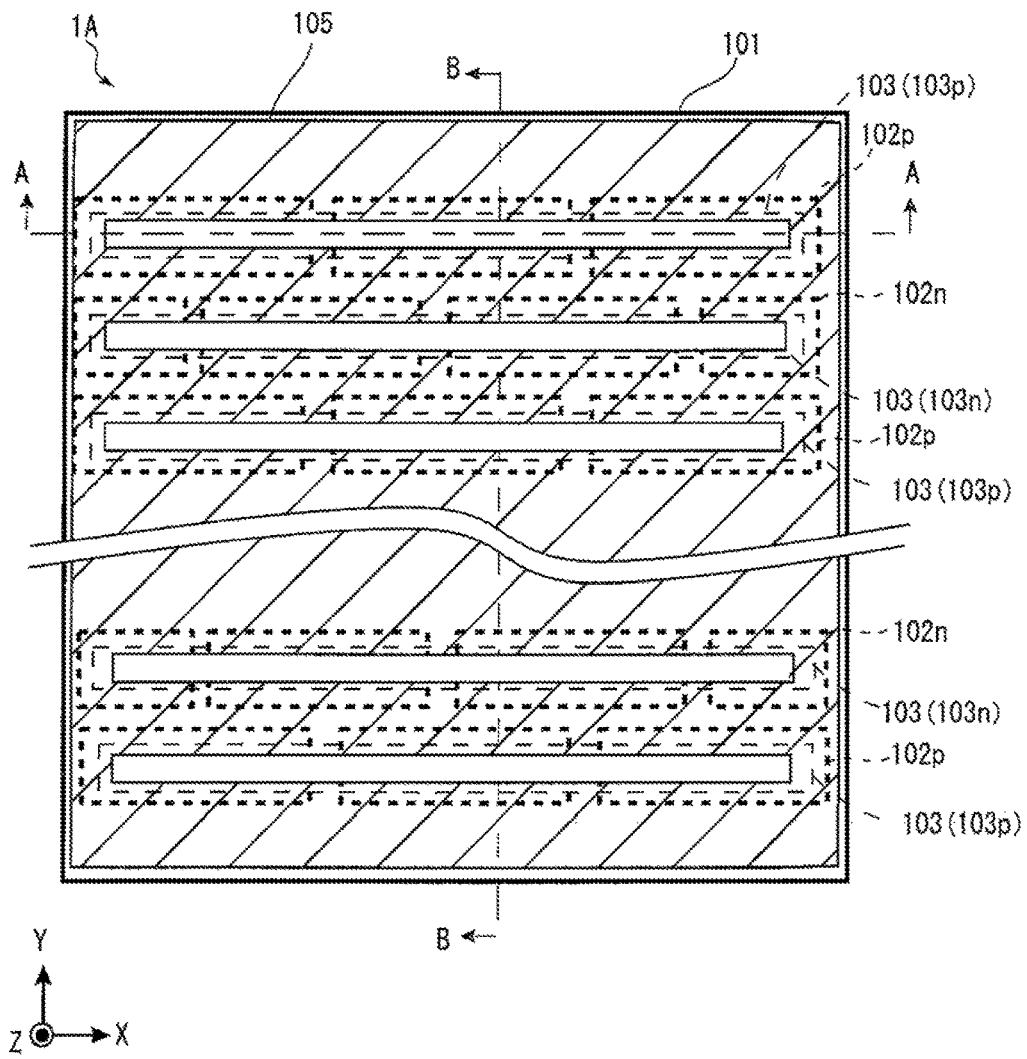

FIG. 12 is a schematic plan view of a photovoltaic device in accordance with Variation Example 1 of the first embodiment.

Figure 13:
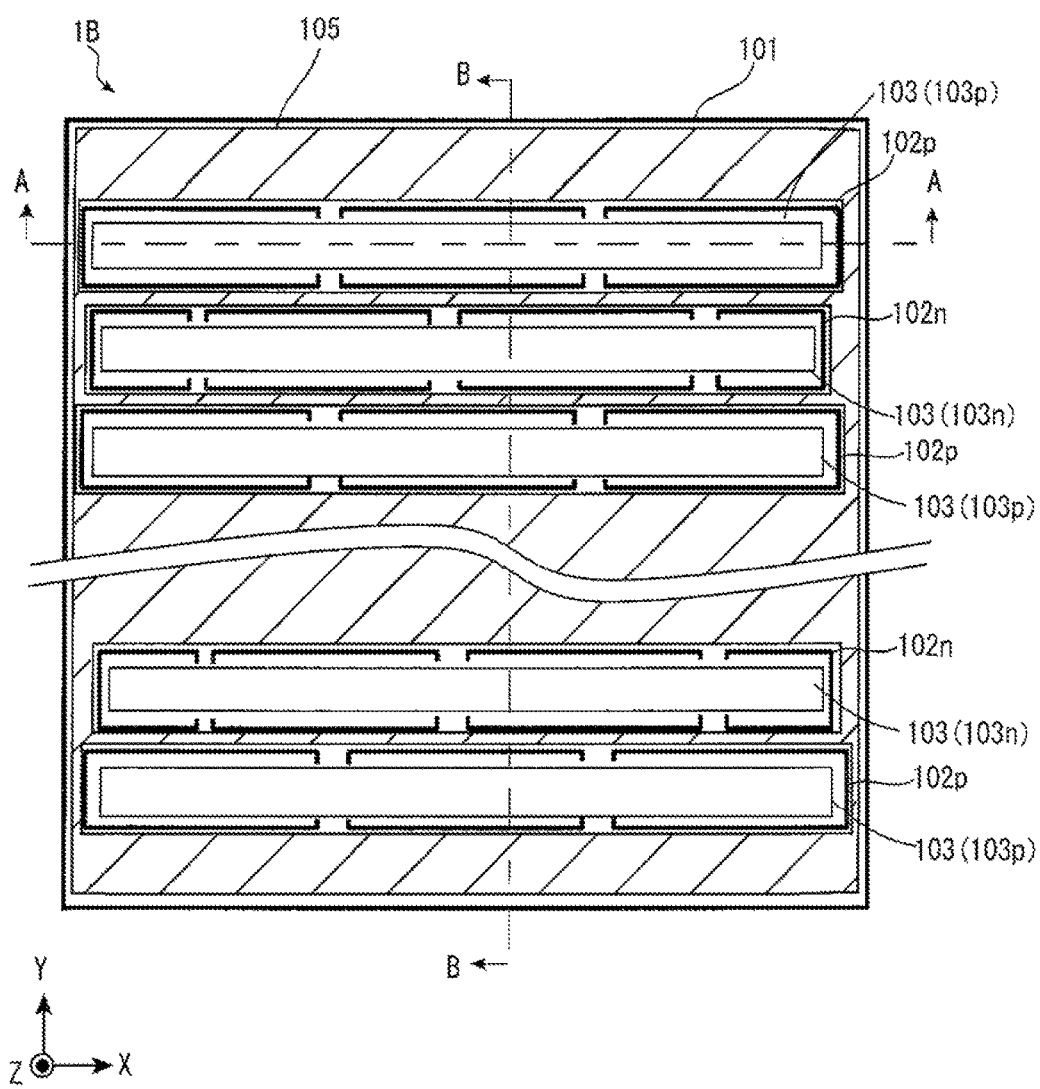

FIG. 13 is a schematic plan view of a photovoltaic device in accordance with Variation Example 2 of the first embodiment.

Figure 14A:
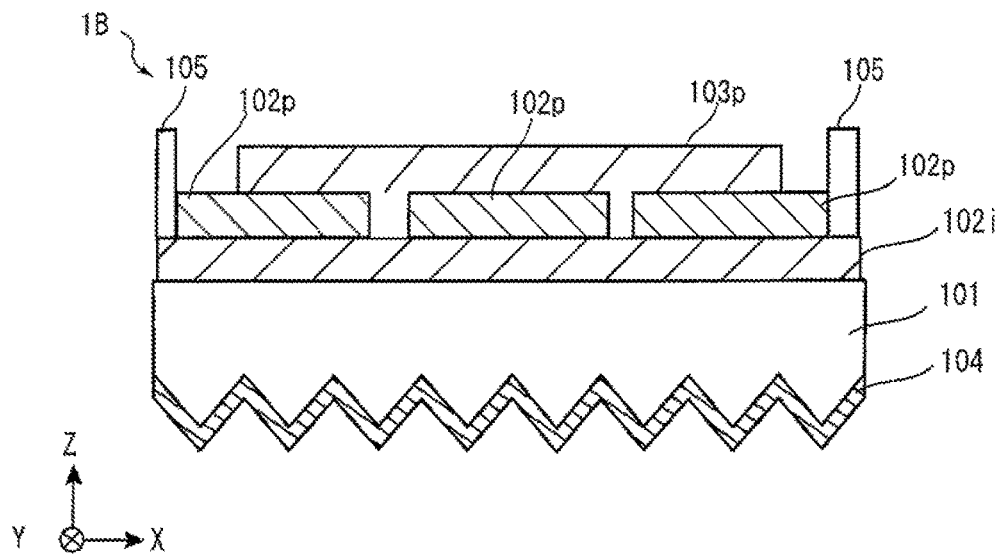

FIG. 14A is a schematic A-A cross-sectional view of the photovoltaic device shown in FIG. 13.

Figure 14B:
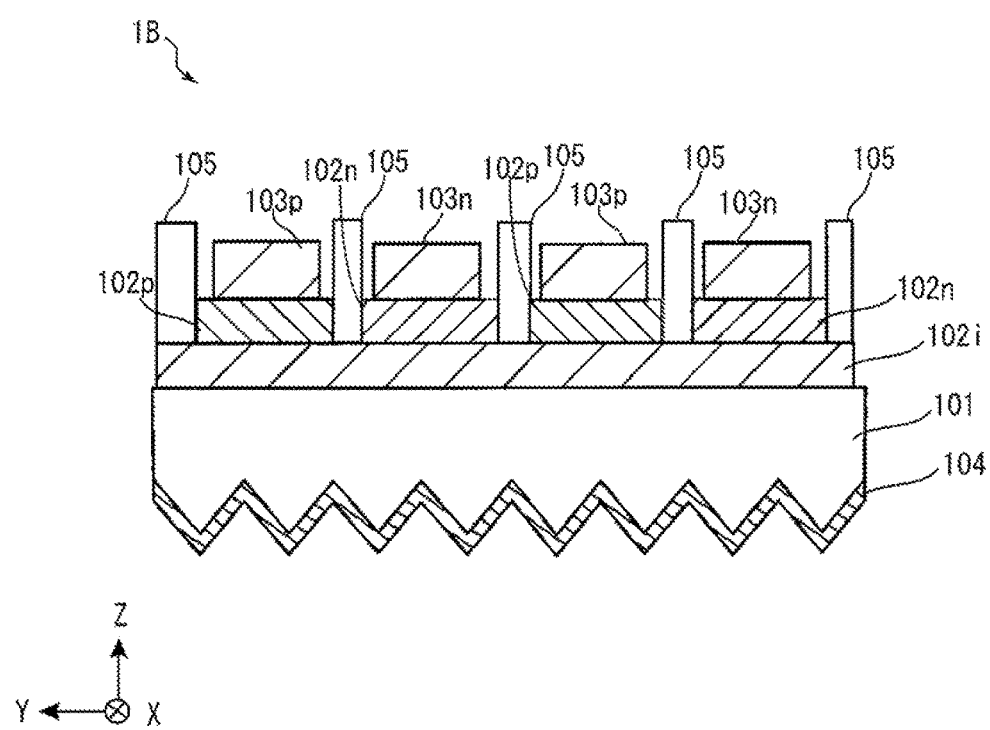

FIG. 14B is a schematic B-B cross-sectional view of the photovoltaic device shown in FIG. 13.

Figure 15:
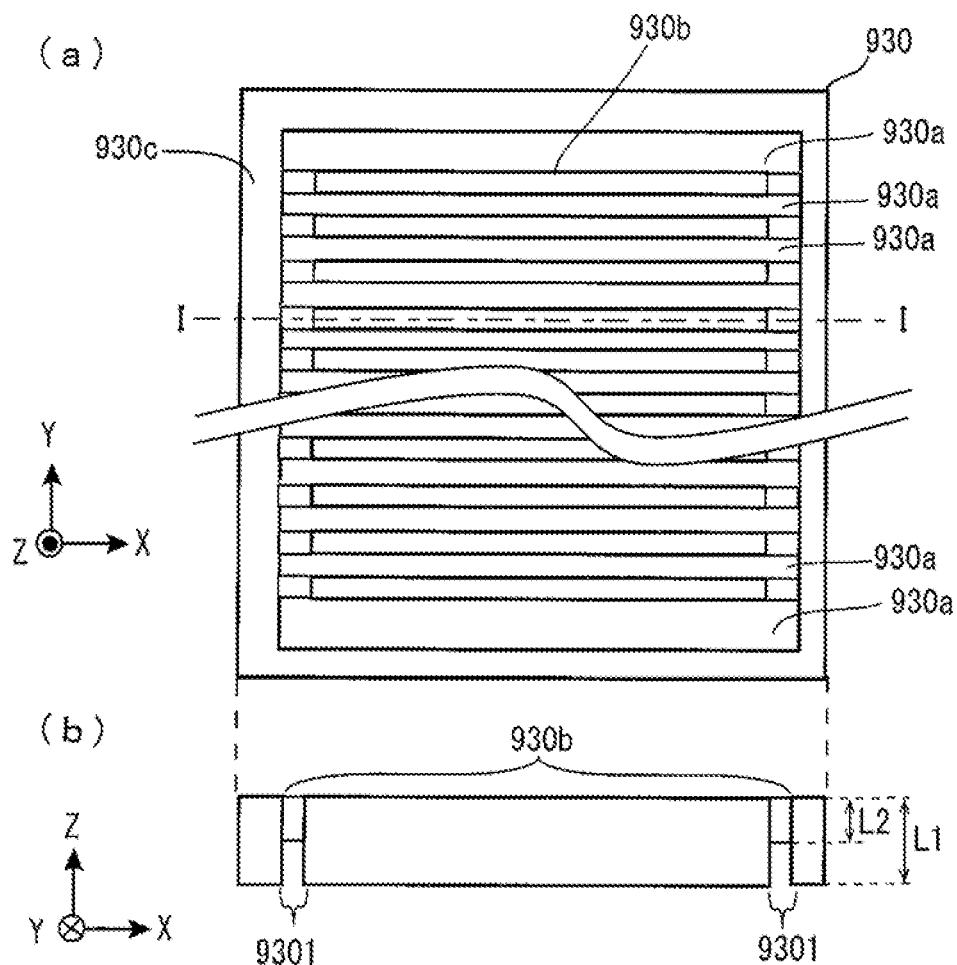

Portion (a) of FIG. 15 is a schematic plan view of a metal mask used when insulating strips are formed in Variation Example 3 of the first embodiment, and (h) of FIG. 15 is a schematic cross-sectional view of the metal mask shown in (a) of FIG. 15.

Figure 16:
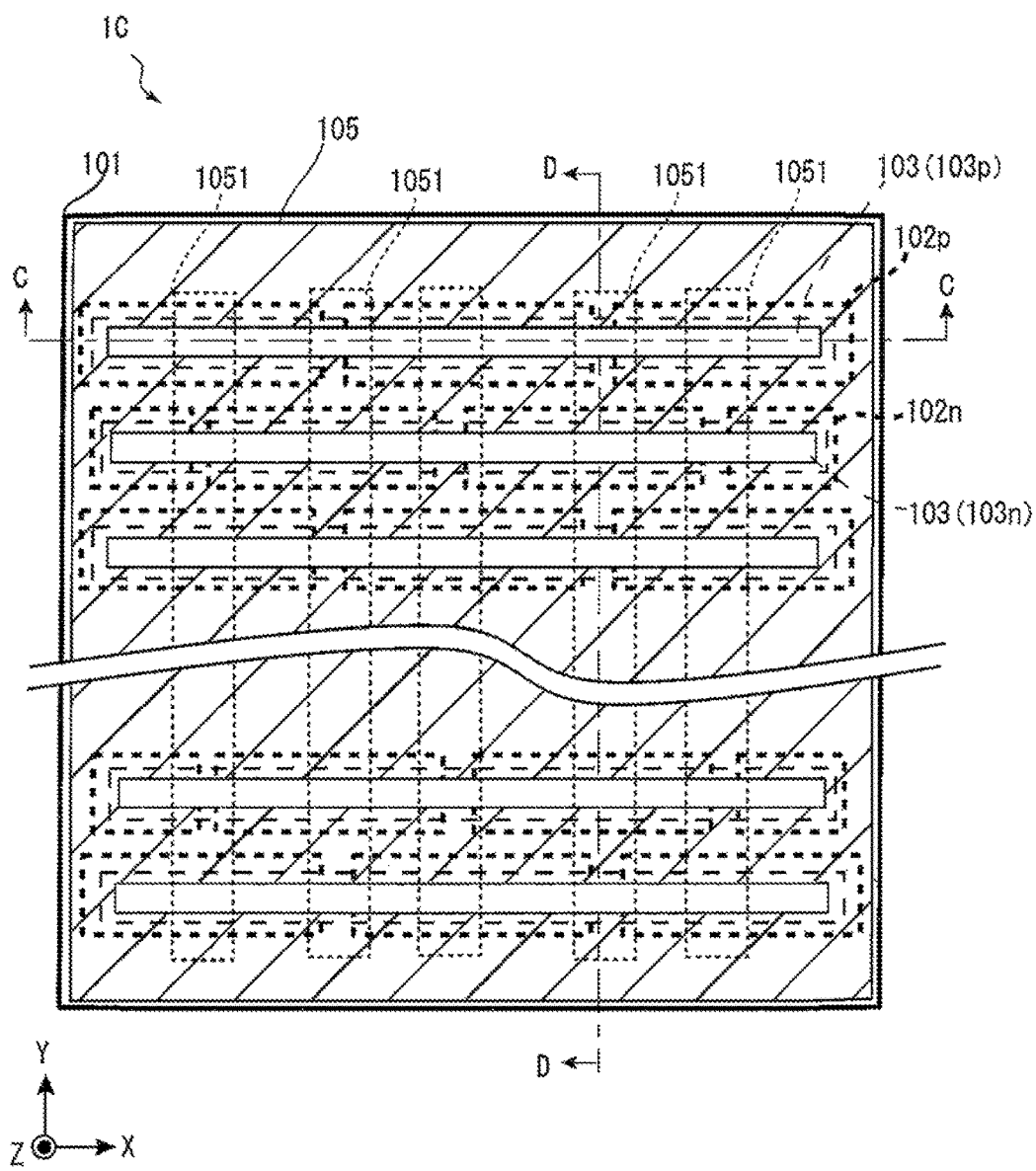

FIG. 16 is a schematic plan view of a photo-voltaic device in accordance with a second embodiment.

Figure 17A:
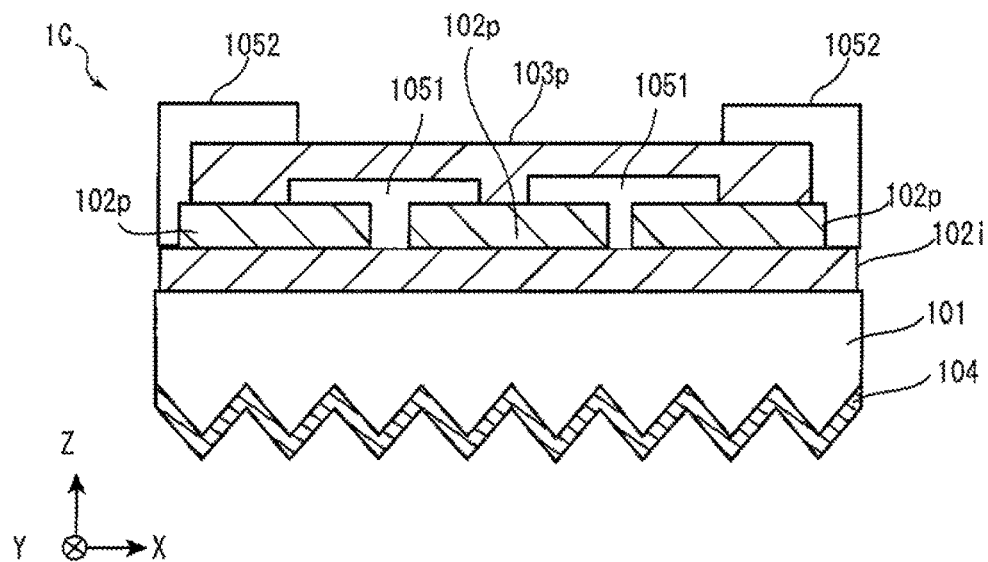

FIG. 17A is a schematic C-C cross-sectional view of the photovoltaic device shown in FIG. 16.

Figure 17B:
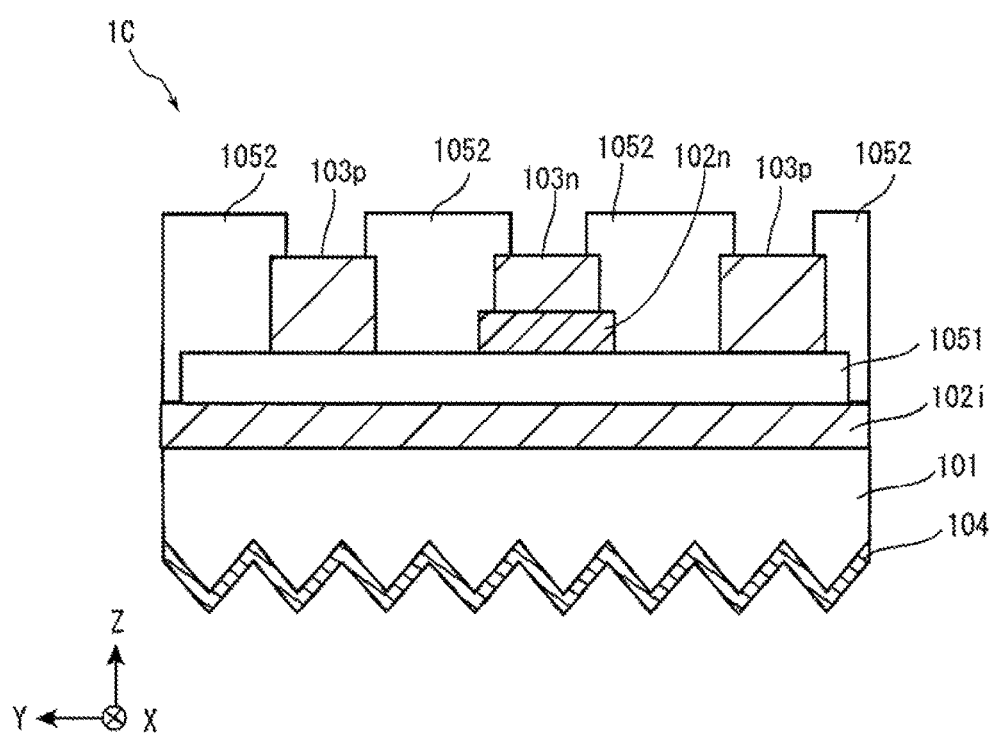

FIG. 17B is a schematic D-D cross-sectional view of the photovoltaic device shown in FIG. 16.

Figure 18:
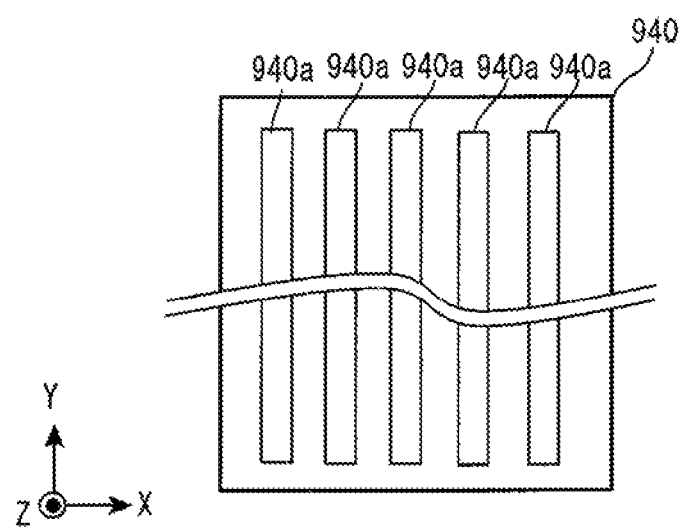

FIG. 18 is a schematic plan view of a metal mask used when insulating strips are formed in the second embodiment.

Figure 19:
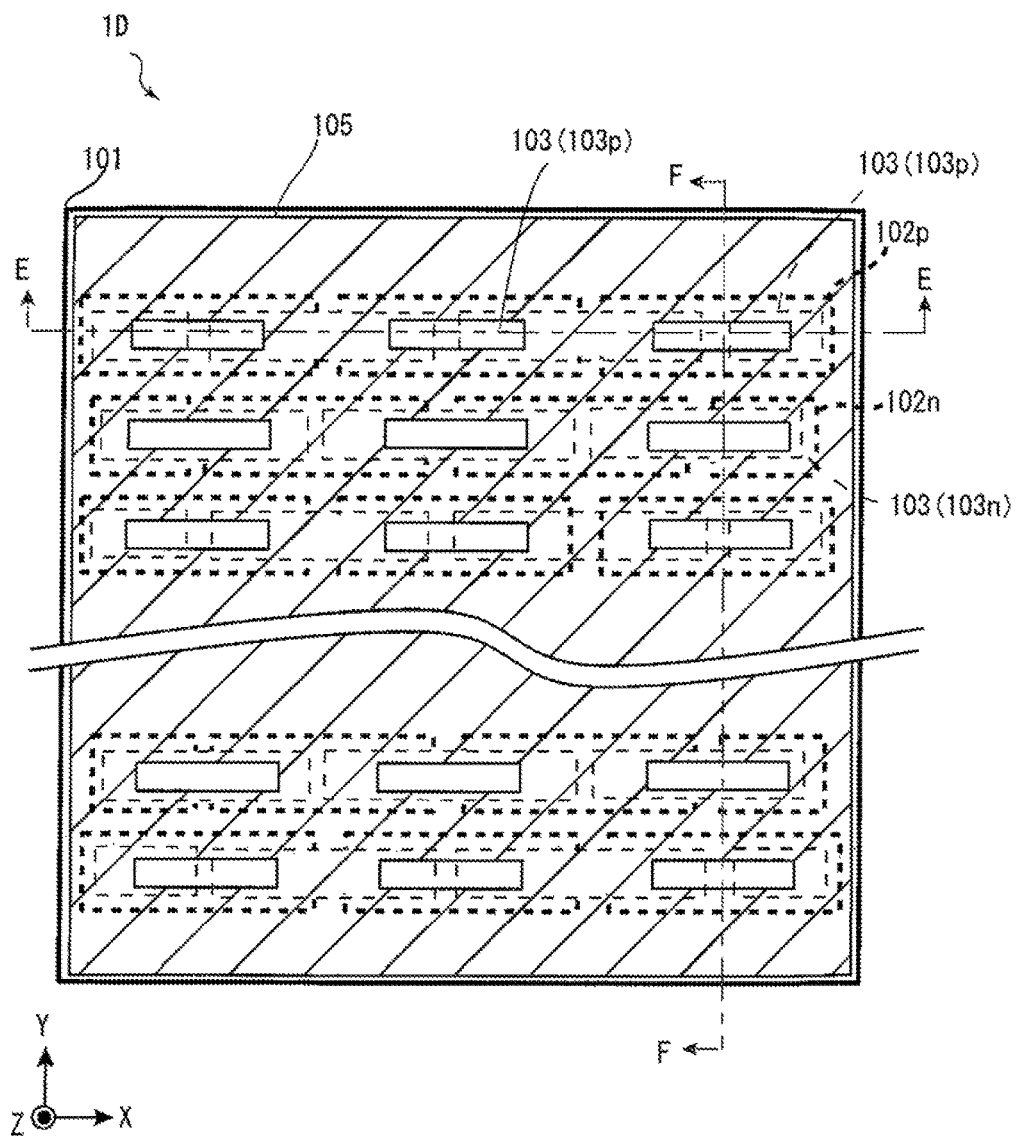

FIG. 19 is a schematic plan view of a photovoltaic device in accordance with a third embodiment.

Figure 20A:
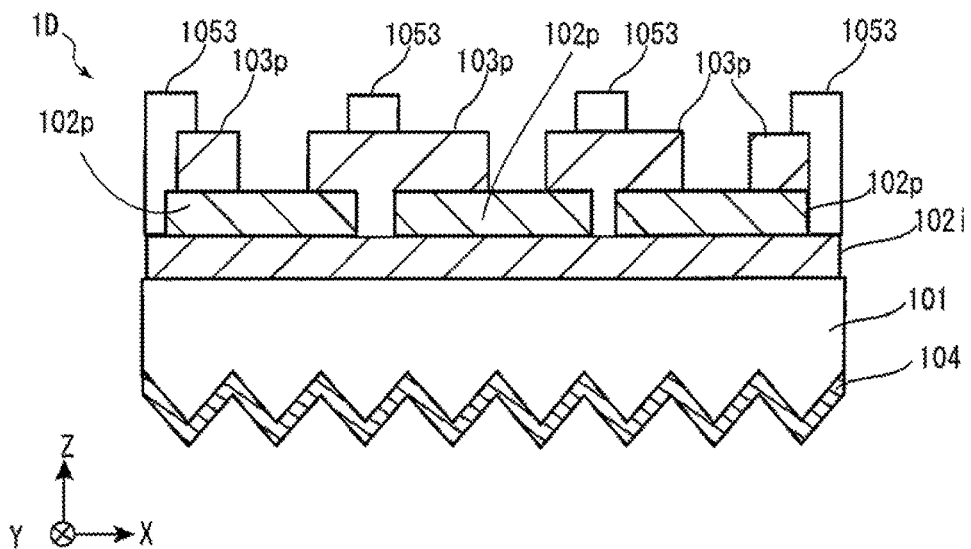

FIG. 20A is a schematic E-E cross-sectional view of the photovoltaic device shown in FIG. 19.

Figure 20B:
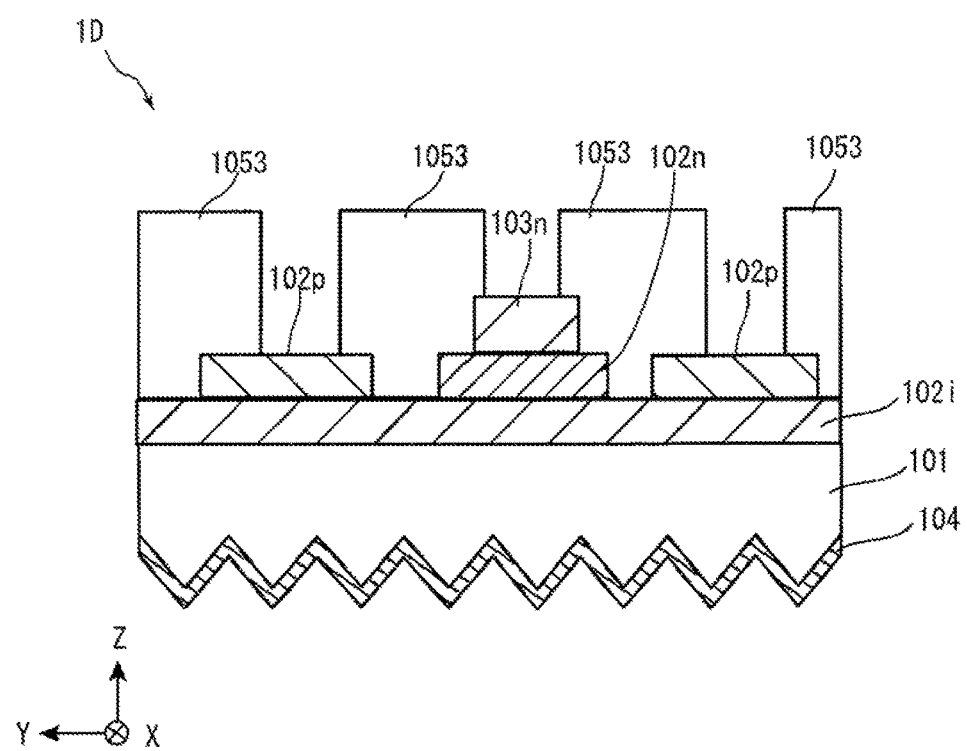

FIG. 20B is a schematic F-F cross-sectional view of the photovoltaic device shown in FIG. 19.

Figure 21:
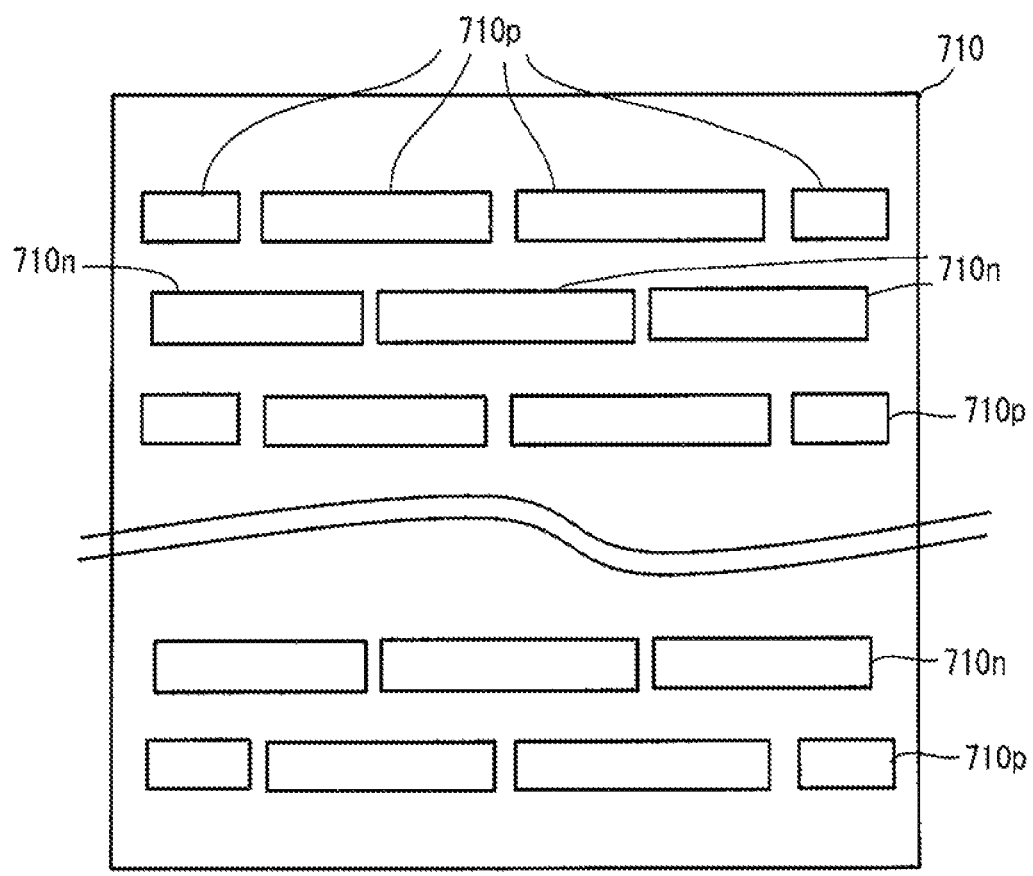

FIG. 21 is a schematic plan view of a metal mask used when the electrodes shown in FIG. 19 are formed.

Figure 22:
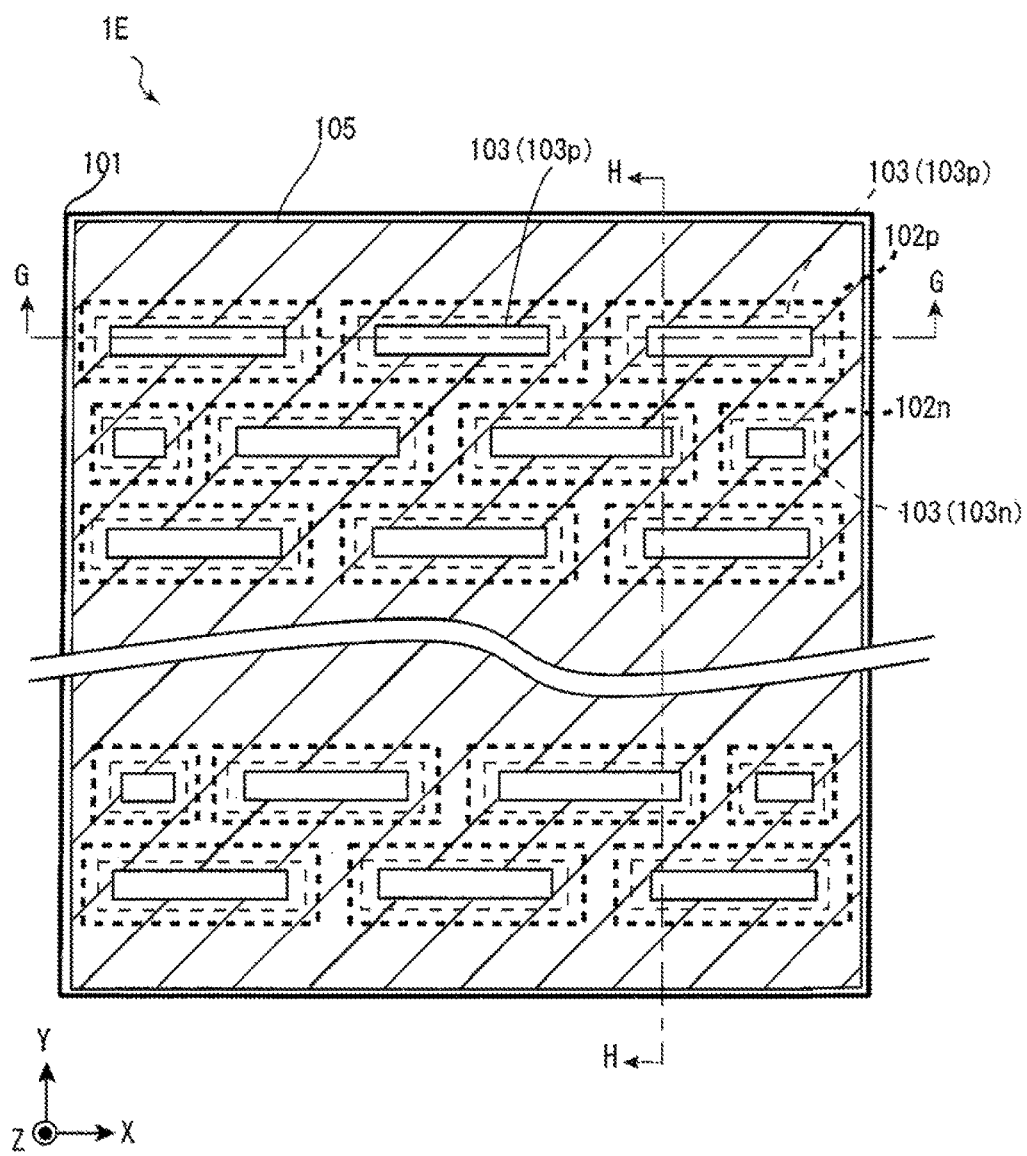

FIG. 22 is a schematic plan view of a photovoltaic device in accordance with a fourth embodiment.

Figure 23A:
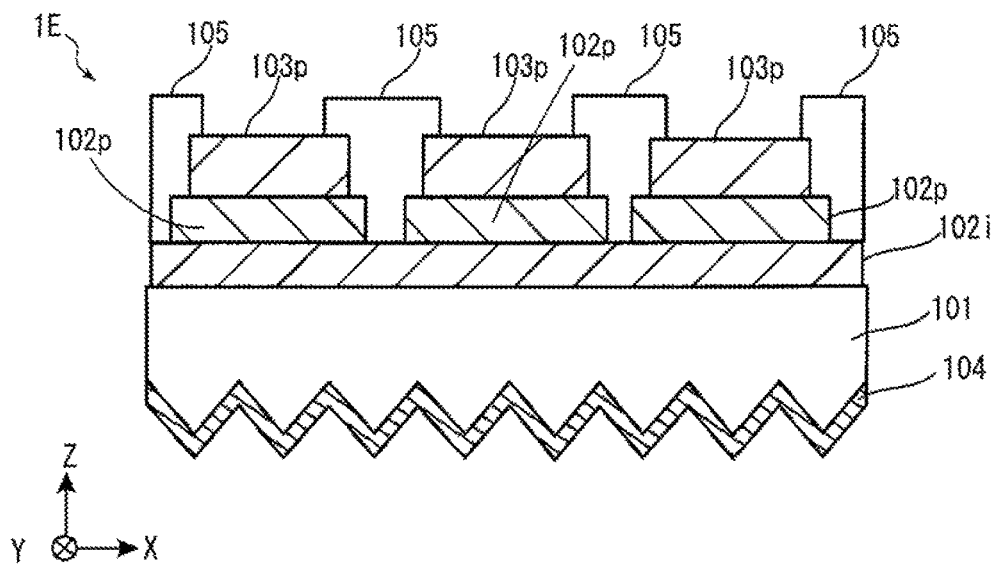

FIG. 23A is a schematic G-G cross-sectional view of the photovoltaic device shown in FIG. 22.

Figure 23B:
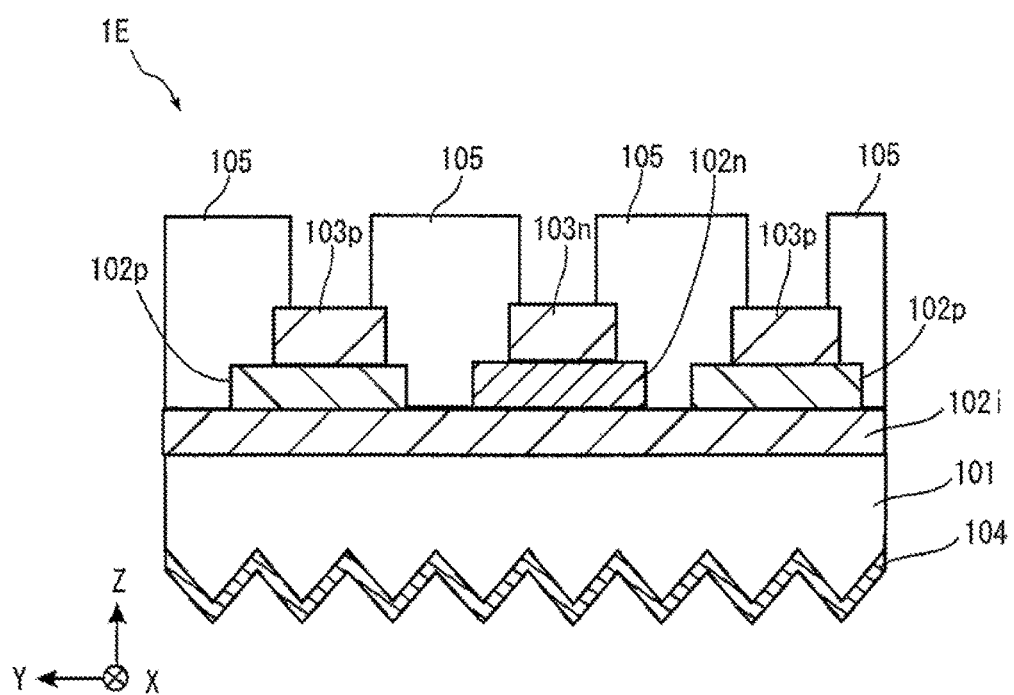

FIG. 23B is a schematic H-H cross-sectional view of the photovoltaic device shown in FIG. 22.

Figure 24:
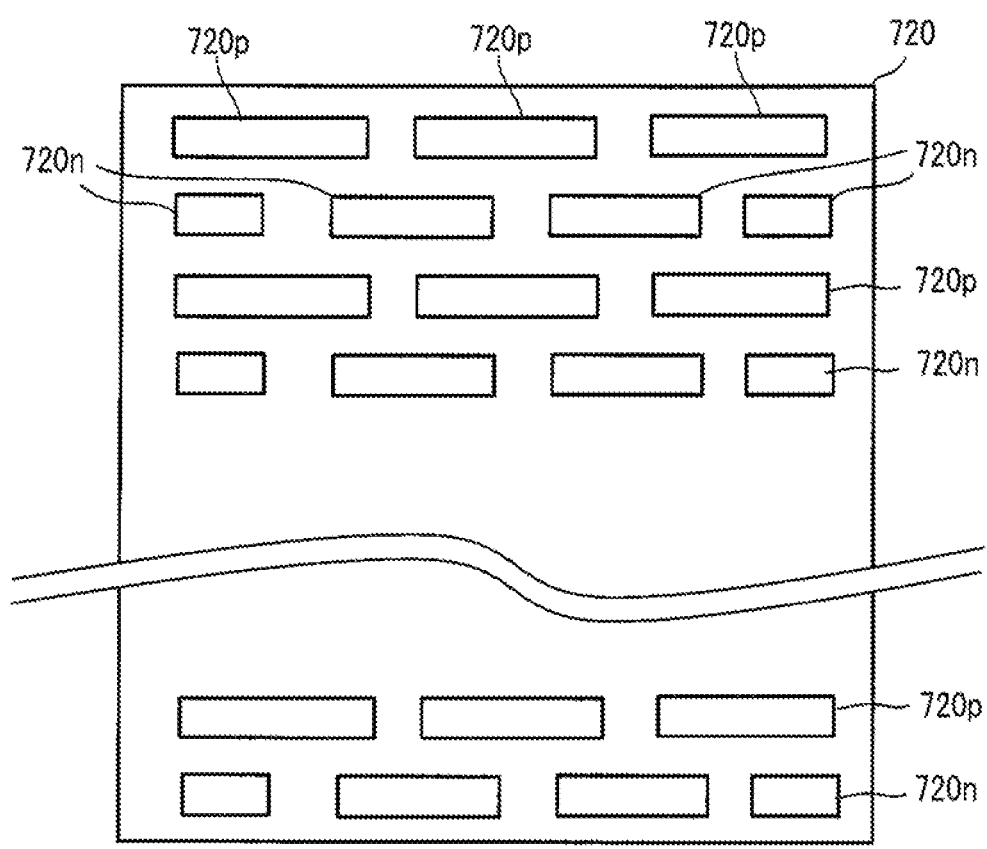

FIG. 24 is a schematic plan view of a metal mask used when the electrodes shown in FIG. 22 are formed.

Figure 25:
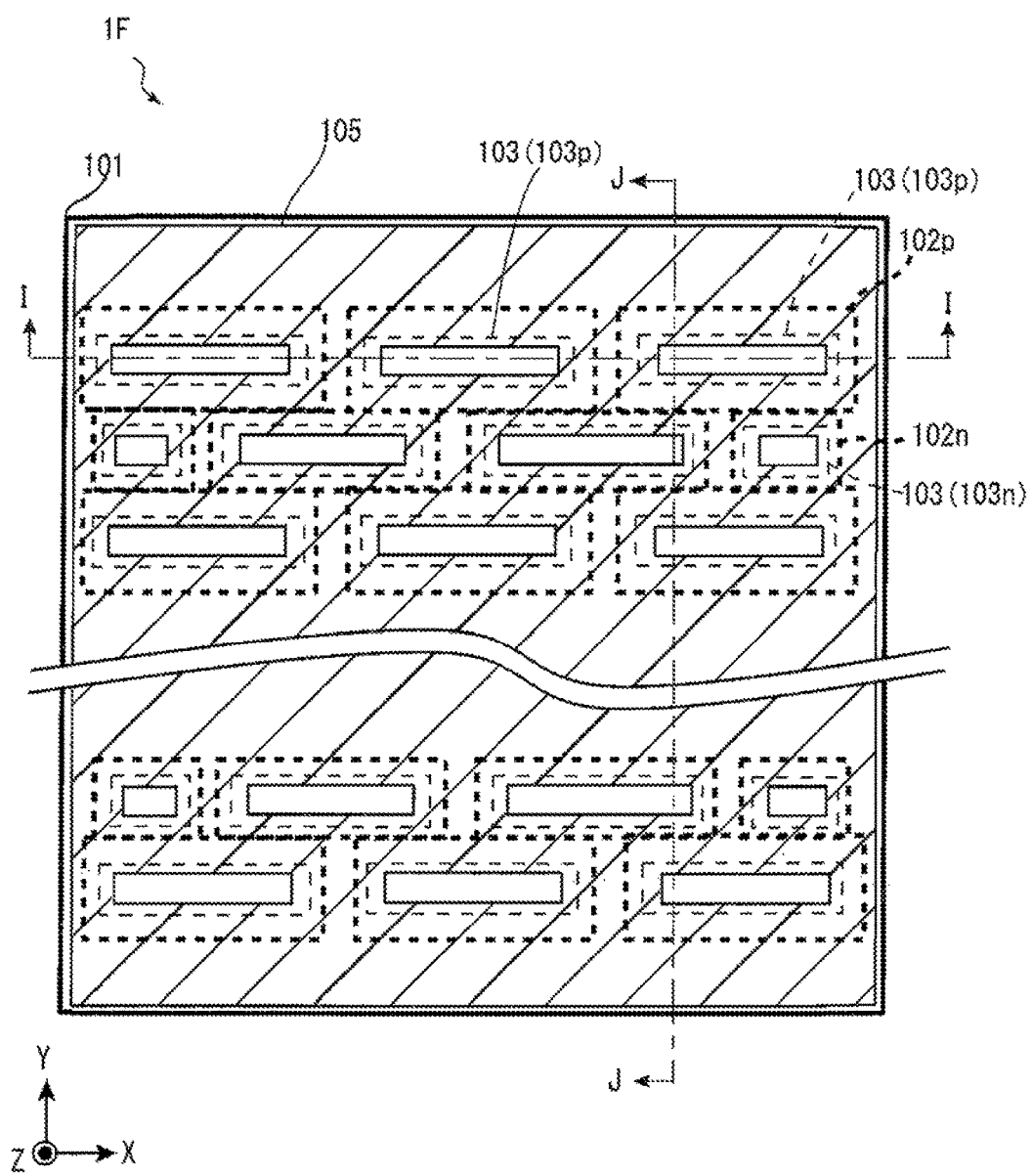

FIG. 25 is a schematic plan view of a photovoltaic device in accordance with a fifth embodiment.

Figure 26A:
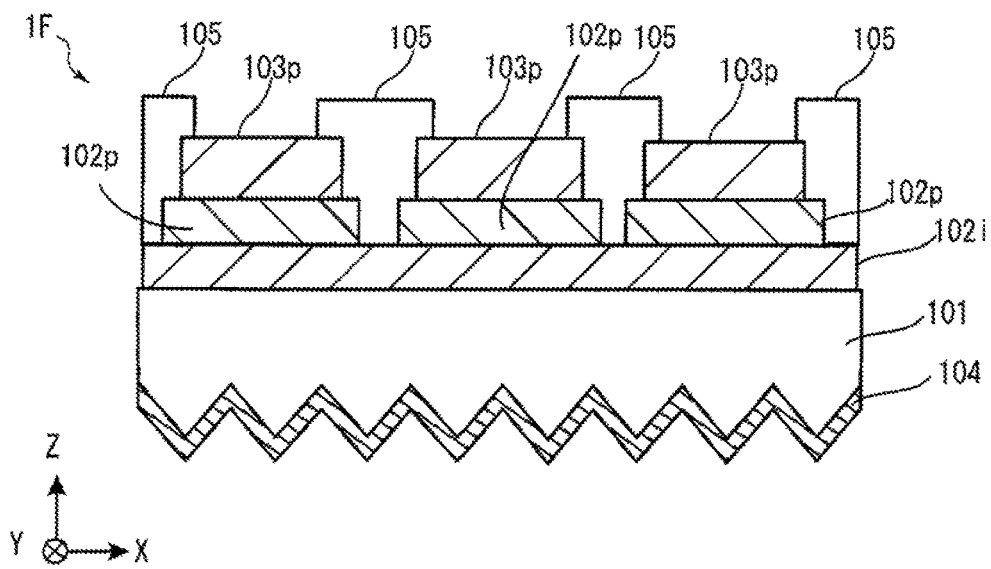

FIG. 26A is a schematic I-I cross-sectional view of the photovoltaic device shown in FIG. 25.

Figure 26B:
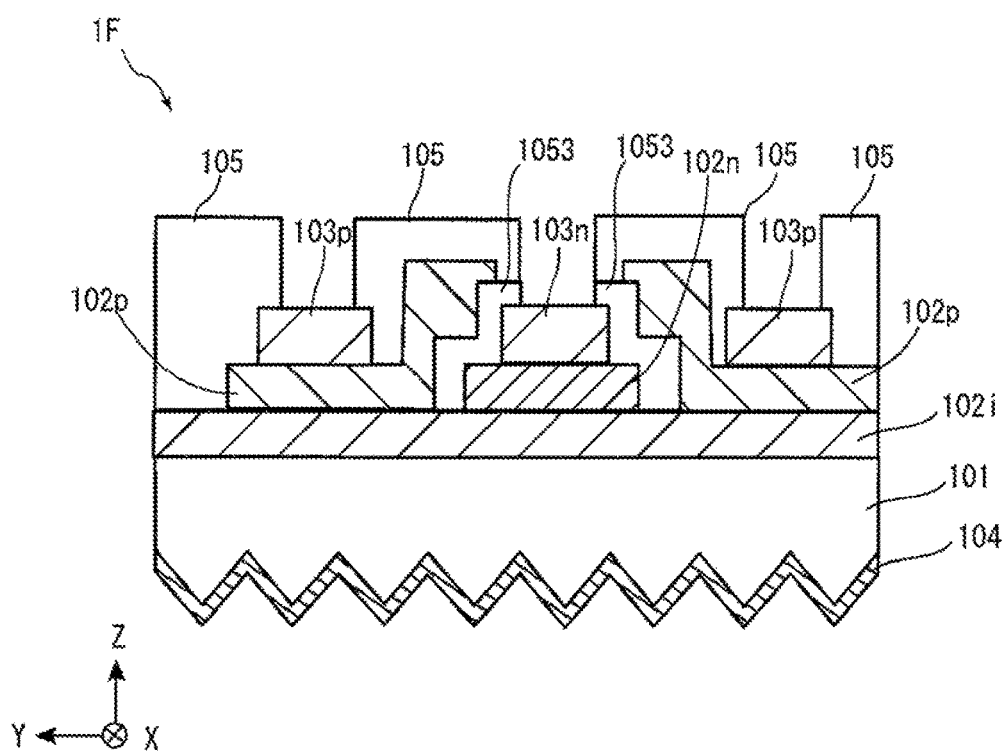

FIG. 26B is a schematic J-J cross-sectional view of the photovoltaic device shown in FIG. 25.

Figure 27A:
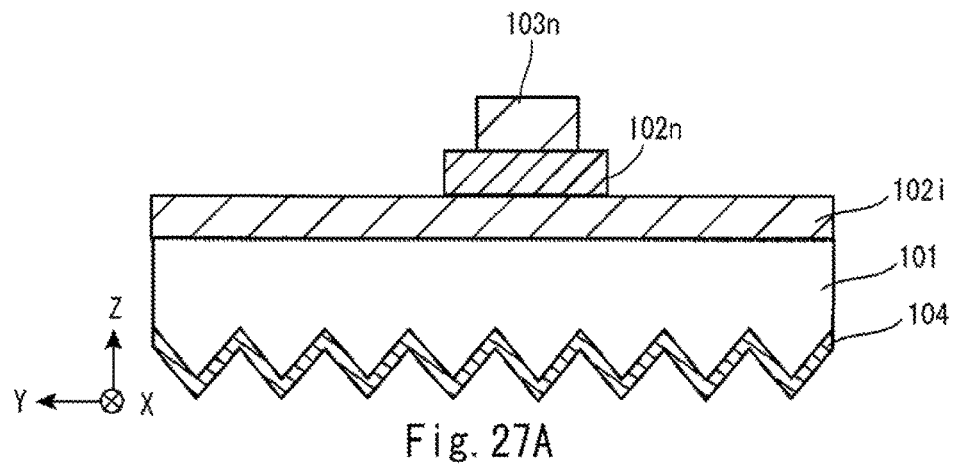

FIG. 27A is a cross-sectional view in accordance with the fifth embodiment where an n-type amorphous semiconductor strip is formed on an i-type amorphous semiconductor layer, and an n-type electrode is formed on the n-type amorphous semiconductor strip.

Figure 27B:
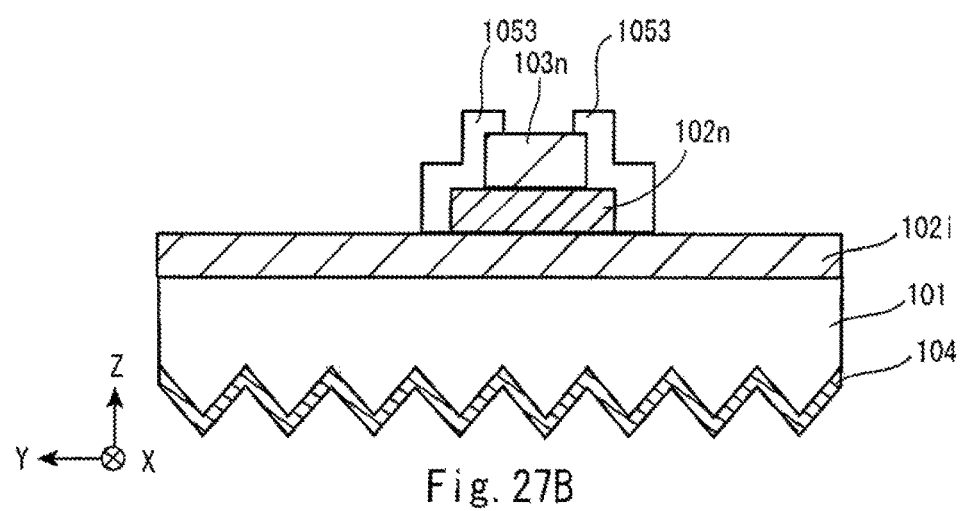

FIG. 27B is a cross-sectional view where insulating strips are formed covering the n-type electrode and the n-type amorphous semiconductor strip shown in FIG. 27A.

Figure 27C:
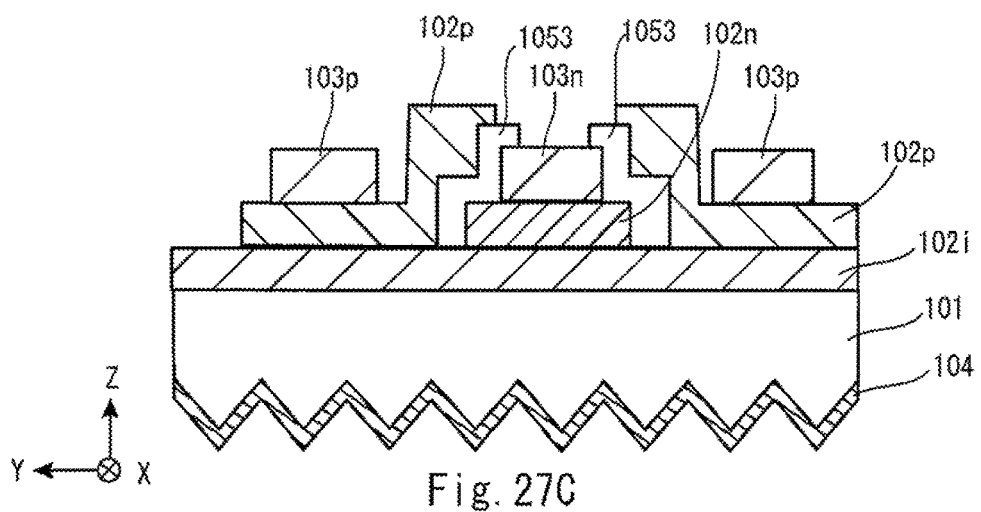

FIG. 27C is a cross-sectional view where p-type amorphous semiconductor strips are formed on the i-type amorphous semiconductor layer shown in FIG. 27B, and p-type electrodes are formed on the p-type amorphous semiconductor strips.

Figure 27D:
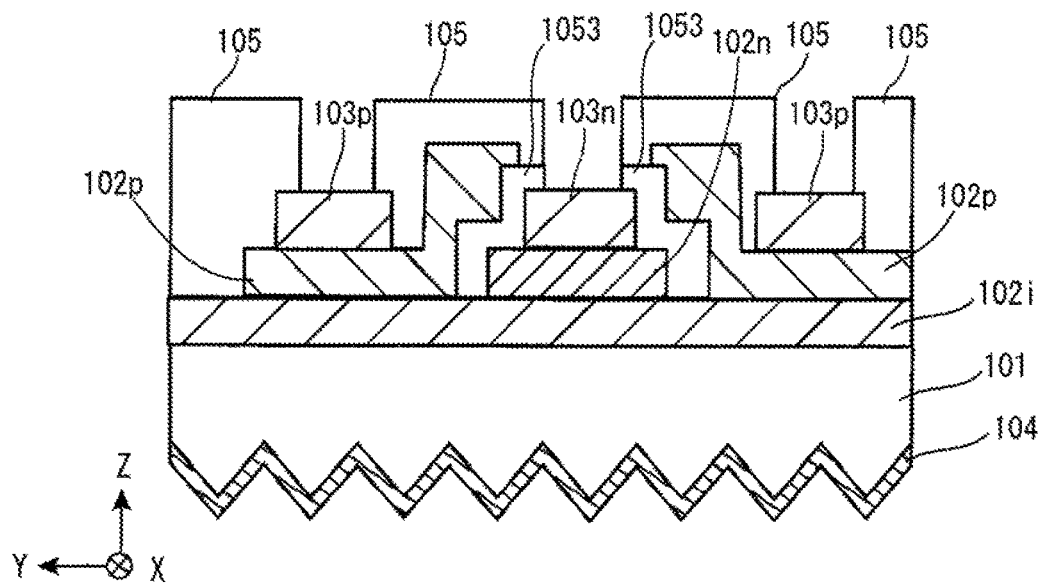

FIG. 27D is a cross-sectional view where insulating strips are formed on the i-type amorphous semiconductor layer shown in FIG. 27C.

Figure 28A:
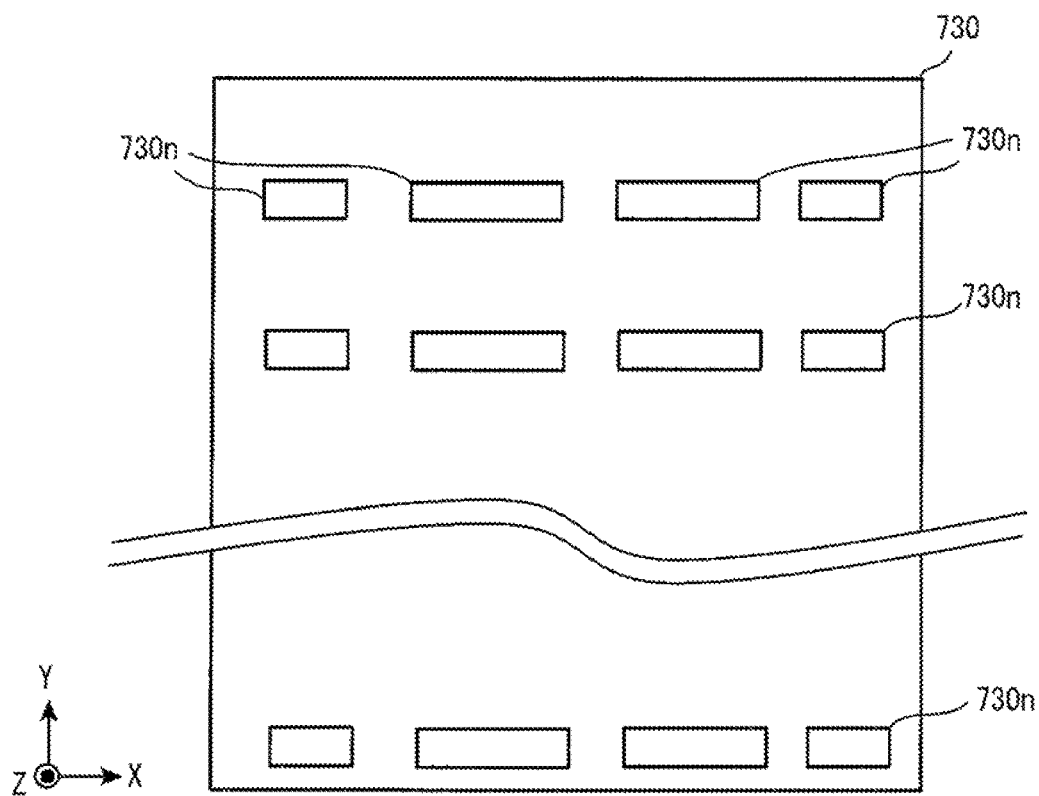

FIG. 28A is a schematic plan view of a metal mask used when an n electrode is formed in the step shown in FIG. 27A.

Figure 28B:
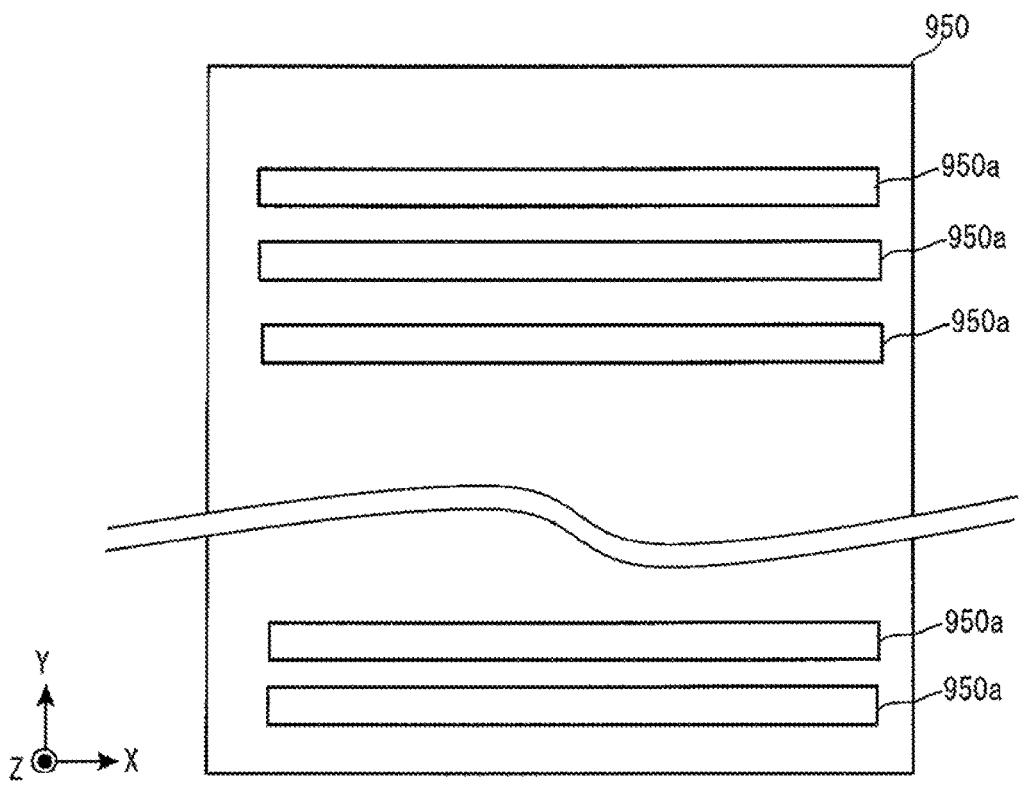

FIG. 28B is a schematic plan view of a metal mask used when insulating strips are formed in the step shown in FIG. 27A.

Figure 28C:
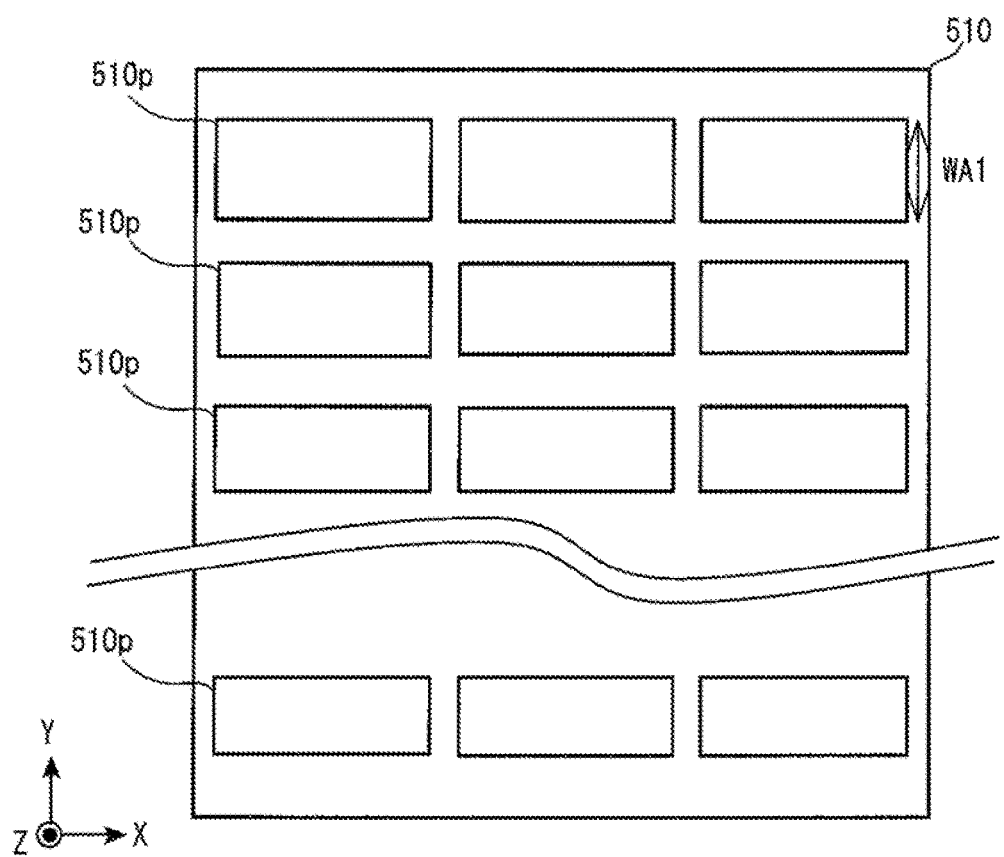

FIG. 28C is a schematic plan view of a metal mask used when p-type amorphous semiconductor strips are formed in the step shown in FIG. 27C.

Figure 28D:
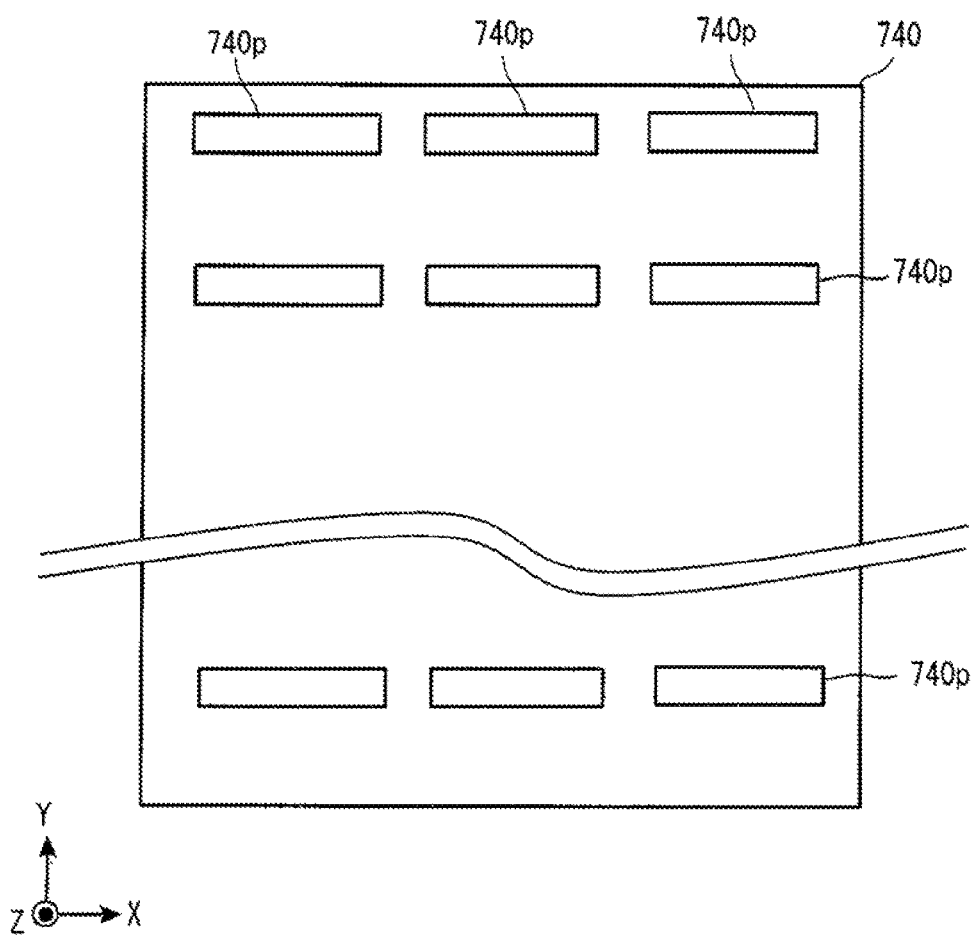

FIG. 28D is a schematic plan view of a metal mask used when a p electrode is formed in the step shown in FIG. 27C.

Figure 29:
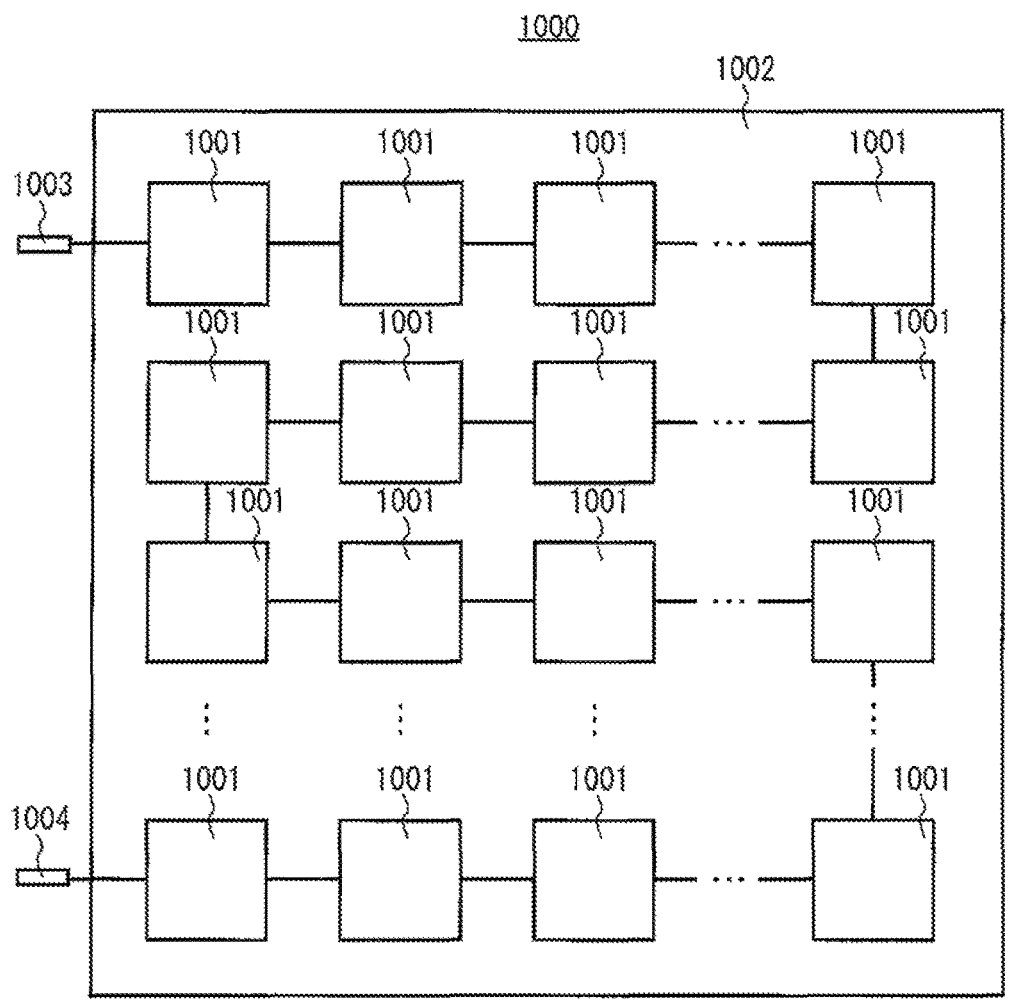

FIG. 29 is a schematic diagram showing a configuration of a photovoltaic in accordance with a sixth embodiment.

Figure 30A:
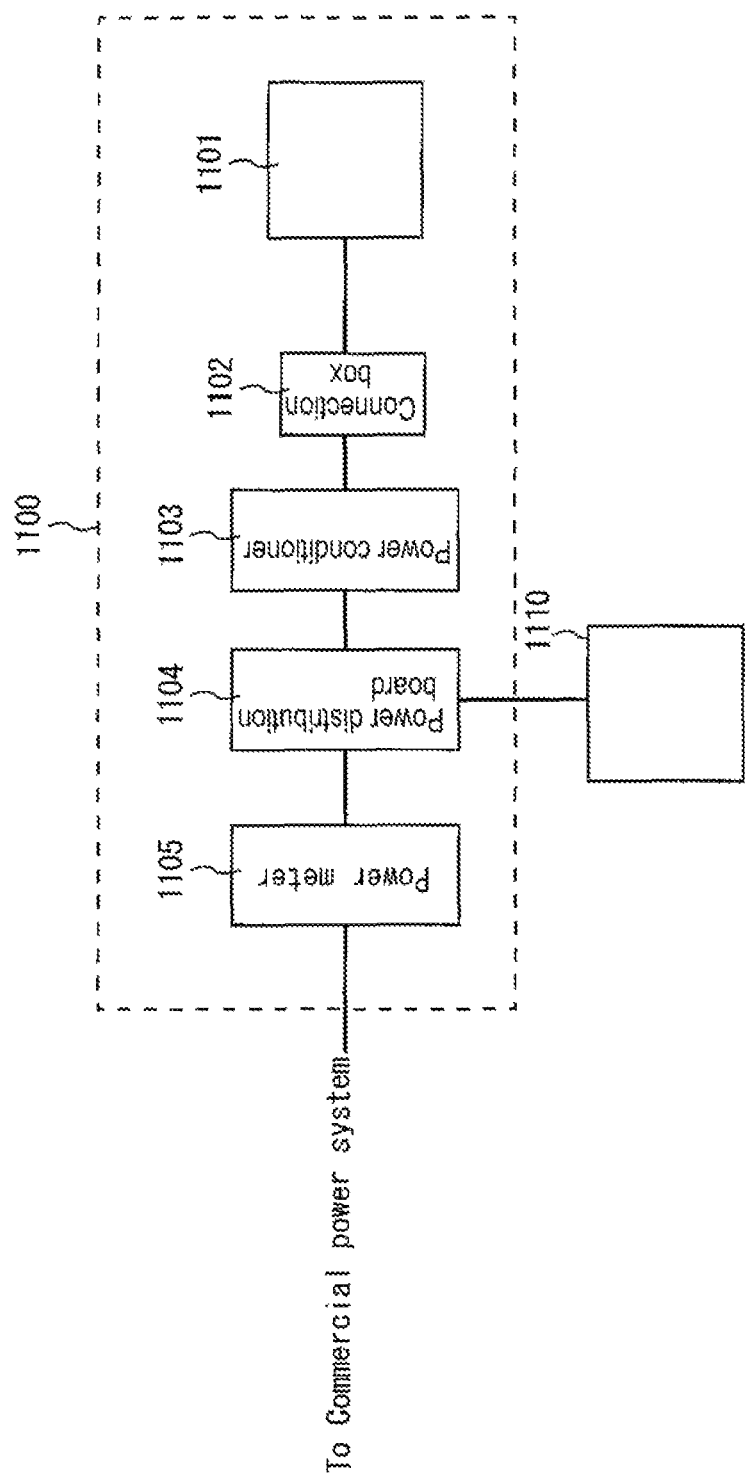

FIG. 30A is a schematic diagram showing a configuration of a solar power generation system including a photovoltaic device in accordance with the sixth embodiment.

Figure 30B:
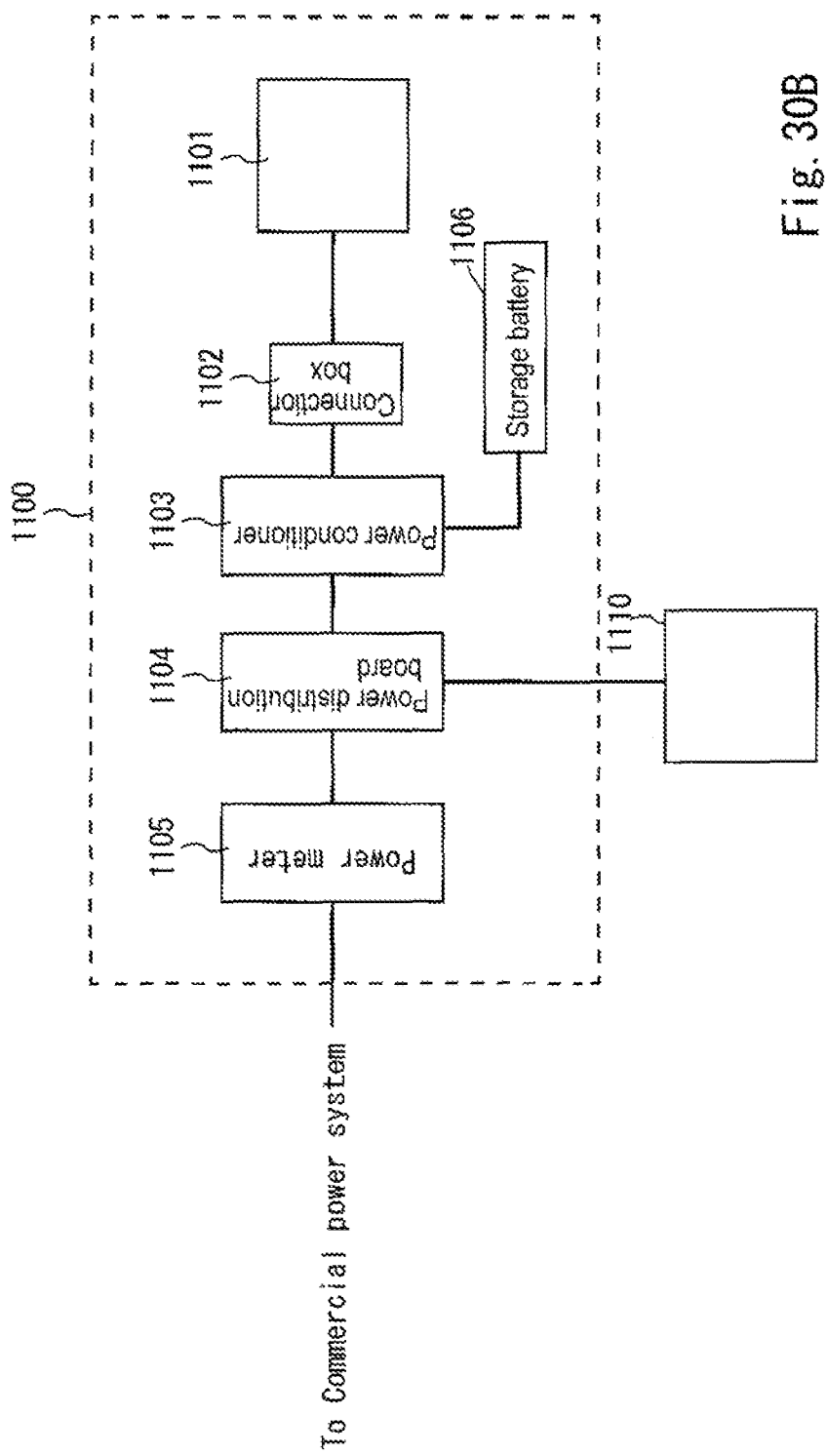

FIG. 30B is a schematic diagram showing another configuration example of the solar power generation system shown in FIG. 30A.

Figure 31:
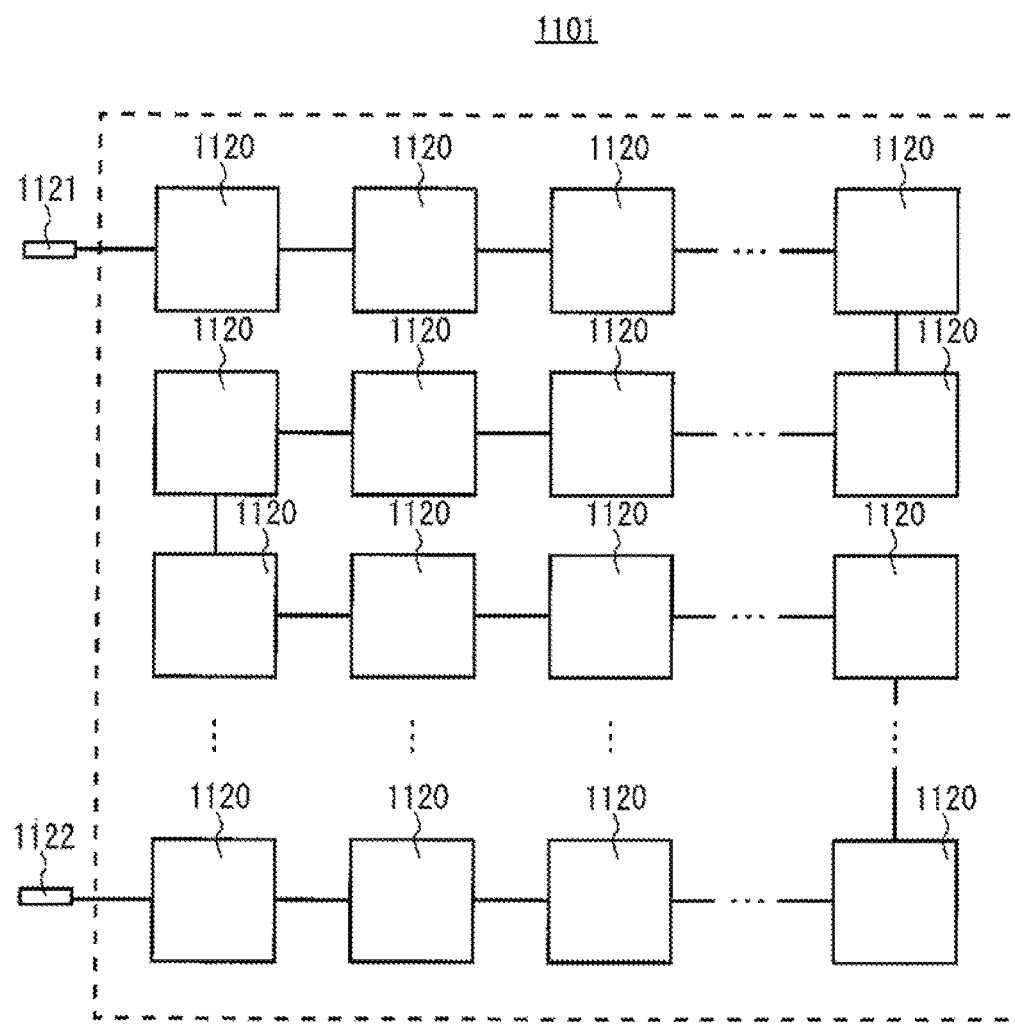

FIG. 31 is a schematic diagram showing a configuration of the photovoltaic module array shown in FIG. 30A.

Figure 32A:
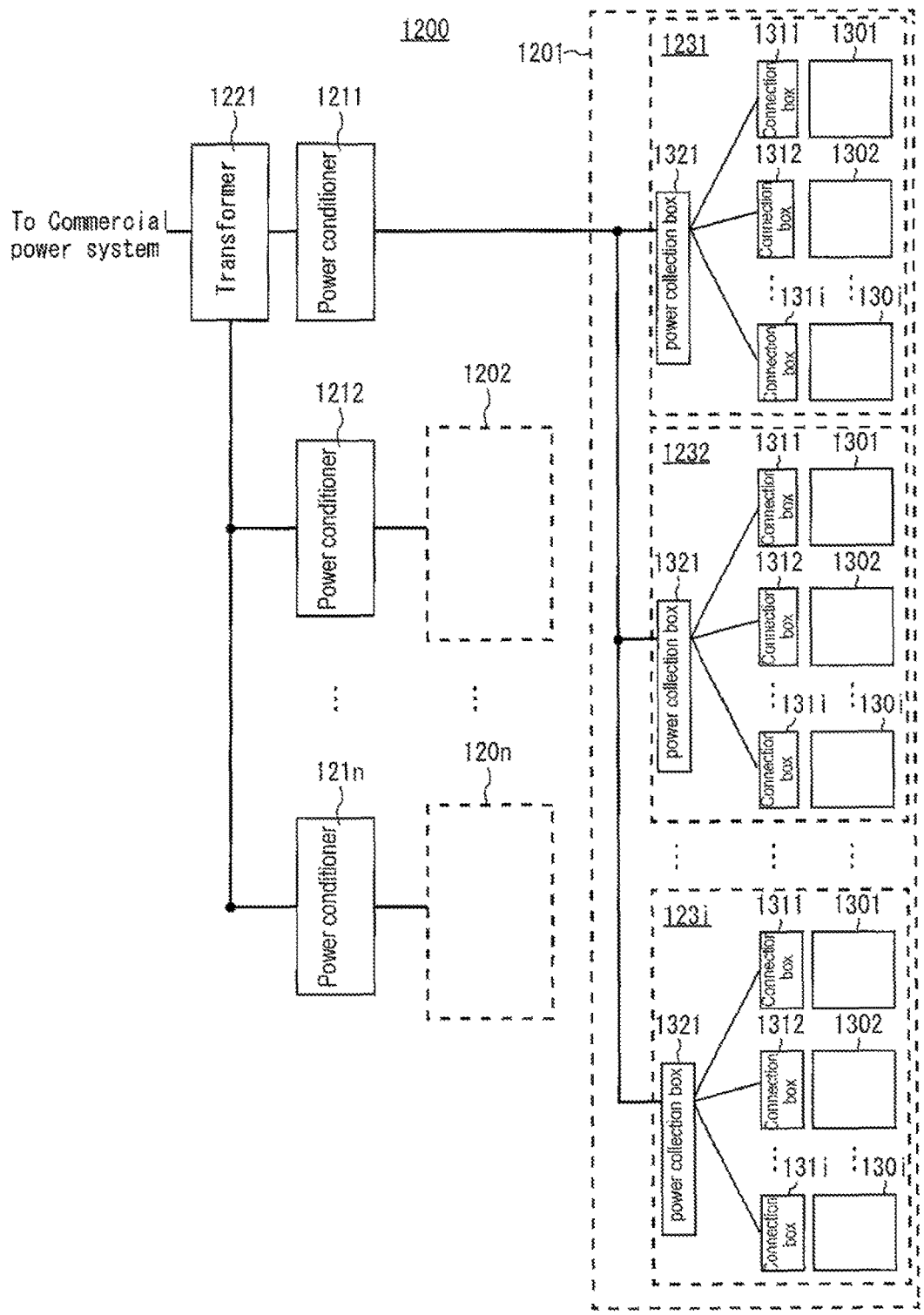

FIG. 32A is a schematic diagram showing a configuration of a solar power generation system including a photovoltaic device in accordance with a seventh embodiment.

Figure 32B:
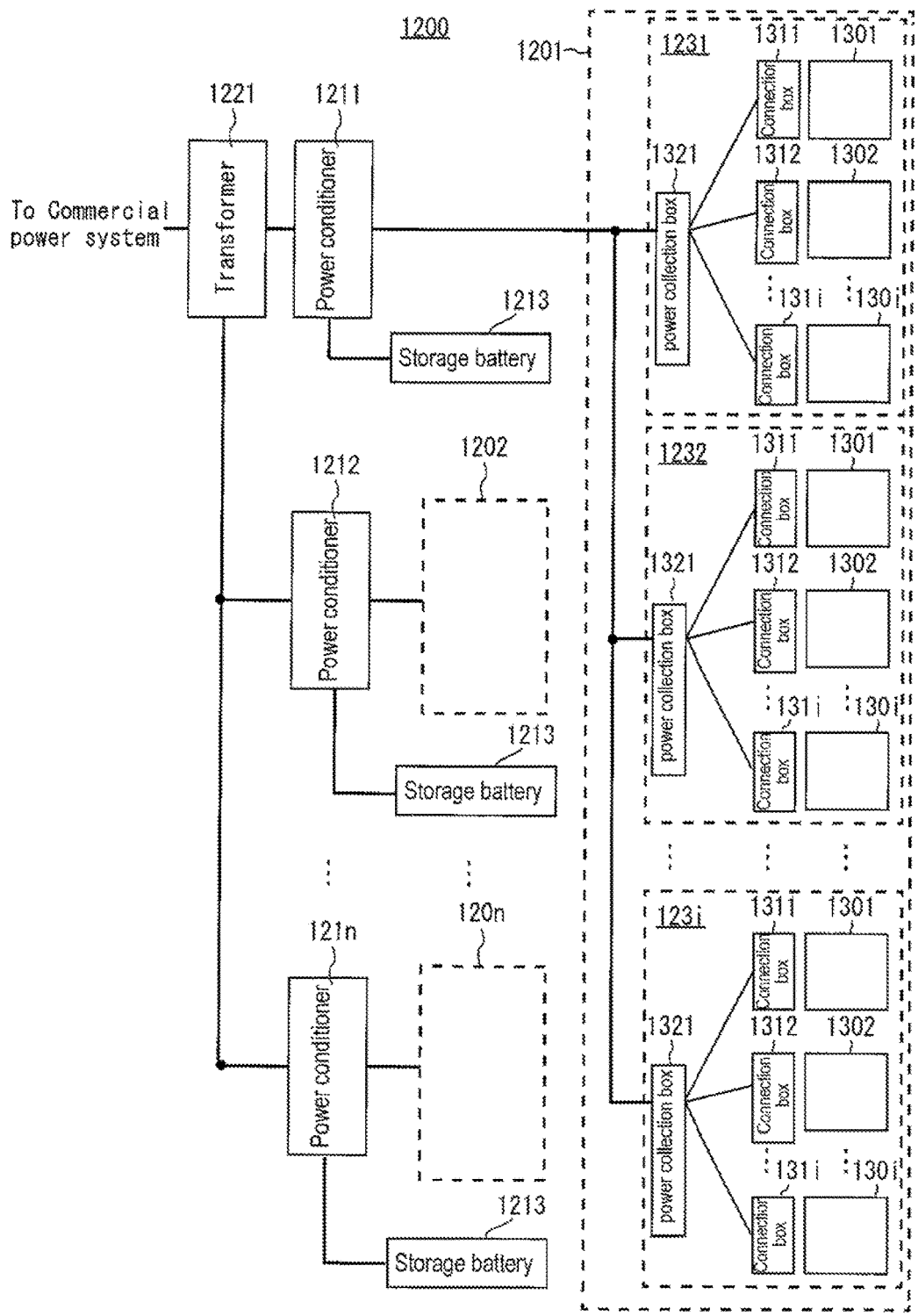

FIG. 32B is a schematic diagram showing another configuration example of the solar power generation system shown in FIG. 32A.

Figure 33:
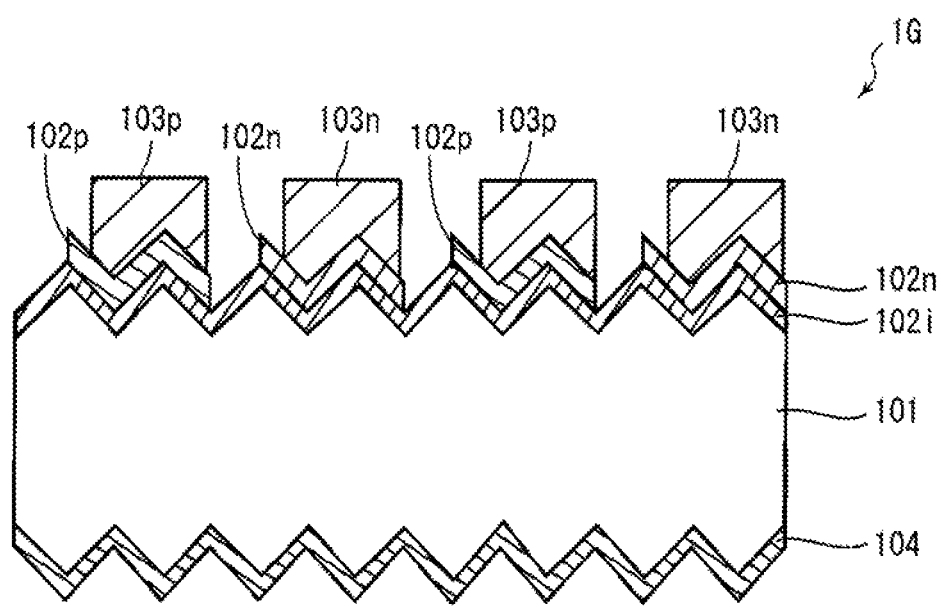

FIG. 33 is a schematic cross-sectional view of a photovoltaic device in accordance with Variation Example (4).

DESCRIPTION OF EMBODIMENTS

The present invention, in an embodiment (first aspect) thereof, is directed to a photovoltaic device including: a semiconductor substrate; an intrinsic amorphous semiconductor layer formed in contact with one of surfaces of the semiconductor substrate; first amorphous semiconductor strips of a first conductivity type spaced apart from each other and provided on the intrinsic amorphous semiconductor layer; second amorphous semiconductor strips of a second conductivity type spaced apart from each other and provided on the intrinsic amorphous semiconductor layer, each second amorphous semiconductor strip being adjacent to at least one of the first amorphous semiconductor strips as traced along an in-plane direction of the semiconductor substrate, the second conductivity type being opposite the first conductivity type; and a protection layer formed in contact with the intrinsic amorphous semiconductor layer between those first amorphous semiconductor strips which are adjacent to each other and between those second amorphous semiconductor strips which are adjacent to each other.

According to the first aspect, the gaps between the spaced-apart first amorphous semiconductor strips and the gaps between the spaced-apart second amorphous semiconductor strips on the intrinsic amorphous semiconductor layer formed on one of surfaces of the semiconductor substrate are covered by the protection layer. Therefore, external water, organic, and other foreign matter are unlikely to contaminate the intrinsic amorphous semiconductor layer between the spaced-apart first amorphous semiconductor strips and between the spaced-apart second amorphous semiconductor strips. Degradation of the photovoltaic device is hence restrained.

In a second aspect of the invention, the photovoltaic device according to the first aspect may be arranged such that the protection layer includes an insulating film.

According to the second aspect, external water, organic, and other foreign matter are restrained from contaminating the intrinsic amorphous semiconductor layer between the spaced-apart first amorphous semiconductor strips and between the spaced-apart second amorphous semiconductor strips.

In a third aspect of the invention, the photovoltaic device according to either the first or second aspect may be arranged such that the protection layer includes electrodes further in contact with the respective first and second amorphous semiconductor strips.

According to the third aspect, external water, organic, and other foreign matter are restrained from contaminating the intrinsic amorphous semiconductor layer between the spaced-apart first amorphous semiconductor strips and between the spaced-apart second amorphous semiconductor strips.

In a fourth aspect of the invention, the photovoltaic device according to the second aspect may be arranged such that the insulating film is formed further in contact with the intrinsic amorphous semiconductor layer between those first and second amorphous semiconductor strips which are adjacent to each other.

According to the fourth aspect, the intrinsic amorphous semiconductor layer is covered between the adjacent first and second amorphous semiconductor strips by the insulating film. Therefore, short-circuiting is prevented from occurring between the adjacent first and second amorphous semiconductor strips. Additionally, external water, organic, and other foreign matter are restrained from contaminating the intrinsic amorphous semiconductor layer between those first and second amorphous semiconductor strips.

In a fifth aspect of the invention, the photovoltaic device according of the fourth aspect may be arranged such that the insulating film is formed overlapping parts of the electrodes near edges of the electrodes.

According to the fifth aspect, the insulating film overlaps parts of the electrodes near edges of the electrodes. Therefore, the insulating film improves adhesion between the electrodes and the first and second amorphous semiconductor strips. As a result, stress in the semiconductor substrate is less likely to cause the electrodes to detach from the semiconductor substrate.

In a sixth aspect of the invention, the photovoltaic device according to any one of the first to fifth aspects may be arranged such that: the first and second amorphous semiconductor strips are substantially rectangular in shape; and those first and second amorphous semiconductor strips which are adjacent to each other have short sides thereof out of alignment with each other in a direction of long sides of the first and second amorphous semiconductor strips.

According to the sixth aspect, the carrier collection efficiency improves over when the adjacent first and second amorphous semiconductor strips have short sides thereof in alignment with each other.

In a seventh aspect of the invention, the photovoltaic device according to any one of the first to sixth aspects may be arranged such that at least either the first amorphous semiconductor strips or the second amorphous semiconductor strips have a reduced thickness region, where: a first point is a point at which a thin film formed on the semiconductor substrate has a maximum thickness; a second point is either a point at which a rate of decrease of the thickness of the thin film changes, as traced along an in-plane direction of the thin film, from a first rate of decrease to a second rate of decrease that is larger than the first rate of decrease or a point at which a rate of change of the thickness of the thin film changes sign from negative to positive as traced along an in-plane direction of the thin film; and the reduced thickness region is a region from the first point to the second point in the in-plane direction of the thin film.

According to the seventh aspect, at least either the first amorphous semiconductor strips or the second amorphous semiconductor strips have a reduced thickness region in a semiconductor layer thereof. The thickness of the reduced thickness region is smaller than the thickness of the semiconductor layer at the first point. The serial resistance of the semiconductor layer having such a reduced thickness region decreases compared with when an amorphous semiconductor layer with a uniform thickness is provided.

In an eighth aspect of the invention, the photovoltaic device according to the seventh aspect may be arranged such that the insulating film has a reduced thickness region defined above.

According to the eighth aspect, because stress in the insulating film increases with an increase in the thickness of the insulating film, the provision of the reduced thickness region lowers stress in the insulating film. As a result, this aspect reduces warping of the semiconductor substrate caused by stress in the insulating film.

In a ninth aspect of the invention, the photovoltaic device according to any one of the first to eighth aspects may be arranged such that the intrinsic amorphous semiconductor layer has a thickness of less than or equal to 10 nm.

This aspect reduces the serial resistance while restraining degradation of the photovoltaic device.

The following will describe in detail embodiments of the photovoltaic device of the present invention in reference to drawings. Throughout the present specification, the photovoltaic device includes the photovoltaic element, the photovoltaic module using the photovoltaic element, and the solar power generation system incorporating the photovoltaic module. The same or equivalent members in the figures are indicated by common reference signs and numerals, and their description will not be repeated. For ease in understanding the description, the drawings, to which reference will be made in the following, may show structures in a simplified or schematic manner or may omit some structural members. The dimension ratios of the structural members as they appear in the figures do not necessarily represent the actual dimension ratios thereof.

First Embodiment

Figure 2A:
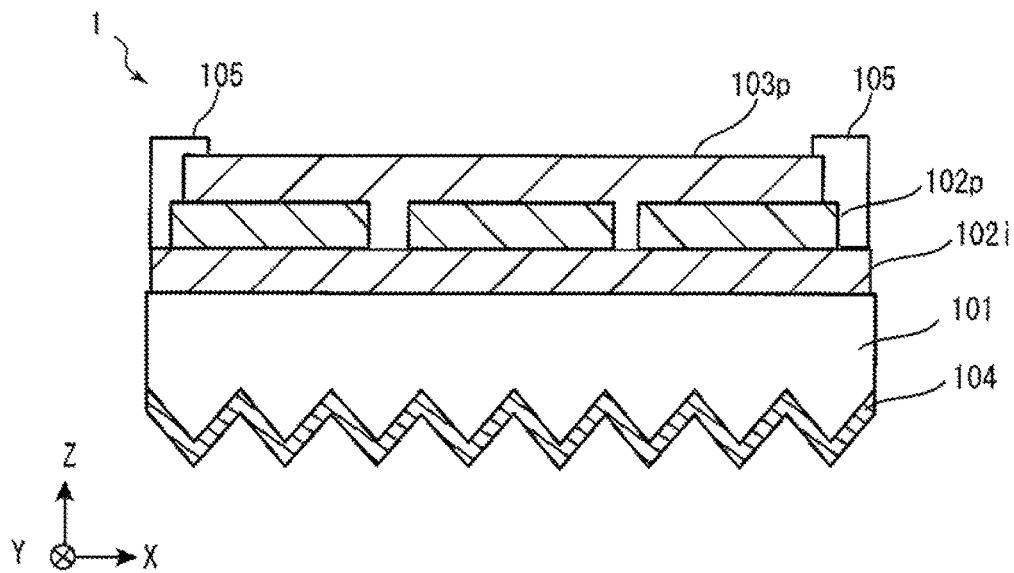
FIG. 2A is a schematic A-A cross-sectional view of the photovoltaic device shown in FIG. 1.
Figure 2B:
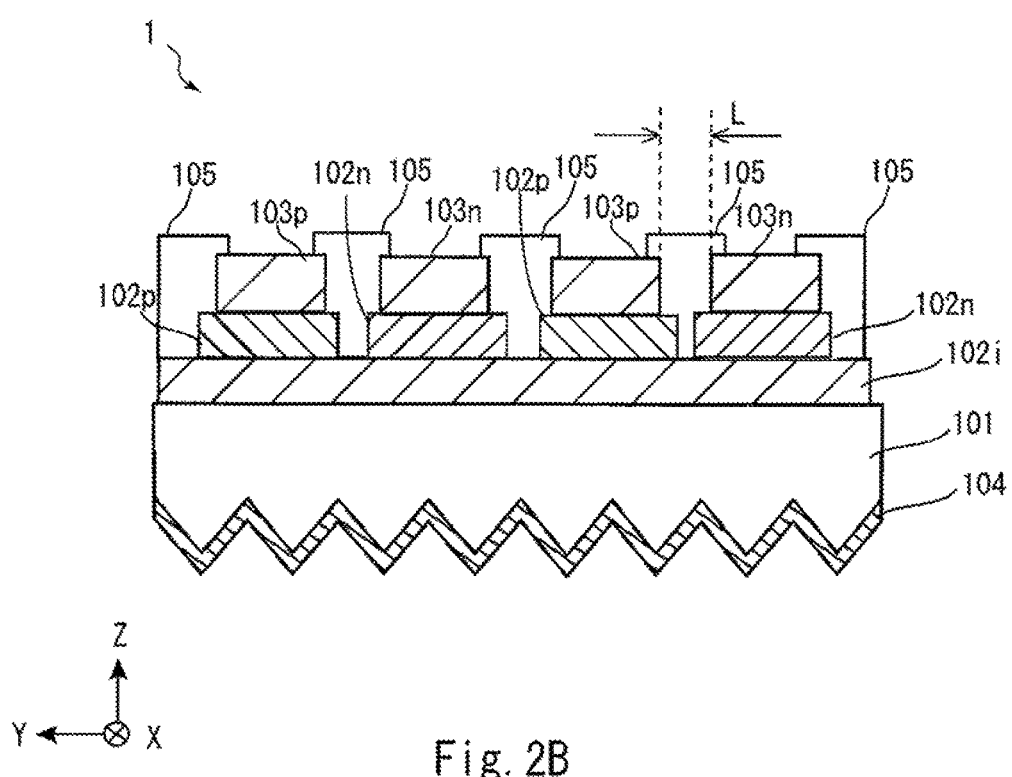
FIG. 2B is a schematic B-B cross-sectional view of the photovoltaic device shown in FIG. 1.

FIG. 1 is a schematic plan view of a photovoltaic device in accordance with a first embodiment of the present invention. FIG. 2A is a schematic A-A cross-sectional view of a photovoltaic device 1 shown in FIG. 1. FIG. 2B is a schematic B-B cross-sectional view of the photovoltaic device 1 shown in FIG. 1.

Referring to FIGS. 1, 2A, and 2B, the photovoltaic device 1 includes a silicon substrate 101, an i-type amorphous silicon layer 102i, n-type amorphous semiconductor strips 102n, p-type amorphous semiconductor strips 102p, electrodes 103, an antireflective film 104, and insulating strips 105.

The silicon substrate 101 is, for example, an n-type monocrystal silicon substrate. The silicon substrate 101 has a thickness of 100 to 150 μm, for example.

Referring to FIGS. 2A and 2B, the antireflective film 104 is formed to cover one of faces of the silicon substrate 101 (negative along the Z-axis). The antireflective film 104 includes, for example, an approximately 20-nm thick silicon oxide film and an approximately 60-nm thick silicon nitride film, deposited in this order. The antireflective film 104 reduces the surface reflectance of the silicon substrate 101 and increases short-circuit currents of the silicon substrate 101. Throughout the following description, the face on which the antireflective film 104 is formed will be referred to as the light-receiving face, and the other face (positive along the Z-axis) will be referred to as the back face.

On the back face of the silicon substrate 101, the i-type amorphous semiconductor layer 102i is formed. The i-type amorphous semiconductor layer 102i is a film of hydrogen-containing, practically intrinsic amorphous semiconductor. The i-type amorphous semiconductor layer 102i is, for example, composed of i-type amorphous silicon, i-type amorphous silicon germanium, i-type amorphous germanium, i-type amorphous silicon carbide, i-type amorphous silicon nitride, i-type amorphous silicon oxide, or i-type amorphous silicon carbon oxide. The i-type amorphous semiconductor layer 102i has a thickness of 10 nm or less, for example. If the i-type amorphous semiconductor layer 102i has a thickness of less than 10 nm, the i-type amorphous semiconductor layer 102i exhibits attenuated passivation characteristics. If the i-type amorphous semiconductor layer 102i is too thick, the i-type amorphous semiconductor layer 102i exhibits excessive serial resistance. Taking passivation characteristics and serial resistance into consideration, the i-type amorphous semiconductor layer 102i preferably has a thickness of 10 nm or less.

Still referring to FIGS. 2A and 2B, the p-type amorphous semiconductor strips 102p and the n-type amorphous semiconductor strips 102n are formed on the i-type amorphous semiconductor layer 102i.

As shown in FIG. 1, the p-type amorphous semiconductor strips 102p and the n-type amorphous semiconductor strips 102n are generally rectangular in shape. As shown in FIGS. 1 and 2B, rows of p-type amorphous semiconductor strips 102p and rows of n-type amorphous semiconductor strips 102n are provided alternately in the Y-axis direction on the silicon substrate 101.

As shown in FIG. 1, on the silicon substrate 101, the p-type amorphous semiconductor strips 102p in each row are separated by intervening gaps in the X-axis direction, and so are the n-type amorphous semiconductor strips 102n in each row. In other words, in each row, a plurality of p-type amorphous semiconductor strips 102p is provided in the X-axis direction on the back face of the silicon substrate 101, and so is a plurality of n-type amorphous semiconductor strips 102n.

In this example, as shown in FIG. 1, the p-type amorphous semiconductor strips 102p and the n-type amorphous semiconductor strips 102n are provided such that near the edges of the silicon substrate 101 that are parallel to the Y-axis, the n-type amorphous semiconductor strips 102n terminate at more internal positions on the silicon substrate 101 than do the p-type amorphous semiconductor strips 102p. In addition, as shown in FIG. 1, the gaps between adjacent n-type amorphous semiconductor strips 102n are out of alignment with the gaps between adjacent p-type amorphous semiconductor strips 102p. In this example, the gap distance between adjacent n-type amorphous semiconductor strips 102n and the gap distance between adjacent p-type amorphous semiconductor strips 102p are approximately 2 mm or less, which is shorter than the diffusion length (e.g., approximately 2 mm) of carriers (i.e., electrons or holes) produced in the silicon substrate 101. Thus, this structure restricts recombination of carriers, thereby collecting carriers efficiently.

Each n-type amorphous semiconductor strip 102n is a hydrogen-containing, n-type amorphous semiconductor strip and may be n-type amorphous silicon, n-type amorphous silicon germanium, n-type amorphous germanium, n-type amorphous silicon carbide, n-type amorphous silicon nitride, n-type amorphous silicon oxide, n-type amorphous silicon oxynitride, or n-type amorphous silicon carbon oxide, containing, for example, phosphorus (P) as an impurity. The n-type amorphous semiconductor strip 102n has a thickness of 5 to 20 nm, for example.

Each p-type amorphous semiconductor strip 102p is a hydrogen-containing, p-type amorphous semiconductor strip and may be p-type amorphous silicon, p-type amorphous silicon germanium, p-type amorphous germanium, p-type amorphous silicon carbide, p-type amorphous silicon nitride, p-type amorphous silicon oxide, p-type amorphous silicon oxynitride, or p-type amorphous silicon carbon oxide, containing, for example, boron (B) as an impurity. The p-type amorphous semiconductor strip 102p has a thickness of 5 to 20 nm, for example.

As used herein, amorphous semiconductor also means a semiconductor containing a microcrystalline phase. The microcrystalline phase contains crystals with an average particle diameter of 1 to 50 nm.

The electrodes 103 are formed on the p-type amorphous semiconductor strips 102p and the n-type amorphous semiconductor strips 102n as shown in FIGS. 1, 2A, and 2B. Referring to FIG. 1, each electrode 103, generally rectangular in shape, is formed continuously along the length of the p-type amorphous semiconductor strip 102p or the n-type amorphous semiconductor strip 102n (along the X-axis). The electrode 103 is formed as an example of the protection layer and in contact with the i-type amorphous semiconductor layer 102i in the gaps between adjacent, but separated p-type amorphous semiconductor strips 102p and the gaps between adjacent, but separated n-type amorphous semiconductor strips 102n.

Throughout the following description, those electrodes 103 which are formed on the p-type amorphous semiconductor strips 102p and those electrodes 103 which are formed on the n-type amorphous semiconductor strips 102n will be, where necessary, distinguished by referring to them as p-type electrodes 103p and n-type electrodes 103n respectively.

The n-type electrodes 103n and the p-type electrodes 103p are separated by a distance L as shown in FIG. 2B. The n-type electrodes 103n and the p-type electrodes 103p are composed of, for example, a metal such as Ag (silver), Ni (nickel), Al (aluminum), Cu (copper), Sn (tin), Pt (platinum), Au (gold), or Ti (titanium), an oxide conductor film such as ITO, an alloy of some of these metals, or a stack of films of some of these metals. The n-type electrodes 103n and the p-type electrodes 103p are preferably composed of a high conductivity metal. Each n-type electrode 103n and p-type electrode 103p have a thickness of approximately 50 nm to 1 μm, for example.

Figure 3A:
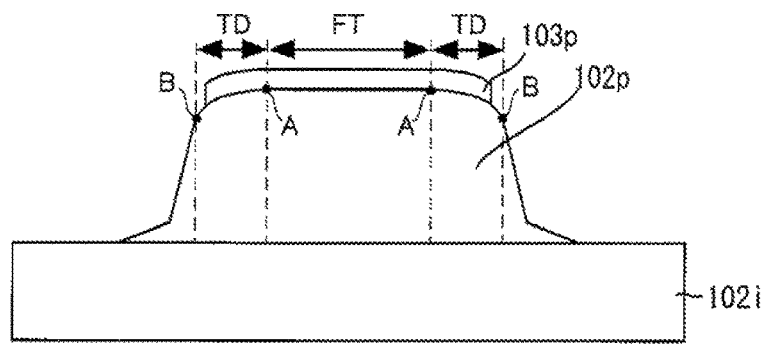
FIG. 3A is a schematic view representing an exemplary cross-sectional structure of a p-type amorphous semiconductor strip.

In the present embodiment, for example, the p-type amorphous semiconductor strips 102p may have the cross-sectional structure shown in FIG. 3A, which will be specifically described in the following. Referring to FIG. 3A, each p-type amorphous semiconductor strip 102p has a flat region FT and reduced thickness regions TD as traced along an in-plane direction (width) of the p-type amorphous semiconductor strip 102p. The p-type amorphous semiconductor strip 102p has a maximum thickness in the flat region FT, and the thickness in the flat region FT is substantially constant.

Each reduced thickness region TD is from a point A to a point B as traced along the in-plane direction of the p-type amorphous semiconductor strip 102p, where the point A is an end of the flat region FT and the point B is a point at which the rate of decrease of the thickness changes from a first rate of decrease to a second rate of decrease that is larger than the first rate of decrease.

The reduced thickness regions TD are located on both sides of the flat region FT as traced along the in-plane direction of the p-type amorphous semiconductor strip 102p.

The p-type amorphous semiconductor strip 102p has the reduced thickness regions TD because the p-type amorphous semiconductor strip 102p is formed by plasma CVD using a metal mask. The reduced thickness regions TD have a smaller thickness than the flat region FT and for this reason, have a higher dopant concentration than the flat region FT.

The electrode 103p is positioned in contact with the entire flat region FT and portions of the reduced thickness regions TD of the p-type amorphous semiconductor strip 102p.

FIG. 3A shows the p-type amorphous semiconductor strip 102p as an example. The embodiment of the present invention, however, only requires that either the p-type amorphous semiconductor strips 102p or the n-type amorphous semiconductor strips 102n or both have reduced thickness regions. If the n-type amorphous semiconductor strip 102n has the same structure as that shown in FIG. 3A, the n-type electrode 103n is positioned in contact with the entire flat region FT and portions of the reduced thickness regions TD of the n-type amorphous semiconductor strip 102n.

As a result, the resistance encountered by carriers (i.e., electrons) as they move through the p-type amorphous semiconductor strip 102p to the p-type electrode 103p is smaller than in structures where the p-type amorphous semiconductor strip 102p has a constant thickness as traced along an in-plane direction of the i-type amorphous semiconductor layer 102i. In addition, the resistance encountered by carriers (i.e., holes) as they move through the n-type amorphous semiconductor strip 102n to the n-type electrode 103n is smaller than in structures where the n-type amorphous semiconductor strip 102n has a constant thickness as traced along the in-plane direction of the i-type amorphous semiconductor layer 102i. The structure therefore improves the conversion efficiency of the photovoltaic device 1.

Alternatively, the p-type electrode 103p may be in contact with the entire reduced thickness regions TD of the p-type amorphous semiconductor strip 102p, and the n-type electrode 103n may be in contact with the entire reduced thickness regions TD of the n-type amorphous semiconductor strip 102n.

Figure 3B:
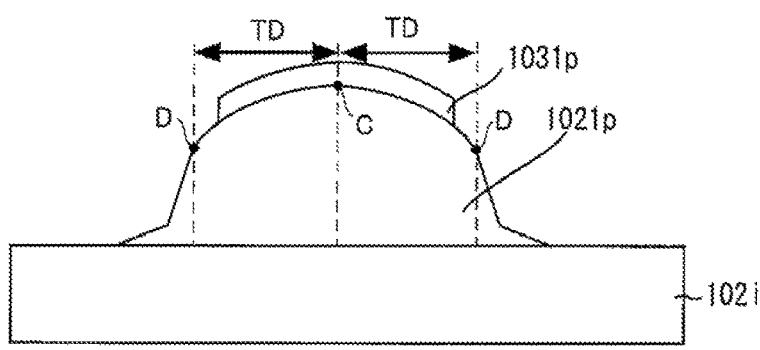
FIG. 3B is a schematic view representing another exemplary cross-sectional structure of the p-type amorphous semiconductor strip.

Instead of the cross-sectional structure shown in FIG. 3A, the p-type amorphous semiconductor strip 102p may have, for example, the cross-sectional structure shown in FIG. 3B. Referring to FIG. 3B, the photovoltaic device 1 may include p-type amorphous semiconductor strips 1021p in place of the p-type amorphous semiconductor strips 102p and p-type electrodes 1031p in place of the p-type electrodes 103p.

Let a point C be a point at which the thickness of the p-type amorphous semiconductor strip 1021p is maximum and a point D be a point at which the rate of decrease of the thickness changes from a first rate of decrease to a second rate of decrease that is larger than the first rate of decrease. Then, the reduced thickness region TD is from the point C to the point D as traced along the in-plane direction of the p-type amorphous semiconductor strip 1021p.

The p-type amorphous semiconductor strip 1021p has two reduced thickness regions TD as traced along the in-plane direction of the p-type amorphous semiconductor strip 1021p. The two reduced thickness regions TD are positioned in contact with each other in the in-plane direction of the p-type amorphous semiconductor strip 1021p.

Each p-type electrode 1031p is positioned in contact with a portion of one of the two reduced thickness regions TD and a portion of the r reduced thickness region TD.

The photovoltaic device 1 may include, instead of the n-type amorphous semiconductor strips 102n, n-type amorphous semiconductor strips having the same structure as the p-type amorphous semiconductor strips 1021p shown in FIG. 3B.

In this configuration, the resistance encountered by carriers (i.e., electrons) as they move through the p-type amorphous semiconductor strip 1021p to the p-type electrode 1031p is smaller than in structures where the p-type amorphous semiconductor strip has a constant thickness as traced along the in-plane direction of the i-type amorphous semiconductor layer 102i. In addition, the resistance encountered by carriers holes) as they move through an n-type amorphous semiconductor strip that has the same structure as the p-type amorphous semiconductor strip 1021p to an n-type electrode is smaller than in structures where the n-type amorphous semiconductor strip has a constant thickness as traced along the in-plane direction of the i-type amorphous semiconductor layer 102i. The configuration therefore improves the conversion efficiency of the photovoltaic device 1.

Alternatively; the p-type electrode 1031p may be positioned in contact with the two entire reduced thickness regions TD of the p-type amorphous semiconductor strip 1021p. The same arrangement is also applicable to the n-type amorphous semiconductor strip having the same structure as the p-type amorphous semiconductor strip 1021p.

Figure 3C:
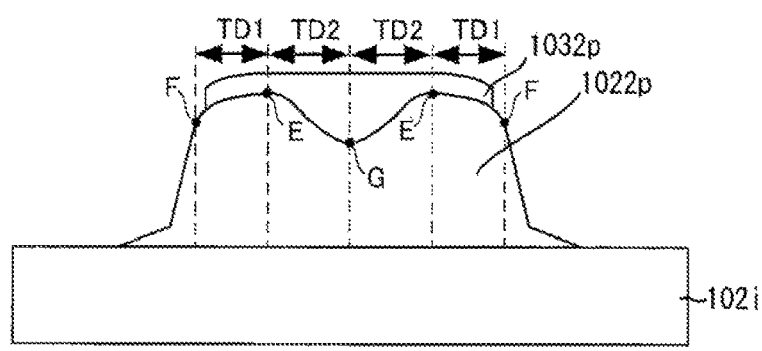
FIG. 3C is a schematic view representing a further exemplary cross-sectional structure of the p-type amorphous semiconductor strip.

Alternatively, the p-type amorphous semiconductor strip 102p may have, for example, the cross-sectional structure shown in FIG. 3C, instead of the cross-sectional structure shown in FIG. 3A, Referring to FIG. 3C, the photovoltaic device 1 may include p-type amorphous semiconductor strips 1022p instead of the p-type amorphous semiconductor strips 102p, and p-type electrodes 1032p instead of the p-type electrodes 103p.

Let a point E be a point at which the thickness of the p-type amorphous semiconductor strip 1022p is maximum, a point F be a point at which the rate of decrease of the thickness changes from a first rate of decrease to a second rate of decrease that is larger than the first rate of decrease, and a point G be a point at whish the rate of change of the thickness changes sign from negative to positive. Then, a reduced thickness region TD1 is from the point E to the point F as traced along an in-plane direction of the p-type amorphous semiconductor strip 1022p, and a reduced thickness region TD2 is from the point F to the point G as traced along the in-plane direction of the p-type amorphous semiconductor strip 1022p.

The p-type amorphous semiconductor strip 1022p has two reduced thickness regions TD1 and two reduced thickness regions TD2 as traced along the in-plane direction of the p-type amorphous semiconductor strip 1022p.

The two reduced thickness regions TD2 are provided such that the thickness distribution is symmetric with respect to a line running through the point G; as viewed along the in-plane direction of the p-type amorphous semiconductor strip 1022p. The two reduced thickness regions TD1 are on both sides of the two reduced thickness regions TD2 as traced along the in-plane direction of the p-type amorphous semiconductor strip 1022p.

Each p-type electrode 1032p is positioned in contact with the two entire reduced thickness regions TD2, a portion of one of the reduced thickness regions TD1, and a portion of the other reduced thickness region TD1.

The photovoltaic device 1 may include, instead of the n-type amorphous semiconductor strips 102n, n-type amorphous semiconductor strips having the same structure as the p-type amorphous semiconductor strips 1022p shown in FIG. 3C.

In this configuration, the resistance encountered by carriers (i.e., electrons) as they move through the n-type amorphous semiconductor strip to an n-type electrode is smaller than in structures where the n-type amorphous semiconductor strip has a constant thickness as traced along the in-plane direction of the i-type amorphous semiconductor layer 102i. In addition, the resistance encountered by carriers (i.e., holes) as they move through the p-type amorphous semiconductor strip 102 to the p-type electrode 1032p is smaller than in structures where the n-type amorphous semiconductor strip has a constant thickness as traced along the in-plane direction of the i-type amorphous semiconductor layer 102i. The configuration therefore improves the conversion efficiency of the photovoltaic device 1.

Alternatively, the p-type electrode 1032p may be positioned in contact with the two entire reduced thickness regions TD1 and the two entire reduced thickness regions TD2 of the p-type amorphous semiconductor strip 1022p. The same arrangement is also applicable to the n-type amorphous semiconductor strip having the same structure as the p-type amorphous semiconductor strip 1022p.

Thus, the photovoltaic device 1 includes p-type amorphous semiconductor strips and n-type amorphous semiconductor strips having reduced thickness regions TD (i.e., TD1 and TD2). In embodiments of the present invention, the reduced thickness region may be any one of the reduced thickness regions TD, TD1, and TD2.

Therefore, the reduced thickness region is from a first point to a second point as traced along an in-plane direction of a p-type amorphous semiconductor strip or an n-type amorphous semiconductor strip, where the first point is a point at which the p-type amorphous semiconductor strip or the n-type amorphous semiconductor strip has a maximum thickness, and the second point is either a point at which the rate of decrease of the thickness changes from a first rate of decrease to a second rate of decrease that is larger than the first rate of decrease or a point at which the rate of change of the thickness changes sign from negative to positive, as traced along an in-plane direction of the p-type amorphous semiconductor strip or the n-type amorphous semiconductor strip.

The above examples describe the silicon substrate 101 as having a flat surface. In reality, however, the face of the silicon substrate 101 that has no texture may in some cases have about 1-μm irregularities produced by etching for removing a damaged layer, for example. A method of measuring the thickness of an amorphous semiconductor layer on an irregular surface of the silicon substrate 101 will be described next.

On a silicon substrate 101 with irregularities on its surface is formed an i-type amorphous semiconductor layer 102i, after which n-type amorphous semiconductor strips 102n and p-type amorphous semiconductor strips 102p having reduced thickness regions are formed on the i-type amorphous semiconductor layer 102i. Then, a picture is taken of a cross-section of the silicon substrate 101 by scanning electron microscopy (SEM) or transmission electron microscopy (TEM). An interface between the i-type amorphous semiconductor layer 102i and the silicon substrate 101 can be readily observed in this picture. Portion (a) of FIG. 3D is a schematic view representing results of measurement of a distance (thickness h) from the interface S between the i-type amorphous semiconductor layer 102i and the surface of the silicon substrate 101 to the surface of the n-type amorphous semiconductor strip 102n or the p-type amorphous semiconductor strip 102p. Portion (b) of FIG. 3D is obtained by re-plotting the values of the thickness h shown in (a) of FIG. 3D. Using (b) of FIG. 3I), the thickness of an amorphous semiconductor layer (i.e., n-type amorphous semiconductor strip or p-type amorphous semiconductor strip) can be determined assuming that the surface of the silicon substrate 101 is generally flat.

Where both faces of the silicon substrate 101 have a texture, the thickness on the texture may be measured and its values be re-plotted in a manner similar to that described above, to determine reduced thickness regions.

The face of a silicon wafer that has no texture has variations in height of approximately 2 μm at most; still, it has very small variations in height compared with the face with a texture (having variations in height of several tens of micrometers at the largest), and is substantially flat.

Thus, taking into consideration the easiness with which connections can be made to external wiring such as a wiring sheet detailed later and the difficulty with which a short circuit can occur between the electrodes 103, normally, the i-type amorphous semiconductor layer 102i, the n-type amorphous semiconductor strips 102n, and the p-type amorphous semiconductor strips 102p, for example, would preferably be formed on a back face (i.e., face without a texture) which is relatively flat. However, to trap incident light efficiently in the silicon substrate 101, the hack face of the silicon substrate 101 preferably has a texture, and if the back face of the silicon substrate 101 has a texture, the surface area of the silicon substrate 101 increases (by about 1.7 times), thereby reducing contact resistance. Furthermore, if only one face of the silicon substrate 101 is to have a texture, the anisotropic etching needs to include a step for protecting the face that is not to have a texture. On the other hand, if both faces of the silicon substrate 101 are to have a texture, none of the faces of the silicon substrate 101 needs to be protected, thereby reducing the number of steps in the process.

Referring to FIGS. 1, 2A, and 2B, the insulating strips 105 as an example of a protection layer are formed on regions of the i-type amorphous semiconductor layer 102i where none of the electrodes 103, the p-type amorphous semiconductor strips 102p, and the n-type amorphous semiconductor strips 102n are formed, in such a manner as to overlap parts of the top of each electrode 103.

For example, if the i-type amorphous semiconductor layer 102i has a thickness of 8 nm, and the p-type amorphous semiconductor strips 102p and the n-type amorphous semiconductor strips 102n each have a thickness of 10 nm, the thickness of the regions where none of the electrodes 103, the p-type amorphous semiconductor strips 102p, and the n-type amorphous semiconductor strips 102n are formed is equal to that of the i-type amorphous semiconductor layer 10 (i.e., 8 nm). When regions of the back face of the semiconductor substrate 101 where the semiconductor layer and strips have a total thickness of less than or equal to 10 nm (hereinafter, will be referred to as "amorphous-silicon-layer thin regions") provide an exterior surface, water, oxygen, and organic matter, for example, will particularly easily infiltrate through the amorphous-silicon-layer thin regions, which leads to degradation of the photovoltaic device 1. Accordingly, in the present embodiment, these amorphous-silicon-layer thin regions are protected by the electrodes 103 or the insulating strips 105. Therefore, the insulating strips 105 cover the i-type amorphous semiconductor layer 102i, thereby preventing it from being exposed, in the gaps between the spaced-apart p-type amorphous semiconductor strips 102p, between the spaced-apart n-type amorphous semiconductor strips 102n, and between adjacent p-type and n-type amorphous semiconductor strips 102p and 102n. This structure prevents external water, oxygen, organic, and other foreign matter from contaminating the i-type amorphous semiconductor layer 102i, thereby restraining the photovoltaic device 1 from being degraded.

Next will be described how photovoltaic devices 1 are combined into a module. When photovoltaic devices 1 are combined into a module, each photovoltaic device 1 is electrically connected to an external wiring circuit (hereinafter, will be referred to as a wiring sheet). FIG. 4 is an enlarged schematic view of a portion of the wiring sheet of the present embodiment.

A wiring sheet 300 includes an insulating substrate 301 on which a wiring member 302$n$ for use with n-type members and a wiring member 302$p$ for use with p-type members are provided.

The insulating substrate 301 may be made of any insulating material, such as polyethylene terephthalate (PET), polyethylene naphthalate (PEN), polyphenylene sulfide (PPS), polyvinyl fluoride (PVF), or polyimide. The thickness of the insulating substrate 301 is by no means limited to any particular value, and is preferably not smaller than about 25 μm and smaller than about 150 μm. The insulating substrate 301 may have a single-layer structure or a multi-layer structure with two or more layers.

The wiring ember 302$n$ and the wiring member 302$p$ are comb-shaped and have teeth disposed alternately and spaced apart by a predetermined distance. The n-type and p-type electrodes 103$n$ and 103$p$ provided on the back face of the photovoltaic device 1 are joined to the wiring members 302$n$ and 302$p$ respectively. Connection wiring (not shown) is provided on the surface of the insulating substrate 301, where the wiring members 302$n$ and 302$p$ are electrically connected via the connection wiring, and adjacent photovoltaic devices 1 on the wiring sheet 300 are also electrically connected via the connection wiring. Thus, a current produced as light enters the light-receiving face of the photovoltaic device 1 can be taken out toward the outside via the wiring members 302$p$ and 302$n$.

The wiring members 302$n$ and 302$p$ are made of any conductive material and may be made of one of Cu, Al, Ag, and other metals or an alloy mainly composed of one of these metals.

The thickness of the wiring members 302$n$ and 302$p$ is by no means limited to any particular value and is preferably not smaller than 10 μm and not larger than 100 μm, for example. If the thickness of the wiring members 302$n$ and 302$p$ is smaller than 10 μm, the wiring resistance may be excessively high. If the thickness is larger than 100 μm, heat needs to be applied when the wiring members 302$n$ and 302$p$ are attached to the photovoltaic device 1. As such, for a thickness in excess of 100 μm, for example, differences between the thermal expansion coefficients of the wiring members 302$n$ and 302$p$ and that of the silicon substrate 101 of the photovoltaic device 1 cause the wiring sheet 300 to warp significantly. In view of this, the thickness of the wiring members 302$n$ and 302$p$ is more preferably not larger than 100 μm.

Furthermore, a conductive material such as nickel, gold, platinum, palladium, silver, tin, indium, or ITO may be provided on portions of the surfaces of the wiring members 302$n$ and 302$p$. This arrangement provides good electrical connection between the wiring members 302$n$ and 302$p$ and between the n-type and p-type electrodes 103$n$ and 103$p$ of the photovoltaic device 1, thereby improving the weather resistance of the wiring members 302$n$ and 302$p$. The wiring members 302$n$ and 302$p$ may have a single-layer structure or a multi-layer structure with two or more layers.

Next will be described an example method of manufacturing the photovoltaic device 1, in reference to FIGS. 5A to 5F.

First, a bulk of silicon is provided, and a wafer with a thickness of 100 to 300 μm is cut out therefrom. The wafer is then etched to remove the damaged layer on the surface of the wafer and is etched to adjust its thickness. A protective film is formed on one side of the etched wafer. The protective film may be, for example, silicon oxide or silicon nitride. The wafer with the protective film is wet-etched using an alkaline solution such as NaOH or KOH (e.g., an aqueous solution having KOH in 1 to 5 wt % and isopropyl alcohol in 1 to 10 wt %). At this time, a texture is formed by anisotropic etching on a surface 101$a$ that has no protective film. Removing the protective film after the etching leaves the silicon substrate 101 shown in FIG. 5A.

Next, as shown in FIG. 5B, the antireflective film 104 is provided on the light-receiving face 101$a$ of the silicon substrate 101. The following will describe an antireflective film 104 with a laminate structure with a silicon oxide film and a silicon nitride film stacked on top of each other.

In this implementation, first, the surface of the silicon substrate 101 is subjected to thermal oxidation to form an oxide film on the light-receiving face 101$a$. Thereafter, a silicon nitride film is formed on the oxide film of the light-receiving face 101$a$ to form the antireflective film 104. The silicon substrate 101 may be oxidized by either wet treatment or thermal oxidation. If wet treatment is used, for example, the silicon substrate 101 is immersed in hydrogen peroxide, nitric acid, or ozonated water, and then is heated in a dry atmosphere to a temperature ranging from 800 to 1,000° C. If thermal oxidation is used, for example, the silicon substrate 101 is heated in an oxygen or water vapor atmosphere to a temperature ranging from 900 to 1,000° C. The silicon nitride film may be formed by sputtering, electron beam (EB) evaporation, or tetraethoxysilane (TEOS) method. The i-type amorphous semiconductor layer 102$i$ and the n-type amorphous semiconductor strips 102$n$ may be successively formed between the silicon substrate 101 and the silicon nitride film.

Next, on the back face of the silicon substrate 101, i.e. the face opposite the light-receiving face 101$a$, is formed the i-type amorphous semiconductor layer 102$i$. The i-type amorphous semiconductor layer 102$i$ may be formed by, for example, plasma chemical vapor deposition (CVD). For the i-type amorphous semiconductor layer 102$i$, the reactant gas to be introduced into the reaction chamber of the plasma CVD equipment includes silane gas and hydrogen gas. In this case, for example, the temperature of the silicon substrate 101 may be in the range of 130 to 210° C., the hydrogen gas flow rate may be in the range of 0 to 100 sccm, the silane gas ($SiH_4$) flow rate may be about 40 sccm, the pressure in the reaction chamber may be in the range of 40 to 120 Pa, and the high frequency (13.56 MHz) power density may be in the range of 5 to 15 mW/cm$^2$. Thus, the i-type amorphous semiconductor layer 102$i$ is formed on the entire back face of the silicon substrate 101 as shown in FIG. 5C.

Subsequently, a metal mask 500 shown in FIG. 6 is placed on the i-type amorphous semiconductor layer 102$i$, and the p-type amorphous semiconductor strips 102$p$ are formed. The metal mask 500 has a plurality of openings 501 for forming the p-type amorphous semiconductor strips 102$p$. As shown in FIG. 6, the openings 501 are spaced apart from each other along the X-axis and separated by a predetermined distance from each other along the Y-axis. The gap distance GA between those openings 501 which are adjacent to each other when viewed along the Y-axis is not larger than about 2 mm.

The diffusion length of carriers (i.e., electrons and holes) produced in the silicon substrate 101 is about 2 mm. Thus, if the gap distance GA between the p-type amorphous semiconductor strips 102p is larger than the diffusion length (approximately 2 mm) of carriers (i.e., electrons and holes), the carriers disappear between the p-type amorphous semiconductor strips 102p, thereby decreasing photoelectric conversion efficiency. However, in the present embodiment, the gap distance GA is not larger than 2 mm such that carriers do not disappear, thereby improving photoelectric conversion efficiency.

The metal mask 500 may be made of a metal such as stainless steel, copper, nickel, an alloy containing nickel (for example, SUS 430, 42 alloy, or invar), or molybdenum. Instead of the metal mask 500, a mask made of glass, ceramics (for example, alumina, zirconia), or an organic film may be used. Alternatively, a mask made by etching a silicon substrate may be used. The thickness of the metal mask 500 is preferably about 50 μm to 300 μm, for example. In this case, the metal mask 500 is unlikely to be bent or caused to float by magnetic forces.

When the thermal expansion coefficient of the silicon substrate 101 and material costs are taken into consideration, the metal mask 500 is more preferably a 42 alloy. Regarding the thickness of the metal mask 500, when manufacturing costs are taken into consideration, using the metal mask 500 only once and discarding it would be problematic. Since using the metal mask 500 multiple times reduces running costs of production, it is preferable to recycle the metal mask 500 and use it multiple times. In this case, films formed on the metal mask 500 are removed using hydrofluoric acid or NaOH.

The p-type amorphous semiconductor strips 102p are formed by plasma CVD, for example. The reactant gas to be introduced into the reaction chamber of the plasma CVD equipment includes silane gas, hydrogen gas, and diborane gas diluted with hydrogen (with a diborane concentration of about 2%, for example). In this case, the hydrogen gas flow rate may be in the range of 0 to 100 sccm, the silane gas flow rate may be 40 sccm, the diborane gas flow rate may be 40 sccm, the temperature of the silicon substrate 101 may be in the range of 150 to 210° C., the pressure in the reaction chamber may be in the range of 40 to 120 Pa, and the high frequency power density may be in the range of 5 to 15 mW/cm$^2$. Thus, the p-type amorphous semiconductor strips 102p doped with boron (B) are formed on the i-type amorphous semiconductor layer 102i as shown in FIG. 5C.

Next, the n-type amorphous semiconductor strips 102n are formed on the i-type amorphous semiconductor layer 102i as shown in FIG. 5D. The n-type amorphous semiconductor strips 102n are formed, for example, by plasma CVD using a metal mask 600 shown in FIG. 7 placed on the hack face of the semiconductor substrate 101. The metal mask 600 has a plurality of openings 601 for forming the n-type amorphous semiconductor strips 102n. As shown in FIG. 7, the openings 601 are spaced apart from each other along the X-axis and separated by a predetermined distance from each other along the Y-axis. The gap distance GB between those openings 601 which are adjacent to each other when viewed along the Y-axis is in the range of approximately 500 to 1,500 μm. The metal mask 600 may be made of a material similar to that for the metal mask 500 and may have a thickness similar to that of the metal mask 500.

The n-type amorphous semiconductor strips 102n are formed by plasma CVD, for example. The reactant gas to be introduced into the reaction chamber of the plasma CVD equipment includes silane gas, hydrogen gas, and phosphine gas diluted with hydrogen (with a phosphine concentration of 1%, for example). In this case, the temperature of the silicon substrate 101 may be about 170° C., for example, the hydrogen gas flow rate may be in the range of 0 to 100 sccm, the silane gas flow rate may be about 40 sccm, the phosphine gas flow rate may be about 40 sccm, the pressure in the reaction chamber may be about 40 Pa, and the high frequency power density may be about 8.33 mW/cm$^2$. Thus, the n-type amorphous semiconductor strips 102n doped with phosphorus are formed as shown in FIG. 5D.

The n-type amorphous semiconductor strips 102n and the p-type amorphous semiconductor strips 102p may not overlap each other or may partially overlap each other. If the n-type and p-type amorphous semiconductor strips 102n and 102p do not overlap, the p-type and n-type amorphous semiconductor strips 102p and 102n are spaced apart, by a distance K, as shown in FIG. 5D. The regions between the p-type and n-type amorphous semiconductor strips 102p and 102n are passivated by the i-type amorphous semiconductor layer 102i such that very few of the carriers produced in the silicon substrate 101 disappear.

If the n-type and p-type amorphous semiconductor strips 102n and 102p partially overlap, overlap regions are formed in the p-type and n-type amorphous semiconductor strips 102p and 102n where they partially overlap. However, since the conductivity of the p-type and n-type amorphous semiconductor strips 102p and 102n is low, no current flows between the p-type and n-type amorphous semiconductor strips 102p and 102n, causing no short circuit in a p-n junction.

Next, after the n-type amorphous semiconductor strips 102n are formed, the n-type electrodes 103n and the p-type electrodes 103p are formed on the p-type amorphous semiconductor strips 102p and the n-type amorphous semiconductor strips 102n respectively as shown in FIG. 5E.

The n-type and p-type electrodes 103n and 103p are formed by deposition or sputtering with a metal mask 700 shown in FIG. 8 placed on the silicon substrate 101, for example. The metal mask 700 has a plurality of openings 701n for forming the n-type electrodes 103n and a plurality of openings 701p for forming the p-type electrodes 103p. The openings 701p and 701n have respective long sides LCp and LCn (LCp>LCn) of approximately 80 to 100 mm and a short side WC of approximately 500 μm to 1,500 μm. The gap distance GC1 between those electrodes 103 which are adjacent to each other when viewed along the short side WC, i.e. the gap width L between the p-type electrodes 103p and the n-type electrodes 103n, is approximately 100 to 300 μm.

The thickness of the n-type and p-type electrodes 103n and 103p is preferably in the range of 50 nm to 1 μm, and more preferably in the range of 50 nm to 50 nm. Increased thickness of the electrodes 103 causes larger stress on the silicon substrate 101, which may cause the silicon substrate 101 to warp.

Next, after the n-type electrodes 103n and the p-type electrodes 103p are formed, the insulating strips 105 are formed in such a manner as to overlap parts of the top of the electrodes 103 as shown in FIG. 5F. The insulating strips 105 may be formed by plasma CVD, for example, as described in the following. SiN is deposited on the back face of the silicon substrate 101, resist is applied onto the electrodes 103 except for predetermined regions of the electrodes 103, and then the SiN layer is etched using hydrofluoric acid. The resist may be applied by inkjet or screen printing. Thus, the insulating strips 105 are formed on the electrodes 103 except for predetermined regions of the electrodes 103.

Alternatively, the insulating strips 105 may be formed using metal masks 910 and 920 shown in FIGS. 9A and 99 respectively, for example.

The metal mask 910 has a plurality of openings 910a for forming the insulating strips 105, The openings 910a have a rectangular shape with long sides parallel to the X-axis and are arranged along the Y-axis. The lengths of the openings 910a along the X-axis are substantially equal. Regarding the length along the Y-axis, however, those openings 910a which are positioned on both ends (i.e., openings 9101) are longer than those openings 910a which are positioned inside (i.e., openings 9102).

The metal mask 920 has two openings 920a. The openings 920a have a rectangular shape with long sides parallel to the Y-axis. The two openings 920a are positioned close to the two sides of the metal mask 920 that are parallel to the Y-axis.

The metal mask 910 and the metal mask 920 have substantially the same size and external shape. If the metal mask 910 and the metal mask 920 are stacked on top of each other, the left and right end portions of the openings 910a of the metal mask 910 overlap the openings 920a of the metal mask 920.

The insulating strips 105 are formed using the metal masks 910 and 920 as described in the following. After the electrodes 103 are formed, first, the metal mask 910 is placed on the back face of the silicon substrate 101, and SiN is deposited by plasma CVD. Thus, SiN is deposited only inside the openings 910a. Thereafter, the metal mask 910 is replaced with the metal mask 920 on the back face of the silicon substrate 101, and SiN is then deposited by plasma CVD. Thus, SiN is deposited only inside the openings 920a, thereby forming the insulating strips 105.

By depositing SiN using the metal masks 910 and 920, the insulating strips 105 are formed on the back face of the silicon substrate 101 except for some regions of the electrodes 103 as shown in FIG. 10. In other words, the insulating strips 105 are formed in such a manner as to overlap parts of the top of the electrodes 103 as shown in FIG. 5F. Hence, the insulating strips 105 cover those regions of the i-type amorphous semiconductor layer 102i covered by none of the electrodes 103, the n-type amorphous semiconductor strips 102n, and the p-type amorphous semiconductor strips 102p. This example describes the insulating strips 105 as covering substantially the entire surface of the silicon substrate 101 except for some regions of the electrodes 103. Alternatively, the insulating strips 105 may be formed only on the amorphous-silicon-layer thin regions.

SiN is deposited twice in the regions where the openings 910a of the metal mask 910 overlap the openings 920a of the metal mask 920. SiN is therefore thicker in these regions than in the other regions, which means that the thickness of the SiN provided on the back face of the silicon substrate 101 has an in-plane distribution. The regions in which the SiN thickness is larger than in the other regions have improved passivation characteristics and are less likely to be affected by external water, oxygen, and other foreign matter, which is a desirable attribute.

If the insulating strips 105 are formed using a metal mask, each insulating strip 105 has the above-described reduced thickness regions for the following reasons. If the insulating strips 105 are formed by plasma CVD, the reactant gas stays for a relatively long period in the corners of the openings of the metal mask, and the SiN deposition rate is hence relatively low in the corners compared with the other regions. Meanwhile, if the insulating strips 105 are formed by sputtering, the deposition of sputtered particles is disturbed by the corners of the openings of the metal mask, and the SiN deposition rate is hence relatively low in the corners compared with the other regions.

The example above uses SiN as a material for the insulating strips 105. This is however not the only feasible material for the insulating strips 105. Alternatively, for example, the insulating strips 105 may be made of SiO, SiON, AlO, or TiO.

FIG. 11 shows a comparison of the normalized decay rate of a conventional photovoltaic device including no insulating strips 105 (comparative example) and the normalized decay rates of photovoltaic devices 1 (A to E) including insulating strips 105 made of different materials. The electrodes of the comparative example were made of silver paste. The electrodes 103 of the photovoltaic devices A to E were made of sputtered silver.

The normalized decay rates in FIG. 11 were obtained from the results of measurement of a performance characteristic made before and after an experiment. The experiment was conducted by leaving the photovoltaic device of the comparative example and the photovoltaic devices A to E at a temperature of 85° C. and a relative humidity of 85% for 1,000 hours.

Specifically, a decay rate was calculated for each photovoltaic device of the comparative example and A to E by the formula: Decay Rate={(Pre-experiment Photoelectric Conversion Efficiency–(Post-experiment Photoelectric Conversion Efficiency)}/(Pre-experiment Photoelectric Conversion Efficiency). The decay rates of the photovoltaic devices A to E were then normalized by taking the decay rate of the comparative example as 100%. In short, the normalized decay rates were obtained by dividing the decay rate of each photovoltaic device A to E by the decay rate of the comparative example.

As shown in FIG. 11, all the normalized decay rates of the photovoltaic devices A to E are lower than the normalized decay rate of the comparative example. That demonstrates that the provision of the insulating strips 105 restrains degradation of the photovoltaic device. Note particularly that the normalized decay rate is lowest in B in which the insulating strips 105 were made of SiN and second lowest in C in which the insulating strips 105 were made of SiON. These particular results demonstrate that the provision of the insulating strips 105 that are made of a material containing Si further restrains degradation of the photovoltaic device.

In the photovoltaic device 1 described above in accordance with the first embodiment, the n-type amorphous semiconductor strips 102n are provided, spaced apart from each other, on the i-type amorphous semiconductor layer 102i formed across the entire back face of the silicon substrate 101, and so are the p-type amorphous semiconductor strips 102p. The electrodes 103 are then formed continuously on the n-type amorphous semiconductor strips 102n and the p-type amorphous semiconductor strips 102p. As a result, in the photovoltaic device 1, the electrodes 103 provide protection to the i-type amorphous semiconductor layer 102i in the gaps between the spaced-apart p-type amorphous semiconductor strips 102p and in the gaps between the spaced-apart n-type amorphous semiconductor strips 102n. Furthermore, in the photovoltaic device 1, the insulating strips 105 are provided on the regions of the i-type amorphous semiconductor layer 102i where none of the electrodes 103, the n-type amorphous semiconductor strips 102n, and the p-type amorphous semiconductor strips 102p are provided. In other words, in the photovoltaic device 1, those regions of the i-type amorphous semiconductor layer 102i between adjacent p-type and n-type amorphous semiconductor strips 102p and 102n are protected by the insulating strips 105, and the i-type amorphous semiconductor layer 102i is therefore not exposed. To put it differently, in the photovoltaic device 1, the electrodes 103 or the insulating strips 105 cover the amorphous-silicon-layer thin regions where the total thickness of the semiconductor layer and strips is 10 nm or less. As a result, where the thickness of the i-type amorphous semiconductor layer 102i is 10 nm or less, external water, organic, and other foreign matter do not contaminate the i-type amorphous semiconductor layer 102i, which restrains degradation of the photovoltaic device 1.

In addition, since the insulating strips 105 are formed in such a manner as to overlap parts of the top of the electrodes 103, the electrodes 103 adhere to the semiconductor layers (the i-type amorphous semiconductor layer 102i, the n-type amorphous semiconductor strips 102n, and the p-type amorphous semiconductor strips 102p) in an improved manner. The improved adhesion restrains the electrodes 103 from being detached from the silicon substrate 101 and reduces other similar defects that could be caused by the stress in the film formed on the silicon substrate 101 and the stress produced in the silicon substrate 101 in the modularization process.

Additionally, in the first embodiment described above, the ends of the n-type amorphous semiconductor strips 102n are not aligned with the ends of the p-type amorphous semiconductor strips 102p. Furthermore, the gaps between adjacent n-type amorphous semiconductor strips 102n are not aligned with the gaps between adjacent p-type amorphous semiconductor strips 102p. Therefore, the metal masks 500 and 600 are less likely to bend or float under stress when the n-type amorphous semiconductor strips 102n and the p-type amorphous semiconductor strips 102p are to be formed. As a result, the n-type amorphous semiconductor strips 102n and the p-type amorphous semiconductor strips 102p are formed at suitable positions and on a finer scale. The out-of-alignment positioning of the ends of the n-type amorphous semiconductor strips 102n and the ends of the p-type amorphous semiconductor strips 102p also improves carrier collection efficiently.

Variation Example 1 of First Embodiment

FIG. 12 is a schematic plan view of a photovoltaic device 1A in accordance with the present variation example, which differs from the photovoltaic device 1 of the first embodiment (see FIG. 1) in that in the present variation example, as shown in FIG. 12, the ends of the n-type amorphous semiconductor strips 102n are aligned with the ends of the p-type amorphous semiconductor strips 102p, and the gaps between adjacent n-type amorphous semiconductor strips 102n are aligned with the gaps between adjacent p-type amorphous semiconductor strips 102p.

The photovoltaic device 1A is more susceptible, than the photovoltaic device 1, to stress in the metal mask when the n-type amorphous semiconductor strips 102n and the p-type amorphous semiconductor strips 102p are to be formed. Still, the photovoltaic device 1A is less susceptible to stress in the metal mask than in structures where the n-type and p-type amorphous semiconductor strips 102n and 102p are formed continuously; allowing for more suitable positioning of the n-type amorphous semiconductor strips 102n and the p-type amorphous semiconductor strips 102p.

In the photovoltaic device 1A, the insulating strips 105 are also formed on the amorphous-silicon-layer thin regions, or those regions of the i-type amorphous semiconductor layer 102i where none of the electrodes 103, the n-type amorphous semiconductor strips 102n, and the p-type amorphous semiconductor strips 102p are provided. Therefore, external water, organic, and other foreign matter are less likely to contaminate the i-type amorphous semiconductor layer 102i, which restrains degradation of the photovoltaic device 1A.

Variation Example 2 of First Embodiment

FIG. 13 is a schematic plan view of a photovoltaic device in accordance with the present variation example. FIG. 14A is a schematic A-A cross-sectional view of the photovoltaic device 1B shown in FIG. 13. FIG. 14B is a schematic B-B cross-sectional view of the photovoltaic device 1B shown in FIG. 13.

As shown in FIGS. 13, 14A, and 14B, the photovoltaic device 1B differs from the photovoltaic device 1 of the first embodiment (see FIG. 1) in that the insulating strips 105 do not overlap some top parts of the electrodes 103.

The electrodes 103 have weaker adhesion to the semiconductor layer and strips (the i-type amorphous semiconductor layer 102i, the n-type amorphous semiconductor strips 102n, and the p-type amorphous semiconductor strips 102p) in the photovoltaic device 1B than in the photovoltaic device 1A. Still, the electrodes 103 in the photovoltaic device 1B cover those regions of the i-type amorphous semiconductor layer 102i between the spaced-apart n-type amorphous semiconductor strips 102n and between the spaced-apart p-type amorphous semiconductor strips 102p. In addition, the insulating strips 105 cover those regions of the i-type amorphous semiconductor layer 102i where neither the n-type amorphous semiconductor strips 102n nor the p-type amorphous semiconductor strips 102p are provided. Therefore, external water, organic, and other foreign matter are less likely to contaminate such regions of the i-type amorphous semiconductor layer 102i amorphous-silicon-layer thin regions), which restrains degradation of the photovoltaic device 1B.

Variation Example 3 of First Embodiment

Portion (a) of FIG. 15 is a schematic plan view of a metal mask in accordance with the present variation example used when the insulating strips 105 are formed. Portion (b) of FIG. 15 is a schematic I-I cross-sectional view of the metal mask show in (a) of FIG. 15.

As shown in (a) of FIG. 15, a metal mask 930 has a plurality of openings 930a. The openings 930a include: a peripheral portion 930c; and a plurality of bridges 930b separated in the Y-axis direction from each other by a predetermined interval. Each bridge 930b has its ends connected to the X-axis end portions of the peripheral portion 930c.

As shown in (b) of FIG. 15, the bottoms of end regions 9301 of each bridge 930b are half-etched so that the regions 9301 have a thickness L2 approximately half that of the rest of the bridge 930b (L2=L1/2).

If the insulating strips 105 are formed by plasma CVD, for example, the reactant gas used in plasma CVD, easily flowing around fine features, can reach the regions 9301 of the metal mask 930. As a result, the insulating strips 105 are formed, on the back face of the silicon substrate 101, not only in those regions which correspond to the openings 930a, but also in those regions which correspond to the regions 9301 where the n-type and p-type amorphous semiconductor strips 102n and 102p and the electrodes 103 form a step. Note also that if the insulating strips 105 are formed using the metal mask 930, the insulating strips 105 have the above-described reduced thickness regions as in the previous cases.

Therefore, if the metal mask 930 is used, the regions where the insulating strips 105 are to be formed do not need to be subjected to patterning after SiN is deposited. The insulating strips 105 can be formed as shown in FIGS. 1, 2A, and 2B by a single SiN deposition process, which reduces the manufacturing cost of the photovoltaic device 1.

Second Embodiment

FIG. 16 is a schematic plan view of a photovoltaic device in accordance with the present embodiment. FIG. 17A is a schematic C-C cross-sectional view of the photovoltaic device 1C shown in FIG. 16. FIG. 17B is a schematic D-D cross-sectional view of the photovoltaic device 1C shown in FIG. 16. In FIGS. 16, 17A, and 17B, the members that are the same as those in the first embodiment are indicated by the same reference signs and numerals as in the first embodiment. The following description will focus on features that differ from those of the first embodiment.

In the present embodiment, as shown in FIGS. 16 and 17A, the regions of the i-type amorphous semiconductor layer 102i between the spaced-apart p-type amorphous semiconductor strips 102p and between the spaced-apart n-type amorphous semiconductor strips 102n are amorphous-silicon-layer thin regions on which insulating strips 1051 are provided as an example of the protection layer. The p-type electrodes 103p or the n-type electrodes 103n are provided on the insulating strips 1051 as shown in FIGS. 17A and 17B. The regions covered by neither the n-type amorphous semiconductor strips 102n nor the p-type amorphous semiconductor strips 102p are amorphous-silicon-layer thin regions on Which the insulating strips 105 are provided. The insulating strips 1051 are made of the same material as the insulating strips 105 described in the first embodiment.

The photovoltaic device 1C in accordance with the present embodiment may be manufactured as in the following. For example, after the steps described above in reference to FIGS. 5A to 5D, the insulating strips 1051 are formed in contact with the i-type amorphous semiconductor layer 102i in the gaps between the spaced-apart p-type amorphous semiconductor strips 102p and in the gaps between the spaced-apart n-type amorphous semiconductor strips 102n. In such a case, the insulating strips 1051 may be formed, for example, by depositing SiN by plasma CVD using a metal mask 940 having openings 940a for forming the insulating strips 1051 as shown in FIG. 18. The openings 940a are substantially parallel along the Y-axis in the metal mask 940. Hence, the insulating strips 1051 are provided which are continuous along the Y-axis.

On the other hand, if no metal mask 940 is used to form the insulating strips 1051, the insulating strips 1051 may be formed, after the steps shown in FIG. 5D, by depositing SiN by plasma CND in such a manner as to cover the n-type amorphous semiconductor strips 102n and the p-type amorphous semiconductor strips 102p, applying resist to the regions in which the insulating strips 1051 are to be formed, and then etching the SiN using hydrofluoric acid.

As described here, the photovoltaic device 1C of the second embodiment differs from the photovoltaic device 1 of the first embodiment in that the p-type electrodes 103p and the n-type electrodes 103n are not in contact with the i-type amorphous semiconductor layer 102i. In the photovoltaic device 1C, those regions of the i-type amorphous semiconductor layer 102i between the spaced-apart p-type amorphous semiconductor strips 102p are protected by the insulating strips 1051, and those regions of the i-type amorphous semiconductor layer 102i covered by neither the n-type amorphous semiconductor strips 102n nor the p-type amorphous semiconductor strips 102p are protected by the insulating strips 105. Therefore, these regions of the i-type amorphous semiconductor layer 102i (i.e., amorphous-silicon-layer thin regions) are not exposed, and external water, organic, and other foreign matter are less likely to contaminate the i-type amorphous semiconductor layer 102i, which restrains degradation of the photovoltaic device 1C. In addition, in the photovoltaic device 1C of the second embodiment, the insulating strips 1051 covering the gaps between the spaced-apart p-type amorphous semiconductor strips 102p restrain current leakage to the n-type amorphous semiconductor strips 102n. As a result, shunt resistance is reduced in the photovoltaic device 1C. This improves the fill factor FF of the photovoltaic device 1C.

Additionally, in the photovoltaic device 1C of the second embodiment, the insulating strips 105 cover the gaps between the p-type amorphous semiconductor strips 102p and the n-type amorphous semiconductor strips 102n in such a manner as to overlap parts of the top of the electrodes 103. This arrangement improves adhesion between the electrodes 103 and the p-type and n-type amorphous semiconductor strips 102p and 102n. The improved adhesion restrains the electrodes 103 from being detached from the silicon substrate 101 due to the stress in the film formed on the silicon substrate 101 and the stress produced in the silicon substrate 101 in the modularization process of the photovoltaic device 1C.

Third Embodiment

FIG. 19 is a schematic plan view of a photovoltaic device in accordance with in the present embodiment. FIG. 20A is a schematic E-E cross-sectional view of the photovoltaic device 1D shown in FIG. 19. FIG. 20B is a schematic F-F cross-sectional view of the photovoltaic device 1D shown in FIG. 19. In FIGS. 19, 20A, and 20B, the members that are the same as those in the first embodiment are indicated by the same reference signs and numerals as in the first embodiment. The following description will focus on features that differ from those of the first embodiment.

As shown in FIGS. 19 and 20A, in the photovoltaic device 1D, the p-type electrodes 103p are provided on the spaced-apart p-type amorphous semiconductor strips 102p, so that the p-type electrodes 103p are spaced apart from each other in the X-axis direction. Additionally, in the photovoltaic device 1D, the n-type electrodes 103n are provided on the spaced-apart n-type amorphous semiconductor strips 102n, so that the n-type electrodes 103n are spaced apart from each other in the X-axis direction. The regions of the i-type amorphous semiconductor layer 102i between adjacent p-type amorphous semiconductor strips 102p are amorphous-silicon-layer thin regions and covered by the p-type electrodes 103p. Additionally, the regions of the i-type amorphous semiconductor layer 102i between adjacent n-type amorphous semiconductor strips 102n are amorphous-silicon-layer thin regions and covered by the n-type electrodes 103n.

The insulating strips 105 are provided on those regions of the i-type amorphous semiconductor layer 102i covered by none of the electrodes 103, the n-type amorphous semiconductor strips 102n, and the p-type amorphous semiconductor strips 102p (i.e., amorphous-silicon-layer thin regions), in such a manner as to overlap parts of the top of the electrodes 103, as shown in FIGS. 20A and 20B.

As described here, the photovoltaic device 1D of the present embodiment differs from the first embodiment in that the p-type electrodes 103p are spaced apart from each other in the X-axis direction and also that the n-type electrodes 103n are spaced apart from each other in the X-axis direction.

The photovoltaic device 1D in accordance with the present embodiment may be manufactured as in the following. For example, after the steps described above in reference to FIGS. 5A to 5D, the p-type electrodes 103p are formed on the p-type amorphous semiconductor strips 102p in such a manner as to be in contact with the i-type amorphous semiconductor layer 102i between those spaced-apart p-type amorphous semiconductor strips 102p which are adjacent to each other. In addition, the n-type electrodes 103n are formed on the n-type amorphous semiconductor strips 102n in such a manner as to be in contact with the i-type amorphous semiconductor layer 102i between those spaced-apart n-type amorphous semiconductor strips 102n which are adjacent to each other.

In such a case, the p-type electrodes 103p and the n-type electrodes 103n may be formed, for example, using a metal mask 710 shown in FIG. 21. The metal mask 710 has openings 710p for forming the p-type electrodes 103p and openings 710n for forming the n-type electrodes 103n. In the metal mask 710, the openings 710p are spaced apart from each other in the X-axis direction, and so are the openings 710n. The ends of those openings 710p and 710n which are adjacent when viewed in the Y-axis direction are not aligned. Therefore, the metal mask 710 is less likely to warp than the mortal mask 700, and the p-type electrodes 103p and the n-type electrodes 103n are formed at suitable positions.

In the photovoltaic device 1D of the third embodiment, the regions of the i-type amorphous semiconductor layer 102i between adjacent p-type amorphous semiconductor strips 102p and between adjacent n-type amorphous semiconductor strips 102n are amorphous-silicon-layer thin regions, and these regions are protected by the p-type electrodes 103p and the n-type electrodes 103n, as in the photovoltaic device 1 of the first embodiment. Therefore, these amorphous-silicon-layer thin regions in the photovoltaic device 1D are not exposed, and external water, organic, and other foreign matter are restrained from contaminating the i-type amorphous semiconductor layer 102i. In addition, in the photovoltaic device 1D, since the electrodes 103 are spaced apart from each other, stress is alleviated in the electrodes 103 compared with the photovoltaic device 1 of the first embodiment, which renders the silicon substrate 101 less likely to be placed under stress. This in turn reduces stress in the silicon substrate 101 in the modularization process of the photovoltaic device 1D, which suppresses the defect of the electrodes 103 being possibly detached from the silicon substrate 101.

Fourth Embodiment

FIG. 22 is a schematic plan view of a photovoltaic device in accordance with the present embodiment. FIG. 23A is a schematic G-G cross-sectional view of the photovoltaic device 1E shown in FIG. 22. FIG. 23B is a schematic H-H cross-sectional view of the photovoltaic device 1E shown in FIG. 22. In FIGS. 22, 23A, and 23B, the members that are the same as those in the first embodiment are indicated by the same reference signs and numerals as in the first embodiment. The following description will focus on features that differ from those of the first embodiment.

As shown in FIGS. 22 and 23A, in the photovoltaic device 1E, the p-type electrodes 103p are provided respectively on the spaced-apart p-type amorphous semiconductor strips 102p. In addition, in the photovoltaic device 1E, the n-type electrodes 103n are provided respectively on the spaced-apart n-type amorphous semiconductor strips 102n. As shown in 23A and 23B, in the photovoltaic device 1E, the regions of the i-type amorphous semiconductor layer 102i covered by neither the n-type amorphous semiconductor strips 102n nor the p-type amorphous semiconductor strips 102p are amorphous-silicon-layer thin regions on which the insulating strips 105 are provided in such a inner as to overlap parts of the top of the electrodes 103.

As described here, the photovoltaic device 1E in accordance with the present embodiment differs from the first embodiment in that the p-type electrodes 103p and the n-type electrodes 103n are spaced apart in the X-axis direction and cover neither the gaps between adjacent p-type amorphous semiconductor strips 102p nor the gaps between adjacent n-type amorphous semiconductor strips 102n.

The photovoltaic device 1F, may be manufactured as in the following. For example, after the steps described above in reference to FIGS. 5A to 5D, the p-type electrodes 103p are formed on the p-type amorphous semiconductor strips 102p, and the n-type electrodes 103n are formed on the n-type amorphous semiconductor strips 102n. In this case, for example, the p-type electrodes 103p and the n-type electrodes 103n may be formed using a metal mask 720 shown in FIG. 24. The metal mask 720 has openings 720p for forming the p-type electrodes 103p shown in FIG. 22 and openings 720n for forming the n-type electrodes 103n shown in FIG. 22. In the metal mask 720, the openings 720p and 720n are spaced apart in the X-axis direction, and the gaps between adjacent openings 720p and the gaps between adjacent openings 720n are not aligned. Therefore, the metal mask 720 is less likely to warp than the metal mask 700, and the p-type electrodes 103p and the n-type electrodes 103n are formed at suitable positions.

In the photovoltaic device 1E in accordance with the fourth embodiment, the regions of the i-type amorphous semiconductor layer 102i between adjacent p-type amorphous semiconductor strips 102p and between adjacent n-type amorphous semiconductor strips 102n are amorphous-silicon-layer thin regions that are protected by the insulating strips 105. Therefore, these amorphous-silicon-layer thin regions in the photovoltaic device 1E are not exposed, and external water, organic, and other foreign matter are restrained from contaminating the i-type amorphous semiconductor layer 102i.

Fifth Embodiment

FIG. 25 is a schematic plan view of a photovoltaic device in accordance with the present embodiment. FIG. 26A is a schematic I-I cross-sectional view of the photovoltaic device 1F shown in FIG. 25. FIG. 26B is a schematic J-J cross-sectional view of the photovoltaic device 1F shown in FIG. 25. In FIGS. 25, 26A, and 26B, the members that are the same as those in the first embodiment are indicated by the same reference signs and numerals as in the first embodiment. The Mowing description will focus on features that differ from those of the first embodiment.

As shown in FIGS. 25 and 26A, in the photovoltaic device 1F, the p-type electrodes 103p are provided respectively on the spaced-apart p-type amorphous semiconductor strips 102p. In addition, in the photovoltaic device 1F, the n-type electrodes 103n are provided respectively on the spaced-apart n-type amorphous semiconductor strips 102n. Insulating strips 1053 are provided between adjacent p-type and n-type amorphous semiconductor strips 102p and 102n as shown in FIG. 26B.

More specifically, in the photovoltaic device 1F, as shown in FIG. 26B, the insulating strips 1053 are formed in such a manner as to overlap parts of the top of the n-type electrodes 103n, and the p-type amorphous semiconductor strips 102p are formed in such a manner as to cover parts of the insulating strips 1053. As shown in FIGS. 26A and 26B, in the photovoltaic device 1F, the regions of the i-type amorphous semiconductor layer 102i covered by neither the n-type amorphous semiconductor strips 102n nor the p-type amorphous semiconductor strips 102p are amorphous-silicon-layer thin regions on which the insulating strips 105 are provided in such a manner as to overlap parts of the top of the electrodes 103.

As described here, in the present embodiment, the insulating strips 105 are formed in contact with the i-type amorphous semiconductor layer 102i between adjacent p-type amorphous semiconductor strips 102p and between adjacent n-type amorphous semiconductor strips 102n. In addition, the insulating strips 1053 are formed in contact with the i-type amorphous semiconductor layer 102i between adjacent p-type and n-type amorphous semiconductor strips 102p and 102n. In other words, in this example, the insulating strips 1053 and the insulating strips 105 are provided as an example of the protection layer and strips covering the amorphous-silicon-layer thin regions.

The photovoltaic device 1F may be manufactured as in the following. For example, after the steps described above in reference to FIGS. 5A to 5B, the n-type amorphous semiconductor strips 102n are formed on the i-type amorphous semiconductor layer 102i, and the n-type electrodes 103n are formed on the n-type amorphous semiconductor strips 102n (see FIG. 27A). The n-type amorphous semiconductor strips 102n in the present embodiment are formed by the same manufacturing method as in the first embodiment. Alternatively, the n-type electrodes 103n may be formed using a metal mask 730 shown in FIG. 28A. The metal mask 730 has openings 730n for forming the n-type electrodes 103n shown in FIG. 25. In the metal mask 730, the openings 730n are spaced apart from each other in the X-axis direction and arranged substantially parallel to each other with a predetermined distance (interval) in the Y-axis direction.

Next, the insulating strips 1053 are formed to cover the n-type amorphous semiconductor strips 102n and parts of the top of the n-type electrodes 103 (see FIG. 27B). In this case, for example, SiN is deposited by plasma CVD using a metal mask 950 shown in FIG. 28B. The metal mask 950 has openings 950a for forming the insulating strips 1053. The openings 950a are rectangular in shape and arranged substantially parallel and adjacent to each other when viewed in the Y-axis direction. Thus, the insulating strips 1053 are continuously formed which cover parts of the n-type amorphous semiconductor strips 102n and parts of the top of the n-type electrodes 103 and which are substantially parallel to the X-axis.

Thereafter, the p-type amorphous semiconductor strips 102p are formed to cover parts of the insulating strips 1053 and parts of the n-type amorphous semiconductor strips 102n. Subsequently, the p-type electrodes 103p are formed on the p-type amorphous semiconductor strips 102p (see FIG. 27C). The p-type amorphous semiconductor strips 102p in the present embodiment are formed using a metal mask 510 shown in FIG. 28C. The metal mask 510 has openings 510p with a larger width in the Y-axis direction than the openings 501 (see FIG. 5) of the metal mask used in the first embodiment (WA<WA1). The p-type electrodes 103p may be formed using a metal mask 740 shown in FIG. 28D. The metal mask 740 has openings 740p for forming the p-type electrodes 103p shown in FIG. 25. In the metal mask 740, the openings 740p are spaced apart from each other in the X-axis direction and arranged substantially parallel to each other with a predetermined distance (interval) in the Y-axis direction. Thus, the p-type electrodes 103p are formed respectively on the p-type amorphous semiconductor strips 102p which are spaced apart in the X-axis direction.

After the p-type electrodes 103p are formed, the insulating strips 105 are formed on the regions of the i-type amorphous semiconductor layer 102i covered by neither the n-type amorphous semiconductor strips 102n nor the p-type amorphous semiconductor strips 102p by the same method as in the first embodiment (see FIG. 27D).

Thus, those regions of the i-type amorphous semiconductor layer 102i between adjacent p-type and n-type amorphous semiconductor strips 102p and 102n are protected by the insulating strips 1053. In addition, those regions of the i-type amorphous semiconductor layer 102i between adjacent p-type amorphous semiconductor strips 102p and between adjacent n amorphous semiconductor strips are protected by the insulating strips 105. Therefore, in the photovoltaic device 1F, these regions of the i-type amorphous semiconductor layer 102i (i.e., amorphous-silicon-layer thin regions) are not exposed, and external water, organic, and other foreign matter are restrained from contaminating the i-type amorphous semiconductor layer 102i.

In the photovoltaic device 1 in accordance with the first embodiment described above, the i-type amorphous semiconductor layer 102i is formed, and then the p-type amorphous semiconductor strips 102p are formed, and then the n-type amorphous semiconductor strips 102n are formed. After that, the electrodes 103 are formed on the p-type amorphous semiconductor strips 102p and the n-type amorphous semiconductor strips 102n. The insulating strips 105 are then formed. In this case, if the metal mask is displaced when the n-type amorphous semiconductor strips 102n or the p-type amorphous semiconductor strips 102p are to be formed, the n-type amorphous semiconductor strips 102n may overlap the p-type amorphous semiconductor strips 102p. If the n-type amorphous semiconductor strips 102n overlap the p-type amorphous semiconductor strips 102p, leakage currents occur between the n-type amorphous semiconductor strips 102n and the p-type amorphous semiconductor strips 102p.

In the fifth embodiment, if the metal mask for either the n-type amorphous semiconductor strips 102n or the p-type amorphous semiconductor strips 102p that are formed later is displaced, the n-type amorphous semiconductor strips 102n and the p-type amorphous semiconductor strips 102p still do not come into direct contact because of the provision of the insulating strips 1053 between the n-type amorphous semiconductor strips 102n and the p-type amorphous semiconductor strips 102p. Therefore, leakage currents between the n-type amorphous semiconductor strips 102n and the p-type amorphous semiconductor strips 102p are suppressed.

Sixth Embodiment

The present embodiment describes a photovoltaic module including a photovoltaic device in accordance with at least one of the first embodiment, the variation examples of the first embodiment, and the second to fifth embodiments described above. FIG. 29 is a schematic diagram showing a configuration of a photovoltaic module in accordance with the present embodiment. The photovoltaic module 1000 includes a plurality of photovoltaic devices 1001, an enclosure 1002, and output terminals 1003 and 1004.

Each photovoltaic device 1001 may be, for example, any one of the photovoltaic devices 1 and 1A to 1F attached to a wiring sheet. Alternatively, an array of such photovoltaic devices connected in series may be provided on a wiring sheet, or, instead of being connected in series, such devices may be connected in parallel, or such devices may be connected in series and in parallel.

The enclosure 1002 is composed of a weatherproof enclosure and houses the photovoltaic devices 1001. The enclosure 1002 includes, for example, a transparent base member (e.g., glass) provided facing the light-receiving faces of the photovoltaic devices 1001, a back base member (e.g., glass or resin sheet) provided facing the back faces of the photovoltaic devices 1001, and a sealing member (e.g., EVA) sealing the gaps between the transparent base member and the resin base member.

The output terminal 1003 is connected to one of the photovoltaic devices 1001 connected in series that is located at one end of the series.

The output terminal 1004 is connected to one of the photovoltaic devices 1001 connected in series that is located at the other end of the series.

The photovoltaic module 1000 is by no means limited to this configuration and may have any configuration so long as at least one of the photovoltaic devices 1001 is constituted by one of the photovoltaic devices in accordance with the first to sixth embodiments.

Seventh Embodiment

FIG. 30A is a schematic diagram showing a configuration of a solar power generation system in accordance with the present embodiment. The solar power generation system 1100 includes a photovoltaic module array 1101, a junction box 1102, a power conditioner 1103, a distribution board 1104, and a power meter 1105. The solar power generation system 1100 may include additional functions such as "home energy management system (HEMS)" or "building energy management system (BEMS)." This makes it possible to monitor the amount of power produced by the solar power generation system 1100 and to monitor and control the power consumption of electric devices connected to the solar power generation system 1100, thereby reducing energy consumption.

The junction box 1102 is connected to the photovoltaic module array 1101. The power conditioner 1103 is connected to the junction box 1102. The distribution board 1104 is connected to the power conditioner 1103 and an electric device 1110. The power meter 1105 is connected to the distribution board 1104 and a commercial power system.

The photovoltaic module array 1101 converts sunlight to electricity to generate DC power and supplies the generated DC power to the junction box 1102.

The junction box 1102 receives the DC power generated by the photovoltaic module array 1101 and supplies the received DC power to the power conditioner 1103.

The power conditioner 1103 converts the DC power received from the junction box 1102 to AC power and supplies the resulting AC power to the distribution board 1104.

The distribution board 1104 supplies the AC power received from the power conditioner 1103 and/or commercial power received via the power meter 1105 to the electric device 1110. If the AC power received from the power conditioner 1103 is larger than the power consumption of the electric device 1110, the distribution board 1104 supplies the residual AC power to the commercial power system via the power meter 1105.

The power meter 1105 measures the amount of power that is directed from the commercial power system to the distribution board 1104 and measures the amount of power that is directed from the distribution board 1104 to the commercial power system.

FIG. 31 is a schematic diagram showing a configuration of the photovoltaic module array 1101 shown in FIG. 30A. Referring to FIG. 30B, the photovoltaic module array 1101 includes a plurality of photovoltaic modules 1120 and output terminals 1121 and 1122.

The photovoltaic modules 1120 form an array and are connected in series. Each photovoltaic module 1120 is constituted by the photovoltaic module 1000 shown in FIG. 29.

The output terminal 1121 is connected to one of the photovoltaic modules 1120 connected in series that is located at one end of the series.

The output terminal 1122 is connected to one of the photovoltaic modules 1120 connected in series that is located at the other end of the series.

The operation of the solar power generation system 1100 will be described. The photovoltaic module array 1101 converts sunlight to electricity to generate DC power and supplies the generated DC power to the power conditioner 1103 via the junction box 1102.

The power conditioner 1103 converts the DC power received from the photovoltaic module array 1101 to AC power and supplies the resulting AC power to the distribution board 1104.

If the AC power received from the power conditioner 1103 is equal to or larger than the power consumption of the electric device 1110, the distribution board 1104 supplies the AC power received from the power conditioner 1103 to the electric device 1110. Then, the distribution board 1104 supplies the residual AC power to the commercial power system via the power meter 1105.

If the AC power received from the power conditioner 1103 is smaller than the power consumption of the electric device 1110, the distribution board 1104 supplies the AC power received from the commercial power system and the AC power received from the power conditioner 1103 to the electric device 1110.

The solar power generation system in the present embodiment is by no means limited to the configuration shown in FIGS. 29 and 30A and may have any configuration so long as one of the photovoltaic devices in accordance with the first embodiment, the variation examples of the first embodiment, and the second to fifth embodiments is used. Furthermore, as shown in FIG. 30B, a storage battery 1106 may be connected to the power conditioner 1103. This makes it possible to reduce output variations caused by variations in the amount of solar radiation and to supply power accumulated in the storage battery 1106 during the time periods in which there is no sunshine. The storage battery 1106 may be incorporated in the power conditioner 1103.

Seventh Embodiment

FIG. 32A is a schematic diagram showing a configuration of a solar power generation system in accordance with the present embodiment. The solar power generation system 1200 includes subsystems 1201 to 120$n$ (n is an integer larger than 1), power conditioners 1211 to 121$n$, and a transformer 1221. The solar power generation system 1200 is of a larger scale than the solar power generation system 1100 shown in FIGS. 30A and 30B.

The power conditioners 1211 to 121$n$ are connected to the respective subsystems 1201 to 120$n$.

The transformer 1221 is connected to the power conditioners 1211 to 121$n$ and a commercial power system.

Each subsystem 1201 to 120$n$ is composed of module systems 1231 to 123$j$ (j is an integer larger than 1).

Each module system 1231 to 123$j$ includes photovoltaic module arrays 1301 to 130$i$ (i is an integer larger than 1), junction boxes 1311 to 131$i$, and a power collection box 1321.

Each photovoltaic module array 1301 to 130$i$ has the same configuration as the photovoltaic module array 1101 shown in FIG. 30A.

The junction boxes 1311 to 131$i$ are connected to the respective photovoltaic module arrays 1301 to 130$i$.

The power collection box 1321 is connected to the junction boxes 1311 to 131$i$. The j power collection boxes 1321 of the subsystem 1201 are connected to the power conditioner 1211. The j power collection boxes 1321 of the subsystem 1202 are connected to the power conditioner 1212. Other power collection boxes are connected to other power conditioners in a similar manner, and the j power collection boxes 1321 of the subsystem 120$n$ are connected to the power conditioner 121$n$.

The i photovoltaic module arrays 1301 to 130$i$ of the module system 1231 convert sunlight to electricity to generate DC power and supply the generated DC power to the power collection box 1321 via the respective junction boxes 1311 to 131$i$. The i photovoltaic module arrays 1301 to 130$i$ of the module system 1232 convert sunlight to electricity to generate DC power and supply the generated DC power to the power collection box 1321 via the respective junction boxes 1311 to 131$i$. Other arrays operate in a similar manner, and the i photovoltaic module arrays 1301 to 130$i$ of the module system 123$j$ convert sunlight to electricity to generate DC power and supply the generated DC power to the power collection box 1321 via the respective junction boxes 1311 to 131$i$.

Then, the j power collection boxes 1321 of the subsystem 1201 supply their DC power to the power conditioner 1211.

In a similar manner, the j power collection boxes 1321 of the subsystem 1202 supply their DC power to the power conditioner 1212.

Other power collection boxes operate in a similar manner, and the j power collection boxes 1321 of the subsystem 120$n$ supply their DC power to the power conditioner 121$n$.

The power conditioners 1211 to 121$n$ change the DC power received from the respective subsystems 1201 to 120$n$ to AC power and supply the resulting AC power to the transformer 1221.

The transformer 1221 receives the AC power from the power conditioners 1211 to 121$n$, converts the voltage level of the received AC power, and supplies the resulting power to the commercial power system.

The solar power generation system in the present embodiment is by no means limited to the configuration shown in FIG. 32A and may have any configuration so long as one of the photovoltaic devices in accordance with the first embodiment, the variation examples of the first embodiment, and the second to fifth embodiments is used.

Furthermore, as shown in FIG. 32B, a storage battery 1213 may be connected to each of the power conditioners 1211 to 121$n$, and each storage battery 1213 may be incorporated in the associated one of the power conditioners 1211 to 121$n$. In such implementations, each power conditioner 1211 to 121$n$ may convert some or all of the DC power received from its associated power collection boxes 1321 as appropriate and accumulate the resulting power in its associated storage battery 1213. Power accumulated in each storage battery 1213 is supplied to the associated one of the power conditioners 1211 to 121$n$ in accordance with the amount of power generated by the associated one of the subsystems 1201 to 120$n$, and converted appropriately and supplied to the transformer 1221.

Variation Examples

The photovoltaic devices in accordance with the first to seventh embodiments of the present invention have been described. The photovoltaic devices of the present invention are by no means limited to the above embodiments, and various modifications are possible within the scope of the invention. In addition, some or all of the embodiments may be combined as necessary.

(1) The first to seventh embodiments described above describe an n-type silicon substrate 101 for the photovoltaic device. Alternatively, a p-type silicon substrate 101 may be used.

(2) The first to seventh embodiments described above describe that the antireflective film 104 is provided on the light-receiving face of the silicon substrate 101. Alternatively, no antireflective film 104 may be provided. As a further alternative, instead of the antireflective film 104, an $n^+$ layer with a high concentration of an n-type dopant diffused therein may be provided. Alternatively; an $n^+$ layer with a high concentration of an n-type dopant diffused therein may be provided between the light-receiving face of the silicon substrate 101 and the antireflective film 104. As a further alternative, the i-type amorphous semiconductor layer 102$i$ and the n-type amorphous semiconductor strips 102$n$ may be successively formed between the silicon substrate 101 and the antireflective film 104.

(3) The first to fourth embodiments described above describe implementations where the i-type amorphous semiconductor layer 102$i$ is formed on the entire back face of the silicon substrate 101, and then the p-type amorphous semiconductor strips 102$p$ are formed on the i-type amorphous semiconductor layer 102$i$, and then the n-type amorphous semiconductor strips 102$n$ are formed; however, the formation of the p-type and n-type amorphous semiconductor strips 102$p$ and 102$n$ is by no means limited to this order. Alternatively, for example, the i-type amorphous semiconductor layer 102$i$ may be formed, and then the n-type amorphous semiconductor strips 102$n$ may be formed on the i-type amorphous semiconductor layer 102$i$, and then the p-type amorphous semiconductor strips 102$p$ may be formed on the i-type amorphous semiconductor layer 102$i$.

(4) The first to seventh embodiments described above describe that the light-receiving face of the silicon substrate 101 in the photovoltaic device has a texture. Either additionally or alternatively, the back face of the silicon substrate 101 may have a texture. FIG. 33 is a schematic cross-sectional view of a photovoltaic device in accordance with the present variation example. As shown in FIG. 33, the photovoltaic device 1G includes a texture on the back face of the silicon substrate 101 as well as on the light-receiving face thereof. In addition, the i-type amorphous semiconductor layer 102i, the n-type amorphous semiconductor strips 102n, and the p-type amorphous semiconductor strips 102p are formed along the irregularities of the texture on the back face of the silicon substrate 101.

In implementations where the back face of the silicon substrate 101 has a texture, when the n-type and p-type amorphous semiconductor strips 102n and 102p and the electrodes 103 (103n and 103p) are formed using a photomask, the thickness of, and the light exposure for, the resist is not uniform, making it difficult to provide a desired geometry. In the present variation example, a texture is formed on the back face of the silicon substrate 101 and, for example, a metal mask as in the first embodiment is used to form the n-type and p-type amorphous semiconductor strips 102n and 102p and the electrodes 103 with a desired geometry.

The invention claimed is:

1. A photovoltaic device comprising:
   a semiconductor substrate;
   an intrinsic amorphous semiconductor layer formed in contact with one of surfaces of the semiconductor substrate;
   first amorphous semiconductor strips of a first conductivity type spaced apart from each other in a first direction and provided on the intrinsic amorphous semiconductor layer;
   second amorphous semiconductor strips of a second conductivity type spaced apart from each other in the first direction and provided on the intrinsic amorphous semiconductor layer, each second amorphous semiconductor strip being adjacent to at least one of the first amorphous semiconductor strips in a second direction perpendicular to the first direction, the second conductivity type being opposite the first conductivity type;
   first electrodes provided on each of the first amorphous semiconductor strips;
   second electrodes provided on each of the second amorphous semiconductor strips; and
   a protection layer that covers a part of each of the first electrodes and the intrinsic amorphous semiconductor layer between the first amorphous semiconductor strips adjacent to each other in the first direction and covers a part of each of the second electrodes and the intrinsic amorphous semiconductor layer between the second amorphous semiconductor strips adjacent to each other in the first direction.

2. The photovoltaic device according to claim 1, wherein the protection layer includes an insulating film.

3. The photovoltaic device according to claim 2, wherein the insulating film is formed further in contact with the intrinsic amorphous semiconductor layer between those first and second amorphous semiconductor strips which are adjacent to each other in the second direction.

4. The photovoltaic device according to claim 3, wherein the insulating film is formed overlapping parts of the first electrodes and the second electrodes near edges of the respective first and second electrodes.

\* \* \* \* \*